United States Patent
Kim et al.

(10) Patent No.: US 10,033,409 B2
(45) Date of Patent: Jul. 24, 2018

(54) TRANSMITTING APPARATUS AND INTERLEAVING METHOD THEREOF

(71) Applicant: SAMSUNG ELECTRONICS CO., LTD., Gyeonggi-do (KR)

(72) Inventors: Kyung-joong Kim, Seoul (KR); Se-ho Myung, Yongin-si (KR); Hong-sil Jeong, Suwon-si (KR); Daniel Ansorregui Lobete, Staines (GB); Belkacem Mouhouche, Staines (GB)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/435,042

(22) Filed: Feb. 16, 2017

(65) Prior Publication Data

US 2017/0163290 A1 Jun. 8, 2017

Related U.S. Application Data

(63) Continuation of application No. 15/130,204, filed on Apr. 15, 2016, now Pat. No. 9,692,454, which is a (Continued)

(30) Foreign Application Priority Data

Jan. 5, 2015 (KR) .................. 10-2015-0000671

(51) Int. Cl.
*H03M 13/00* (2006.01)
*H03M 13/27* (2006.01)
(Continued)

(52) U.S. Cl.
CPC ... *H03M 13/2792* (2013.01); *H03M 13/1102* (2013.01); *H03M 13/1165* (2013.01);
(Continued)

(58) Field of Classification Search
CPC ......... H03M 13/2792; H03M 13/1102; H03M 13/6552; H03M 13/6555; H03M 13/6538; H04L 1/0057; H04L 1/0071; H04L 1/0041
See application file for complete search history.

(56) References Cited

U.S. PATENT DOCUMENTS

2009/0063929 A1 3/2009 Jeong et al.
2009/0158129 A1 6/2009 Myung et al.
(Continued)

FOREIGN PATENT DOCUMENTS

WO 2012/099398 A2 7/2012

OTHER PUBLICATIONS

International Search Report dated May 29, 2015, issued by the International Searching Authority in counterpart International Patent Application No. PCT/KR2015/001694.
(Continued)

*Primary Examiner* — Sam Rizk
(74) *Attorney, Agent, or Firm* — Sughrue Mion, PLLC

(57) ABSTRACT

A transmitting apparatus is provided. The transmitting apparatus includes: an encoder configured to generate a low density parity check (LDPC) codeword by LDPC encoding based on a parity check matrix; an interleaver configured to interleave the LDPC codeword; and a modulator configured to map the interleaved LDPC codeword onto a modulation symbol, wherein the modulator is further configured to map a bit included in a predetermined bit group from among a plurality of bit groups constituting the LDPC codeword onto a predetermined bit of the modulation symbol.

4 Claims, 23 Drawing Sheets

Related U.S. Application Data continuation of application No. 14/625,862, filed on Feb. 19, 2015, now Pat. No. 9,602,137.

(60) Provisional application No. 62/001,170, filed on May 21, 2014, provisional application No. 61/941,676, filed on Feb. 19, 2014.

(51) Int. Cl.
*H04L 1/00* (2006.01)
*H03M 13/11* (2006.01)
*H03M 13/25* (2006.01)
*H03M 13/35* (2006.01)

(52) U.S. Cl.
CPC ....... *H03M 13/255* (2013.01); *H03M 13/271* (2013.01); *H03M 13/356* (2013.01); *H03M 13/6538* (2013.01); *H03M 13/6552* (2013.01); *H03M 13/6555* (2013.01); *H04L 1/0041* (2013.01); *H04L 1/0057* (2013.01); *H04L 1/0058* (2013.01); *H04L 1/0071* (2013.01)

(56) References Cited

U.S. PATENT DOCUMENTS

| | | |
|---|---|---|
| 2011/0119568 A1 | 5/2011 | Jeong et al. |
| 2013/0216001 A1 | 8/2013 | Petrov |
| 2016/0197688 A1 | 7/2016 | Moon et al. |

OTHER PUBLICATIONS

Written Opinion dated May 29, 2015, issued by the International Searching Authority in counterpart International Patent Application No. PCT/KR2015/001694.

Communication dated May 5, 2017, from the Canadian Intellectual Property Office in counterpart application No. 2940275.

TRANSMITTING APPARATUS AND INTERLEAVING METHOD THEREOF

CROSS-REFERENCE TO THE RELATED APPLICATIONS

This is a continuation of U.S. patent application Ser. No. 15/130,204, filed on Apr. 15, 2016, which is a continuation of U.S. patent application Ser. No. 14/625,862, filed Feb. 19, 2015, which claims priority from U.S. Provisional Application No. 61/941,676 filed on Feb. 19, 2014, U.S. Provisional Application No. 62/001,170 filed on May 21, 2014, and Korean Patent Application No. 10-2015-0000671 filed on Jan. 5, 2015. The entire disclosures of the prior applications are considered part of the disclosure of this continuation application, and are hereby incorporated by reference.

BACKGROUND

1. Technical Field

Apparatuses and methods consistent with exemplary embodiments relate to a transmitting apparatus and an interleaving method thereof, and more particularly, to a transmitting apparatus which processes data and transmits the data, and an interleaving method thereof.

2. Description of the Related Art

In the 21st century information-oriented society, broadcasting communication services are moving into the era of digitalization, multi-channel, wideband, and high quality. In particular, as high quality digital televisions and portable multimedia player and portable broadcasting equipments are increasingly used in recent years, there is an increasing demand for methods for supporting various receiving methods of digital broadcasting services.

In order to meet such demand, standard groups are establishing various standards and are providing a variety of services to satisfy users' needs. Therefore, there is a need for a method for providing improved services to users with high decoding and receiving performance.

SUMMARY

Exemplary embodiments may overcome the above disadvantages and other disadvantages not described above. However, it is understood that the exemplary embodiment are not required to overcome the disadvantages described above, and may not overcome any of the problems described above.

The exemplary embodiments provide a transmitting apparatus which can map a bit included in a predetermined bit group from among a plurality of bit groups of a low density parity check (LDPC) codeword onto a predetermined bit of a modulation symbol, and transmit the bit, and an interleaving method thereof.

According to an aspect of an exemplary embodiment, there is provided a transmitting apparatus which may include: an encoder configured to generate an LDPC codeword by LDPC encoding based on a parity check matrix; an interleaver configured to interleave the LDPC codeword; and a modulator configured to map the interleaved LDPC codeword onto a modulation symbol, wherein the modulator is further configured to map a bit included in a predetermined bit group from among a plurality of bit groups constituting the LDPC codeword onto a predetermined bit of the modulation symbol.

Each of the plurality of bit groups may be formed of M number of bits, and M may be a common divisor of $N_{ldpc}$ and $K_{ldpc}$ and may be determined to satisfy $Q_{ldpc}=(N_{ldpc}-K_{ldpc})/M$. $Q_{ldpc}$ is a cyclic shift parameter value regarding columns in a column group of an information word submatrix of the parity check matrix, $N_{ldpc}$ is a length of the LDPC codeword, and $K_{ldpc}$ is a length of information word bits of the LDPC codeword.

The interleaver may include: a parity interleaver configured to interleave parity bits of the LDPC codeword; a group interleaver configured to divide the parity-interleaved LDPC codeword by the plurality of bit groups and rearrange an order of the plurality of bit groups in bit group wise; and a block interleaver configured to interleave the plurality of bit groups the order of which is rearranged.

The group interleaver may be configured to rearrange the order of the plurality of bit groups in bit group wise based on Equation 21.

π(j) in Equation 21 may be determined based on at least one of a length of the LDPC codeword, a modulation method, and a code rate.

When the LDPC codeword has a length of 16200, the modulation method is QPSK, and the code rate is 13/15, π(j) in Equation 21 may be defined as in Table 36.

The interleaver may include: a group interleaver configured to divide the LDPC codeword into the plurality of bit groups and rearrange an order of the plurality of bit groups in bit group wise; and a block interleaver configured to interleave the plurality of bit groups the order of which is rearranged.

The group interleaver may be configured to rearrange the order of the plurality of bit groups in bit group wise based on Equation 21.

π(j) in Equation 21 may be determined based on at least one of a length of the LDPC codeword, a modulation method, and a code rate.

When the LDPC codeword has a length of 16200, the modulation method is QPSK, and the code rate is 5/15, π(j) in Equation 21 is defined as in Table 32.

The block interleaver may be configured to interleave by writing the plurality of bit groups in each of a plurality of columns in bit group wise in a column direction, and reading each row of the plurality of columns in which the plurality of bit groups are written in bit group wise in a row direction.

The block interleaver may be configured to serially write, in the plurality of columns, at least some bit groups which are writable in the plurality of columns in bit group wise from among the plurality of bit groups, and then divide and write the other bit groups in an area which remains after the at least some bit groups are written in the plurality of columns in bit group wise.

According to an aspect of another exemplary embodiment, there is provided an interleaving method of a transmitting apparatus. The method may include: generating an LDPC codeword by LDPC encoding based on a parity check matrix; interleaving the LDPC codeword; and mapping the interleaved LDPC codeword onto a modulation symbol, wherein the mapping includes mapping a bit included in a predetermined bit group from among a plurality of bit groups constituting the LDPC codeword onto a predetermined bit of the modulation symbol.

Each of the plurality of bit groups may be formed of M number of bits, and M may be a common divisor of $N_{ldpc}$ and $K_{ldpc}$ and may be determined to satisfy $Q_{ldpc}=(N_{ldpc}-K_{ldpc})/$ M. $Q_{ldpc}$ is a cyclic shift parameter value regarding columns in a column group of an information word submatrix of the parity check matrix, $N_{ldpc}$ is a length of the LDPC codeword, and $K_{ldpc}$ is a length of information word bits of the LDPC codeword.

The interleaving may include: interleaving parity bits of the LDPC codeword; dividing the parity-interleaved LDPC codeword by the plurality of bit groups and rearranging an order of the plurality of bit groups in bit group wise; and interleaving the plurality of bit groups the order of which is rearranged.

The rearranging in bit group wise may include rearranging the order of the plurality of bit groups in bit group wise based on Equation 21.

$\pi(j)$ in Equation 21 may be determined based on at least one of a length of the LDPC codeword, a modulation method, and a code rate.

When the LDPC codeword has a length of 16200, the modulation method is QPSK, and the code rate is 13/15, $\pi(j)$ in Equation 21 may be defined as in Table 36.

The interleaving may include: dividing the interleaved LDPC codeword into the plurality of bit groups and rearranging an order of the plurality of bit groups in bit group wise; and interleaving the plurality of bit groups the order of which is rearranged.

The rearranging in bit group wise may include rearranging the order of the plurality of bit groups in bit group wise based on Equation 21.

$\pi(j)$ in Equation 21 may be determined based on at least one of a length of the LDPC codeword, a modulation method, and a code rate.

When the LDPC codeword has a length of 16200, the modulation method is QPSK, and the code rate is 5/15, $\pi(j)$ in Equation 21 may be defined as in Table 32.

The interleaving the plurality of bit groups may include interleaving by writing the plurality of bit groups in each of a plurality of columns in bit group wise in a column direction, and reading each row of the plurality of columns in which the plurality of bit groups are written in bit group wise in a row direction.

The interleaving the plurality of bit groups may include serially writing, in the plurality of columns, at least some bit groups which are writable in the plurality of columns in bit group wise from among the plurality of bit groups, and then dividing and writing the other bit groups in an area which remains after the at least some bit groups are written in the plurality of columns in bit group wise.

According to various exemplary embodiments, improved decoding and receiving performance can be provided.

BRIEF DESCRIPTION OF THE DRAWINGS

The above and/or other aspects will be more apparent by describing in detail exemplary embodiments, with reference to the accompanying drawings, in which.

DETAILED DESCRIPTION OF THE EXEMPLARY EMBODIMENTS

Figure 1:
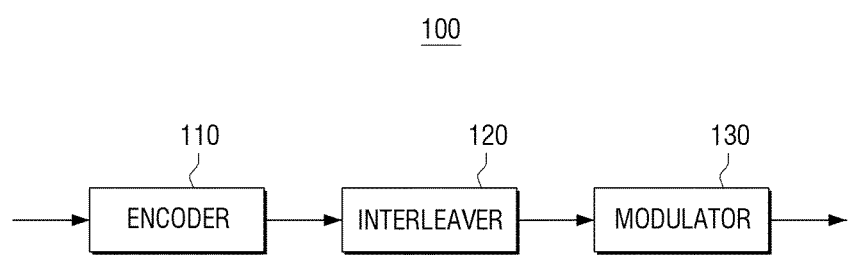
FIG. 1 is a block diagram to illustrate a configuration of a transmitting apparatus according to an exemplary embodiment.

Hereinafter, various exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

FIG. 1 is a block diagram to illustrate a configuration of a transmitting apparatus according to an exemplary embodiment. Referring to FIG. 1, the transmitting apparatus 100 includes an encoder 110, an interleaver 120, and a modulator 130 (or a constellation mapper).

The encoder 110 generates a low density parity check (LDPC) codeword by performing LDPC encoding based on a parity check matrix. To achieve this, the encoder 110 may include an LDPC encoder (not shown) to perform the LDPC encoding.

Specifically, the encoder 110 LDPC-encodes information word (or information) bits to generate the LDPC codeword which is formed of the information word bits and parity bits (that is, LDPC parity bits). Here, bits input to the encoder 110 may be used to the information word bits. Also, since an LDPC code is a systematic code, the information word bits may be included in the LDPC codeword as they are.

The LDPC codeword is formed of the information word bits and the parity bits. For example, the LDPC codeword is formed of $N_{ldpc}$ number of bits, and includes $K_{ldpc}$ number of information word bits and $N_{parity}=N_{ldpc}-K_{ldpc}$ number of parity bits.

In this case, the encoder 110 may generate the LDPC codeword by performing the LDPC encoding based on the parity check matrix. That is, since the LDPC encoding is a process for generating an LDPC codeword to satisfy $H \cdot C^T = 0$, the encoder 110 may use the parity check matrix when performing the LDPC encoding. Herein, H is a parity check matrix and C is an LDPC codeword.

For the LDPC encoding, the transmitting apparatus 100 may include a memory and may pre-store parity check matrices of various formats.

For example, the transmitting apparatus 100 may pre-store parity check matrices which are defined in Digital Video Broadcasting-Cable version 2 (DVB-C2), Digital Video Broadcasting-Satellite-Second Generation (DVB-S2), Digital Video Broadcasting-Second Generation Terrestrial (DVB-T2), etc., or may pre-store parity check matrices which are defined in the North America digital broadcasting standard system Advanced Television System Committee (ATSC) 3.0 standards, which are currently being established. However, this is merely an example and the transmitting apparatus 100 may pre-store parity check matrices of other formats in addition to these parity check matrices.

Hereinafter, a parity check matrix according to various exemplary embodiments will be explained in detail with reference to the drawings. In the parity check matrix, elements other than elements having 1 have 0.

Figure 2:
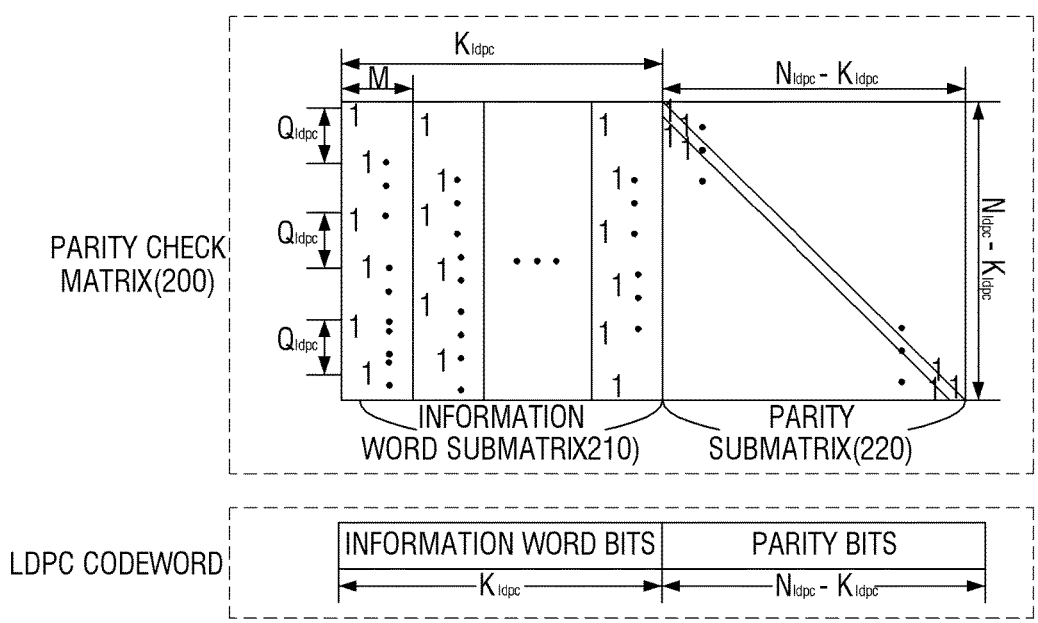
FIGS. 2 to 4 illustrate a configuration of a parity check matrix according to various exemplary embodiments.

For example, the parity check matrix according to an exemplary embodiment may have a configuration of FIG. 2.

Referring to FIG. 2, a parity check matrix 200 is formed of an information word submatrix (or an information submatrix) 210 corresponding to information word bits, and a parity submatrix 220 corresponding to parity bits.

The information word submatrix 210 includes $K_{ldpc}$ number of columns and the parity submatrix 220 includes $N_{parity}=N_{ldpc}-K_{ldpc}$ number of columns. The number of rows of the parity check matrix 200 is identical to the number of columns of the parity submatrix 220, $N_{parity}=N_{ldpc}-K_{ldpc}$.

In addition, in the parity check matrix 200, $N_{ldpc}$ is a length of an LDPC codeword, $K_{ldpc}$ is a length of information word bits, and $N_{parity}=N_{ldpc}-K_{ldpc}$ is a length of parity bits. The length of the LDPC codeword, the information word bits, and the parity bits mean the number of bits included in each of the LDPC codeword, the information word bits, and the parity bits.

Hereinafter, the configuration of the information word submatrix 210 and the parity submatrix 220 will be explained in detail.

The information word submatrix 210 includes $K_{ldpc}$ number of columns (that is, $0^{th}$ column to $(K_{ldpc}-1)^{th}$ column), and follows the following rules:

First, M number of columns from among $K_{ldpc}$ number of columns of the information word submatrix 210 belong to the same group, and $K_{ldpc}$ number of columns is divided into $K_{ldpc}/M$ number of column groups. In each column group, a column is cyclic-shifted from an immediately previous column by $Q_{ldpc}$. That is, $Q_{ldpc}$ may be a cyclic shift parameter value regarding columns in a column group of the information word submatrix 210 of the parity check matrix 200.

Herein, M is an interval at which a pattern of a column group, which includes a plurality of columns, is repeated in the information word submatrix 210 (e.g., M=360), and $Q_{ldpc}$ is a size by which one column is cyclic-shifted from an immediately previous column in a same column group in the information word submatrix 210. Also, M is a common divisor of $N_{ldpc}$ and $K_{ldpc}$ and is determined to satisfy $Q_{ldpc}=(N_{ldpc}-K_{ldpc})/M$. Here, M and $Q_{ldpc}$ are integers and $K_{ldpc}/M$ is also an integer. M and $Q_{ldpc}$ may have various values according to a length of the LDPC codeword and a code rate (CR) (or, coding rate).

For example, when M=360 and the length of the LDPC codeword, $N_{ldpc}$, is 64800, $Q_{ldpc}$ may be defined as in Table 1 presented below, and, when M=360 and the length $N_{ldpc}$ of the LDPC codeword is 16200, $Q_{ldpc}$ may be defined as in Table 2 presented below.

TABLE 1

| Code Rate | $N_{ldpc}$ | M | $Q_{ldpc}$ |
|---|---|---|---|
| 5/15 | 64800 | 360 | 120 |
| 6/15 | 64800 | 360 | 108 |
| 7/15 | 64800 | 360 | 96 |
| 8/15 | 64800 | 360 | 84 |
| 9/15 | 64800 | 360 | 72 |
| 10/15 | 64800 | 360 | 60 |
| 11/15 | 64800 | 360 | 48 |
| 12/15 | 64800 | 360 | 36 |
| 13/15 | 64800 | 360 | 24 |

TABLE 2

| Code Rate | $N_{ldpc}$ | M | $Q_{ldpc}$ |
|---|---|---|---|
| 5/15 | 16200 | 360 | 30 |
| 6/15 | 16200 | 360 | 27 |
| 7/15 | 16200 | 360 | 24 |
| 8/15 | 16200 | 360 | 21 |
| 9/15 | 16200 | 360 | 18 |
| 10/15 | 16200 | 360 | 15 |
| 11/15 | 16200 | 360 | 12 |
| 12/15 | 16200 | 360 | 9 |
| 13/15 | 16200 | 360 | 6 |

Second, when the degree of the $0^{th}$ column of the $i^{th}$ column group (i=0, 1, . . . , $K_{ldpc}/M-1$) is $D_i$ (herein, the degree is the number of value 1 existing in each column and all columns belonging to the same column group have the same degree), and a position (or an index) of each row where 1 exists in the $0^{th}$ column of the $i^{th}$ column group is $R_{i,0}^{(0)}$, $R_{i,0}^{(1)}$, . . . , $R_{i,0}^{(D_i-1)}$, an index $R_{i,j}^{(k)}$ of a row where $k^{th}$ 1 is located in the $j^{th}$ column in the $i^{th}$ column group is determined by following Equation 1:

$$R_{i,j}^{(k)}=R_{i,(j-1)}^{(k)}+Q_{ldpc} \bmod(N_{ldpc}-K_{ldpc}) \qquad (1),$$

where k=0, 1, 2, . . . $D_i-1$; i=0, 1, . . . , $K_{ldpc}/M-1$; and j=1, 2, . . . , M-1.

Equation 1 can be expressed as following Equation 2:

$$R_{i,j}^{(k)}=\{R_{i,0}^{(k)}+(j \bmod M) \times Q_{ldpc}\} \bmod(N_{ldpc}-K_{ldpc}) \qquad (2),$$

where k=0, 1, 2, . . . $D_i-1$; i=0, 1, . . . , $K_{ldpc}/M-1$; and j=1, 2, . . . , M-1. Since j=1, 2, . . . , M-1, (j mod M) of Equation 2 may be regarded as j.

In the above equations, $R_{i,j}^{(k)}$ is an index of a row where $k^{th}$ 1 is located in the $j^{th}$ column in the $i^{th}$ column group, $N_{ldpc}$ is a length of an LDPC codeword, $K_{ldpc}$ is a length of information word bits, $D_i$ is a degree of columns belonging to the $i^{th}$ column group, M is the number of columns belonging to a single column group, and $Q_{ldpc}$ is a size by which each column in the column group is cyclic-shifted.

As a result, referring to these equations, when only $R_{i,0}^{(k)}$ is known, the index $R_{i,j}^{(k)}$ of the row where the $k^{th}$ 1 is located in the $j^{th}$ column in the $i^{th}$ column group can be known. Therefore, when the index value of the row where the $k^{th}$ 1 is located in the $0^{th}$ column of each column group is stored, a position of column and row where 1 is located in the parity check matrix 200 having the configuration of FIG. 2 (that is, in the information word submatrix 210 of the parity check matrix 200) can be known.

According to the above-described rules, all of the columns belonging to the $i^{th}$ column group have the same degree $D_i$. Accordingly, the LDPC codeword which stores information on the parity check matrix according to the above-described rules may be briefly expressed as follows.

For example, when $N_{ldpc}$ is 30, $K_{ldpc}$ is 15, and $Q_{ldpc}$ is 3, position information of the row where 1 is located in the $0^{th}$ column of the three column groups may be expressed by a sequence of Equations 3 and may be referred to as "weight-1 position sequence".

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13,$$

$$R_{3,0}^{(1)}=0, R_{3,0}^{(2)}=14. \qquad (3)$$

where $R_{i,j}^{(k)}$ is an index of a row where $k^{th}$ 1 is located in the $j^{th}$ column in the $i^{th}$ column group.

The weight-1 position sequence like Equation 3 which expresses an index of a row where 1 is located in the $0^{th}$ column of each column group may be briefly expressed as in Table 3 presented below:

TABLE 3

1 2 8 10
0 9 13
0 14

Table 3 shows positions of elements having value 1 in the parity check matrix, and the $i^{th}$ weight-1 position sequence is expressed by indexes of rows where 1 is located in the $0^{th}$ column belonging to the $i^{th}$ column group.

The information word submatrix 210 of the parity check matrix according to an exemplary embodiment may be defined as in Tables 4 to 21 presented below, based on the above descriptions.

Specifically, Tables 4 to 21 show indexes of rows where 1 is located in the $0^{th}$ column of the $i^{th}$ column group of the information word submatrix 210. That is, the information word submatrix 210 is formed of a plurality of column groups each including M number of columns, and positions of 1 in the $0^{th}$ column of each of the plurality of column groups may be defined by Tables 4 to 21.

Herein, the indexes of the rows where 1 is located in the $0^{th}$ column of the $i^{th}$ column group mean "addresses of parity bit accumulators". The "addresses of parity bit accumulators" have the same meaning as defined in the DVB-C2/S2/T2 standards or the ATSC 3.0 standards which are currently being established, and thus, a detailed explanation thereof is omitted.

For example, when the length $N_{ldpc}$ of the LDPC codeword is 16200, the code rate is 5/15, and M is 360, the indexes of the rows where 1 is located in the $0^{th}$ column of the $i^{th}$ column group of the information word submatrix 210 are as shown in Table 4 presented below:

TABLE 4

| i | Index of row where 1 is located in the 0th column of the ith column group |
|---|---|
| 0 | 245 449 491 980 1064 1194 1277 1671 2026 3186 4399 4900 5283 5413 5558 6570 7492 7768 7837 7984 8306 8483 8685 9357 9642 10045 10179 10261 10338 10412 |
| 1 | 1318 1584 1682 1860 1954 2000 2062 3387 3441 3879 3931 4240 4302 4446 4603 5117 5588 5675 5793 5955 6097 6221 6449 6616 7218 7394 9535 9896 10009 10763 |
| 2 | 105 472 785 911 1168 1450 2550 2851 3277 3624 4128 4460 4572 4669 4783 5102 5133 5199 5905 6647 7028 7086 7703 8121 8217 9149 9304 9476 9736 9884 |
| 3 | 1217 5338 5737 8334 |
| 4 | 855 994 2979 9443 |
| 5 | 7506 7811 9212 9982 |
| 6 | 848 3313 3380 3990 |

TABLE 4-continued

| i | Index of row where 1 is located in the 0th column of the ith column group |
|---|---|
| 7 | 2095 4113 4620 9946 |
| 8 | 1488 2396 6130 7483 |
| 9 | 1002 2241 7067 10418 |
| 10 | 2008 3199 7215 7502 |
| 11 | 1161 7705 8194 8534 |
| 12 | 2316 4803 8649 9359 |
| 13 | 125 1880 3177 |
| 14 | 1141 8033 9072 |

In another example, when the length $N_{ldpc}$ of the LDPC codeword is 16200, the code rate is 7/15, and M is 360, the indexes of the rows where 1 is located in the $0^{th}$ column of the $i^{th}$ column group of the information word submatrix 210 are as shown in Table 5 or 6 presented below:

TABLE 5

| i | Index of row where 1 is located in the 0th column of the ith column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103 |

TABLE 6

| i | Index of row where 1 is located in the 0th column of the ith column group |
|---|---|
| 0 | 553 742 9011327 1544 2179 2519 3131 3280 3603 3789 37924253 5340 5934 5962 6004 6698 7793 8001 8058 8126 8276 8559 |
| 1 | 503 590 598 1185 1266 1336 1806 2473 3021 3356 3490 3680 3936 4501 4659 5891 6132 6340 6602 7447 8007 8045 80598294 |
| 2 | 795 831 9471330 1502 2041 2328 2513 2814 2829 4048 4802 6044 6109 6461 6777 6800 7099 7126 8095 8428 8519 8556 8610 |
| 3 | 601 787 8991757 2259 2518 2783 2816 2823 2949 3396 43304494 4684 4700 4837 4881 4975 5130 5464 65546912 7094 8297 |
| 4 | 4229 5628 7917 7992 |
| 5 | 1506 3374 4174 5547 |
| 6 | 4275 5650 8208 8533 |
| 7 | 1504 1747 3433 6345 |
| 8 | 3659 6955 7575 7852 |
| 9 | 607 3002 4913 6453 |
| 10 | 3533 6860 7895 8048 |
| 11 | 4094 6366 8314 |
| 12 | 2206 4513 5411 |
| 13 | 32 3882 5149 |
| 14 | 389 3121 4626 |
| 15 | 1308 4419 6520 |
| 16 | 2092 2373 6849 |

TABLE 6-continued

Index of row where 1 is located in the 0th column of the ith column group

| i | |
|---|---|
| 17 | 1815 3679 7152 |
| 18 | 3582 3979 6948 |
| 19 | 1049 2135 3754 |
| 20 | 2276 4442 6591 |

In another example, when the length $N_{ldpc}$ of the LDPC codeword is 16200, the code rate is 9/15, and M is 360, the indexes of the rows where 1 is located in the $0^{th}$ column of the $i^{th}$ column group of the information word submatrix 210 are as shown in Table 7 or 8 presented below:

TABLE 7

Index of row where 1 is located in the 0th column of the ith column group

| i | |
|---|---|
| 0 | 350 462 1291 1383 1821 2235 2493 3328 3353 3772 3872 3923 4259 4426 4542 4972 5347 6217 6246 6332 6386 |
| 1 | 177 869 1214 1253 1398 1482 1737 2014 2161 2331 3108 3297 3438 4388 4430 4456 4522 4783 5273 6037 6395 |
| 2 | 347 501 658 966 1622 1659 1934 2117 2527 3168 3231 3379 3427 3739 4218 4497 4894 5000 5167 5728 5975 |
| 3 | 319 398 599 1143 1796 3198 3521 3886 4139 4453 4556 4636 4688 4753 4986 5199 5224 5496 5698 5724 6123 |
| 4 | 162 257 304 524 945 1695 1855 2527 2780 2902 2958 3439 3484 4224 4769 4928 5156 5303 5971 6358 6477 |
| 5 | 807 1695 2941 4276 |
| 6 | 2652 2857 4660 6358 |
| 7 | 329 2100 2412 3632 |
| 8 | 1151 1231 3872 4869 |
| 9 | 1561 3565 5138 5303 |
| 10 | 407 794 1455 |
| 11 | 3438 5683 5749 |
| 12 | 1504 1985 3563 |
| 13 | 440 5021 6321 |
| 14 | 194 3645 5923 |
| 15 | 1217 1462 6422 |
| 16 | 1212 4715 5973 |
| 17 | 4098 5100 5642 |
| 18 | 5512 5857 6226 |
| 19 | 2583 5506 5933 |
| 20 | 784 1801 4890 |
| 21 | 4734 4779 4875 |
| 22 | 938 5081 5377 |
| 23 | 127 4125 4704 |
| 24 | 1244 2178 3352 |
| 25 | 3659 6350 6465 |
| 26 | 1686 3464 4336 |

TABLE 8

Index of row where 1 is located in the 0th column of the ith column group

| i | |
|---|---|
| 0 | 212 255 540 967 1033 1517 1538 3124 3408 3800 4373 4864 4905 5163 5177 6186 |
| 1 | 275 660 1351 2211 28763063 3433 4088 4273 4544 4618 4632 5548 6101 6111 6136 |
| 2 | 279 335 494865 1662 1681 3414 3775 4252 45955272 5471 5796 5907 5986 6008 |
| 3 | 345 352 3094 3188 42974338 4490 4865 5303 6477 |
| 4 | 222 681 1218 3169 3850 4878 4954 5666 6001 6237 |
| 5 | 172 512 1536 1559 21792227 3334 4049 6464 |
| 6 | 716 934 1694 2390 3276 3608 4332 4468 5945 |
| 7 | 1133 1593 1825 2571 3017 4251 5221 5639 5845 |
| 8 | 1076 1222 6465 |
| 9 | 159 5064 6078 |
| 10 | 374 4073 5357 |
| 11 | 2833 5526 5845 |
| 12 | 1594 3639 5419 |
| 13 | 1028 1392 4239 |
| 14 | 115 622 2175 |

TABLE 8-continued

Index of row where 1 is located in the 0th column of the ith column group

| i | |
|---|---|
| 15 | 300 1748 6245 |
| 16 | 2724 3276 5349 |
| 17 | 1433 6117 6448 |
| 18 | 485 663 4955 |
| 19 | 711 1132 4315 |
| 20 | 177 3266 4339 |
| 21 | 1171 4841 4982 |
| 22 | 33 1584 3692 |
| 23 | 2820 3485 4249 |
| 24 | 1716 2428 3125 |
| 25 | 250 2275 6338 |
| 26 | 108 1719 4961 |

In another example, when the length $N_{ldpc}$ of the LDPC codeword is 16200, the code rate is 11/15, and M is 360, the indexes of the rows where 1 is located in the $0^{th}$ column of the $i^{th}$ column group of the information word submatrix 210 are as shown in Table 9 or 10 presented below:

TABLE 9

Index of row where 1 is located in the 0th column of the ith column group

| i | |
|---|---|
| 0 | 108 297 703 742 1345 1443 1495 1628 1812 2341 2550 2669 2810 2877 3442 3690 3755 3904 4264 |
| 1 | 180 211 477 788 824 1090 1272 1578 1685 1948 2050 2195 2233 2546 2757 2946 3147 3299 3544 |
| 2 | 627 741 1135 1157 1226 1333 1378 1427 1454 1696 1757 1772 2099 2208 2592 3354 3580 4066 4242 |
| 3 | 9 795 959 989 1006 1032 1135 1209 1382 1484 1703 1855 1985 2043 2629 2845 3136 3450 3742 |
| 4 | 230 413 801 829 1108 1170 1291 1759 1793 1827 1976 2000 2423 2466 2917 3010 3600 3782 4143 |
| 5 | 56 142 236 381 1050 1141 1372 1627 1985 2247 2340 3023 3434 3519 3957 4013 4142 4164 4279 |
| 6 | 298 1211 2548 3643 |
| 7 | 73 1070 1614 1748 |
| 8 | 1439 2141 3614 |
| 9 | 284 1564 2629 |
| 10 | 607 660 855 |
| 11 | 1195 2037 2753 |
| 12 | 49 1198 2562 |
| 13 | 296 1145 3540 |
| 14 | 1516 2315 2382 |
| 15 | 154 722 4016 |
| 16 | 759 2375 3825 |
| 17 | 162 194 1749 |
| 18 | 2335 2422 2632 |
| 19 | 6 1172 2583 |
| 20 | 726 1325 1428 |
| 21 | 985 2708 2769 |
| 22 | 255 2801 3181 |
| 23 | 2979 3720 4090 |
| 24 | 208 1428 4094 |
| 25 | 199 3743 3757 |
| 26 | 1229 2059 4282 |
| 27 | 458 1100 1387 |
| 28 | 1199 2481 3284 |
| 29 | 1161 1467 4060 |
| 30 | 959 3014 4144 |
| 31 | 2666 3960 4125 |
| 32 | 2809 3834 4318 |

TABLE 10

Index of row where 1 is located in the 0th column of the ith column group

| i | |
|---|---|
| 0 | 49 719 784 794 968 2382 2685 2873 2974 2995 3540 4179 |
| 1 | 272 281 374 1279 2034 2067 2112 3429 3613 3815 3838 4216 |
| 2 | 206 714 820 1800 1925 2147 2168 2769 2806 3253 3415 4311 |

TABLE 10-continued

| i | Index of row where 1 is located in the 0th column of the ith column group |
|---|---|
| 3 | 62 159 166 605 1496 1711 2652 3016 3347 3517 3654 4113 |
| 4 | 363 733 1118 2062 2613 2736 3143 3427 3664 4100 4157 4314 |
| 5 | 57 142 436 983 1364 2105 2113 3074 3639 3835 4164 4242 |
| 6 | 870 921 950 1212 1861 2128 2707 2993 3730 3968 3983 4227 |
| 7 | 185 2684 3263 |
| 8 | 2035 2123 2913 |
| 9 | 863 2221 3521 |
| 10 | 1344 1773 4132 |
| 11 | 438 3178 3650 |
| 12 | 543 756 1639 |
| 13 | 1057 2337 2898 |
| 14 | 171 3298 3929 |
| 15 | 1626 2960 3503 |
| 16 | 484 3050 3323 |
| 17 | 2283 2336 4189 |
| 18 | 2732 4132 4318 |
| 19 | 225 2335 3497 |
| 20 | 600 2246 2658 |
| 21 | 1240 2790 3020 |
| 22 | 301 1097 3539 |
| 23 | 1222 1267 2594 |
| 24 | 1364 2004 3603 |
| 25 | 1142 1185 2147 |
| 26 | 564 1505 2086 |
| 27 | 697 991 2908 |
| 28 | 1467 2073 3462 |
| 29 | 2574 2818 3637 |
| 30 | 748 2577 2772 |
| 31 | 1151 1419 4129 |
| 32 | 164 1238 3401 |

In another example, when the length $N_{ldpc}$ of the LDPC codeword is 16200, the code rate is 13/15, and M is 360, the indexes of the rows where 1 is located in the $0^{th}$ column of the $i^{th}$ column group of the information word submatrix 210 are as shown in Table 11 or 12 presented below:

TABLE 11

| i | Index of row where 1 is located in the 0th column of the ith column group |
|---|---|
| 0 | 37 144 161 199 220 496 510 589 731 808 834 965 1249 1264 1311 1377 1460 1520 1598 1707 1958 2055 2099 2154 |
| 1 | 20 27 165 462 546 583 742 796 1095 1110 1129 1145 1169 1190 1254 1363 1383 1463 1718 1835 1870 1879 2108 2128 |
| 2 | 288 362 483 505 638 691 745 861 1006 1083 1124 1175 1247 1275 1337 1353 1378 1506 1588 1632 1720 1868 1980 2135 |
| 3 | 405 464 478 511 566 574 641 766 785 802 836 996 1128 1239 1247 1449 1491 1537 1616 1543 1668 1950 1975 2149 |
| 4 | 86 192 245 357 363 374 700 713 852 903 992 1174 1245 1277 1342 1369 1381 1417 1453 1712 1900 1962 2053 2118 |
| 5 | 101 327 378 550 |
| 6 | 186 723 1318 1550 |
| 7 | 118 277 504 1835 |
| 8 | 199 407 1776 1965 |
| 9 | 387 1253 1328 1975 |
| 10 | 62 144 1163 2017 |
| 11 | 100 475 572 2136 |
| 12 | 431 865 1568 2055 |
| 13 | 283 640 981 1172 |
| 14 | 220 1038 1903 2147 |
| 15 | 483 1318 1358 2118 |
| 16 | 92 561 1709 1810 |
| 17 | 112 403 1485 2042 |
| 18 | 431 1110 1130 1365 |
| 19 | 587 1005 1205 1588 |
| 20 | 704 1113 1943 |
| 21 | 375 1487 2100 |
| 22 | 1507 1950 2110 |
| 23 | 962 1613 2038 |
| 24 | 554 1295 1501 |
| 25 | 488 784 1446 |
| 26 | 871 1935 1964 |

TABLE 11-continued

| i | Index of row where 1 is located in the 0th column of the ith column group |
|---|---|
| 27 | 54 1475 1504 |
| 28 | 1579 1617 2074 |
| 29 | 1856 1967 2131 |
| 30 | 330 1582 2107 |
| 31 | 40 1056 1809 |
| 32 | 1310 1353 1410 |
| 33 | 232 554 1939 |
| 34 | 168 641 1099 |
| 35 | 333 437 1556 |
| 36 | 153 622 745 |
| 37 | 719 931 1188 |
| 38 | 237 638 1607 |

TABLE 12

| i | Index of row where 1 is located in the 0th column of the ith column group |
|---|---|
| 0 | 71 334 645 779 786 1124 1131 1267 1379 1554 1766 1798 1939 |
| 1 | 6 183 364 506 512 922 972 981 1039 1121 1537 1840 2111 |
| 2 | 6 71 153 204 253 268 781 799 873 1118 1194 1661 2036 |
| 3 | 6 247 353 581 921 940 1108 1146 1208 1265 1511 1527 1671 |
| 4 | 6 37 466 548 747 1142 1203 1271 1512 1516 1837 1904 2125 |
| 5 | 6 171 863 953 1025 1244 1378 1396 1723 1783 1816 1914 2121 |
| 6 | 1268 1360 1647 1769 |
| 7 | 6 458 1231 1414 |
| 8 | 183 535 1244 1277 |
| 9 | 107 360 498 1456 |
| 10 | 6 2007 2059 2120 |
| 11 | 1480 1523 1670 1927 |
| 12 | 139 573 711 1790 |
| 13 | 6 1541 1889 2023 |
| 14 | 6 374 957 1174 |
| 15 | 287 423 872 1285 |
| 16 | 6 1809 1918 |
| 17 | 65 818 1396 |
| 18 | 590 756 2107 |
| 19 | 192 814 1843 |
| 20 | 775 1163 1256 |
| 21 | 42 735 1415 |
| 22 | 334 1008 2055 |
| 23 | 109 596 1785 |
| 24 | 406 534 1852 |
| 25 | 684 719 1543 |
| 26 | 401 465 1040 |
| 27 | 112 392 621 |
| 28 | 82 897 1950 |
| 29 | 887 1962 2125 |
| 30 | 793 1088 2159 |
| 31 | 723 919 1138 |
| 32 | 610 839 1302 |
| 33 | 218 1080 1816 |
| 34 | 627 1646 1749 |
| 35 | 496 1165 1741 |
| 36 | 916 1055 1662 |
| 37 | 182 722 945 |
| 38 | 5 595 1674 |

In another example, when the length $N_{ldpc}$ of the LDPC codeword is 64800, the code rate is 6/15, and M is 360, the indexes of the rows where 1 is located in the $0^{th}$ column of the $i^{th}$ column group of the information word submatrix 210 are as shown in Table 13 presented below:

TABLE 13

| i | Index of row where 1 is located in the 0th column of the ith column group |
|---|---|
| 0 | 1606 3402 4961 6751 7132 11516 12300 12482 12592 13342 13764 14123 21576 23946 24533 25376 25667 26836 31799 34173 35462 36153 36740 37085 37152 37468 37658 |

TABLE 13-continued

| i | Index of row where 1 is located in the 0th column of the ith column group |
|---|---|
| 1 | 4621 5007 6910 8732 9757 11508 13099 15513 16335 18052 19512 21319 23663 25628 27208 31333 32219 33003 33239 33447 36200 36473 36938 37201 37283 37495 38642 |
| 2 | 16 1094 2020 3080 4194 5098 5631 6877 7889 8237 9804 10067 11017 11366 13136 13354 15379 18934 20199 24522 26172 28666 30386 32714 36390 37015 37162 |
| 3 | 700 897 1708 6017 6490 7372 7825 9546 10398 16605 18561 18745 21625 22137 23693 24340 24966 25015 26995 28586 28895 29687 33938 34520 34858 37056 38297 |
| 4 | 159 2010 2573 3617 4452 4958 5556 5832 6481 8227 9924 10836 14954 15594 16623 18065 19249 22394 22677 23408 23731 24076 24776 27007 28222 30343 38371 |
| 5 | 3118 3545 4768 4992 5227 6732 8170 9397 10522 11508 15536 20218 21921 28599 29445 29758 29968 31014 32027 33685 34378 35867 36323 36728 36870 38335 38623 |
| 6 | 1264 4254 6936 9165 9486 9950 10861 11653 13697 13961 15164 15665 18444 19470 20313 21189 24371 26431 26999 28086 28251 29261 31981 34015 35850 36129 37186 |
| 7 | 111 1307 1628 2041 2524 5358 7988 8191 10322 11905 12919 14127 15515 15711 17061 19024 21195 22902 23727 24401 24608 25111 25228 27338 35398 37794 38196 |
| 8 | 961 3035 7174 7948 13355 13607 14971 18189 18339 18665 18875 19142 20615 21136 21309 21758 23366 24745 25849 25962 27583 30006 31118 32106 36469 36583 37920 |
| 9 | 2990 3549 4273 4808 5707 6021 6509 7456 8240 10044 12262 12660 13085 14750 15680 16049 21587 23997 25803 28343 28693 34393 34860 35490 36021 37737 38296 |
| 10 | 955 4323 5145 6885 8123 9730 11840 12216 19194 20313 23056 24248 24830 25268 26617 26801 28557 29753 30745 31450 31973 32839 33025 33296 35710 37366 37509 |
| 11 | 264 605 4181 4483 5156 7238 8863 10939 11251 12964 16254 17511 20017 22395 22818 23261 23422 24064 26329 27723 28186 30434 31956 33971 34372 36764 38123 |
| 12 | 520 2562 2794 3528 3860 4402 5676 6963 8655 9018 9783 11933 16336 17193 17320 19035 20606 23579 23769 24123 24966 27866 32457 34011 34499 36620 37526 |
| 13 | 10106 10637 10906 34242 |
| 14 | 1856 15100 19378 21848 |
| 15 | 943 11191 27806 29411 |
| 16 | 4575 6359 13629 19383 |
| 17 | 4476 4953 18782 24313 |
| 18 | 5441 6381 21840 35943 |
| 19 | 9638 9763 12546 30120 |
| 20 | 9587 10626 11047 25700 |
| 21 | 4088 15298 28768 35047 |
| 22 | 2332 6363 8782 28863 |
| 23 | 4625 4933 28298 30289 |
| 24 | 3541 4918 18257 31746 |
| 25 | 1221 25233 26757 34892 |
| 26 | 8150 16677 27934 30021 |
| 27 | 8500 25016 33043 38070 |
| 28 | 7374 10207 16189 35811 |
| 29 | 611 18480 20064 38261 |
| 30 | 25416 27352 36089 38469 |
| 31 | 1667 17614 25839 32776 |
| 32 | 4118 12481 21912 37945 |
| 33 | 5573 13222 23619 31271 |
| 34 | 18271 26251 27182 30587 |
| 35 | 14690 26430 26799 34355 |
| 36 | 13688 16040 20716 34558 |
| 37 | 2740 14957 23436 32540 |
| 38 | 3491 14365 14681 36858 |
| 39 | 4796 6238 25203 27854 |
| 40 | 1731 12816 17344 26025 |
| 41 | 19182 21662 23742 27872 |
| 42 | 6502 13641 17509 34713 |
| 43 | 12246 12372 16746 27452 |
| 44 | 1589 21528 30621 34003 |
| 45 | 12328 20515 30651 31432 |
| 46 | 3415 22656 23427 36395 |
| 47 | 632 5209 25958 31085 |
| 48 | 619 3690 19648 37778 |
| 49 | 9528 13581 26965 36447 |
| 50 | 2147 26249 26968 28776 |
| 51 | 15698 18209 30683 |
| 52 | 1132 19888 34111 |
| 53 | 4608 25513 38874 |
| 54 | 475 1729 34100 |
| 55 | 7348 32277 38587 |
| 56 | 182 16473 33082 |
| 57 | 3865 9678 21265 |
| 58 | 4447 20151 27618 |
| 59 | 6335 14371 38711 |
| 60 | 704 9695 28858 |
| 61 | 4856 9757 30546 |
| 62 | 1993 19361 30732 |
| 63 | 756 28000 29138 |
| 64 | 3821 24076 31813 |
| 65 | 4611 12326 32291 |
| 66 | 7628 21515 34995 |
| 67 | 1246 13294 30068 |
| 68 | 6466 33233 35865 |
| 69 | 14484 23274 38150 |
| 70 | 21269 36411 37450 |
| 71 | 23129 26195 37653 |

In another example, when the length $N_{ldpc}$ of the LDPC codeword is 64800, the code rate is 7/15, and M is 360, the indexes of the rows where 1 is located in the $0^{th}$ column of the $i^{th}$ column group of the information word submatrix 210 are as shown in Table 14 presented below:

TABLE 14

| i | Index of row where 1 is located in the 0th column of the ith column group |
|---|---|
| 0 | 7 15 26 69 1439 3712 5756 5792 5911 8456 10579 19462 19782 21709 23214 25142 26040 30206 30475 31211 31427 32105 32989 33082 33502 34116 34241 34288 34292 34318 34373 34390 34465 |
| 1 | 83 1159 2271 6500 6807 7823 10344 10700 13367 14162 14242 14352 15015 17301 18952 20811 24974 25795 27868 28081 33077 33204 33262 33350 33516 33677 33680 33930 34090 34250 34290 34377 34398 |
| 2 | 25 2281 2995 3321 6006 7482 8428 11489 11601 14011 17409 26210 29945 30675 31101 31355 31421 31543 31697 32056 32216 33282 33453 33487 33696 34044 34107 34213 34247 34261 34276 34467 34495 |
| 3 | 0 43 87 2530 4485 4595 9951 11212 12270 12344 15566 21335 24699 26580 28518 28564 28812 29821 30418 31467 31871 32513 32597 33187 33402 33706 33838 33932 33977 34084 34283 34440 34473 |
| 4 | 81 3344 5540 7711 13308 15400 15885 18265 18632 22209 23657 27736 29158 29701 29845 30409 30654 30855 31420 31604 32519 32901 33267 33444 33525 33712 33878 34031 34172 34432 34496 34502 34541 |
| 5 | 42 50 66 2501 4706 6715 6970 8637 9999 14555 22776 26479 27442 27984 28534 29587 31309 31783 31907 31927 31934 32313 32369 32830 33364 33434 33553 33654 33725 33889 33962 34467 34482 |
| 6 | 6534 7122 8723 13137 13183 15818 18307 19324 20017 26389 29326 31464 32678 33668 34217 |
| 7 | 50 113 2119 5038 5581 6397 6550 10987 22308 25141 25943 29299 30186 33240 33399 |
| 8 | 7262 8787 9246 10032 10505 13090 14587 14790 16374 19946 21129 25726 31033 33660 33675 |
| 9 | 5004 5087 5291 7949 9477 11845 12698 14585 15239 17486 18100 18259 21409 21789 24280 |
| 10 | 28 82 3939 5007 6682 10312 12485 14384 21570 25512 26612 26854 30371 31114 32689 |
| 11 | 437 3055 9100 9517 12369 19030 19950 21328 24196 24236 25928 28458 30013 32181 33560 |
| 12 | 18 3590 4832 7053 8919 21149 24256 26543 27266 30747 31839 32671 33089 33571 34296 |
| 13 | 2678 4569 4667 6551 7639 10057 24276 24563 25818 26592 27879 28028 29444 29873 34017 |
| 14 | 72 77 2874 9092 10041 13669 20676 20778 25566 28470 28888 30338 31772 32143 33939 |
| 15 | 296 2196 7309 11901 14025 15733 16768 23587 25489 30936 31533 33749 34331 34431 34507 |

TABLE 14-continued

Index of row where 1 is located in the 0th column of the ith
i column group 16 6 8144 12490 13275 14140 18706 20251 20644 21441 21938 23703 34190 34444 34463 34495
17 5108 14499 15734 19222 24695 25667 28359 28432 30411 30720 34161 34386 34465 34511 34522
18 61 89 3042 5524 12128 22505 22700 22919 24454 30526 33437 34114 34188 34490 34502
19 11 83 4668 4856 6361 11633 15342 16393 16958 26613 29136 30917 32559 34346 34504
20 3185 9728 25062
21 1643 5531 21573
22 2285 6088 24083
23 78 14678 19119
24 49 13705 33535
25 21192 32280 32781
26 10753 21469 22084
27 10082 11950 13889
28 7861 25107 29167
29 14051 34171 34430
30 706 894 8316
31 29693 30445 32281
32 10202 30964 34448
33 15815 32453 34463
34 4102 21608 24740
35 4472 29399 31435
36 1162 7118 23226
37 4791 33548 34096
38 1084 34099 34418
39 1765 20745 33714
40 1302 21300 33655
41 33 8736 16646
42 53 18671 19089
43 21 572 2028
44 3339 11506 16745
45 285 6111 12643
46 27 10336 11586
47 21046 32728 34538
48 22215 24195 34026
49 19975 26938 29374
50 16473 26777 34212
51 20 29260 32784
52 35 31645 32837
53 26132 34410 34495
54 12446 20649 26851
55 6796 10992 31061
56 0 46 8420
57 10 636 22885
58 7183 16342 18305
59 1 5604 28258
60 6071 18675 34489
61 16786 25023 33323
62 3573 5081 10925
63 5067 31761 34415
64 3735 33534 34522
65 85 32829 34518
66 6555 23368 34559
67 22083 29335 29390
68 6738 21110 34316
69 120 4192 11123
70 3313 4144 20824
71 27783 28550 31034
72 6597 8164 34427
73 18009 23474 32460
74 94 6342 12656
75 17 31962 34535
76 15091 24955 28545
77 15 3213 28298
78 26562 30236 34537
79 16832 20334 24628
80 4841 20669 26509
81 18055 23700 34534
82 23576 31496 34492
83 10699 13826 34440

In another example, when the length $N_{ldpc}$ of the LDPC codeword is 64800, the code rate is 8/15, and M is 360, the indexes of the rows where 1 is located in the $0^{th}$ column of the $i^{th}$ column group of the information word submatrix 210 are as shown in Table 15 presented below:

TABLE 15

Index of row where 1 is located in the 0th column of the ith
i column group 0 2768 3039 4059 5856 6245 7013 8157 9341 9802 10470 11521 12083 16610 18361 20321 24601 27420 28206 29788
1 2739 8244 8891 9157 12624 12973 15534 16622 16919 18402 18780 19854 20220 20543 22306 25540 27478 27678 28053
2 1727 2268 6246 7815 9010 9556 10134 10472 11389 14599 15719 16204 17342 17666 18850 22058 25579 25860 29207
3 28 1346 3721 5565 7019 9240 12355 13109 14800 16040 16839 17369 17631 19357 19473 19891 20381 23911 29683
4 869 2450 4386 5316 6160 7107 10362 11132 11271 13149 16397 16532 17113 19894 22043 22784 27383 28615 28804
5 508 4292 5831 8559 10044 10412 11283 14810 15888 17243 17538 19903 20528 22090 22652 27235 27384 28208 28485
6 389 2248 5840 6043 7000 9054 11075 11760 12217 12565 13587 15403 19422 19528 21493 25142 27777 28566 28702
7 1015 2002 5764 6777 9346 9629 11039 11153 12690 13068 13990 16841 17702 20021 24106 26300 29332 30081 30196
8 1480 3084 3467 4401 4798 5187 7851 11368 12323 14325 14546 16360 17158 18010 21333 25612 26556 26906 27005
9 6925 8876 12392 14529 15253 15437 19226 19950 20321 23021 23651 24393 24653 26668 27205 28269 28529 29041 29292
10 2547 3404 3538 4666 5126 5468 7695 8799 14732 15072 15881 17410 18971 19609 19717 22150 24941 27908 29018
11 888 1581 2311 5511 7218 9107 10454 12252 13662 15714 15894 17025 18671 24304 25316 25556 28489 28977 29212
12 1047 1494 1718 4645 5030 6811 7868 8146 10611 15767 17682 18391 22614 23021 23763 25478 26491 29088 29757
13 59 1781 1900 3814 4121 8044 8906 9175 11156 14841 15789 16033 16755 17292 18550 19310 22505 29567 29850
14 1952 3057 4399 9476 10171 10769 11335 11569 15002 19501 20621 22642 23452 24360 25109 25290 25828 28505 29122
15 2895 3070 3437 4764 4905 6670 9244 11845 13352 13573 13975 14600 15871 17996 19672 20079 20579 25327 27958
16 612 1528 2004 4244 4599 4926 5843 7684 10122 10443 12267 14368 18413 19058 22985 24257 26202 26596 27899
17 1361 2195 4146 6708 7158 7538 9138 9998 14862 15359 16076 18925 21401 21573 22503 24146 24247 27778 29312
18 5229 6235 7134 7655 9139 13527 15408 16058 16705 18320 19909 20901 22238 22437 23654 25131 27550 28247 29903
19 697 2035 4887 5275 6909 9166 11805 15338 16381 18403 20425 20688 21547 24590 25171 26726 28348 29224 29412
20 5379 17329 22659 23062
21 11814 14759 22329 22936
22 2423 2811 10296 12727
23 8460 15260 16769 17290
24 14191 14608 29536 30187
25 7103 10069 20111 22850
26 4285 15413 26448 29069
27 548 2137 9189 10928
28 4581 7077 23382 23949
29 3942 17248 19486 27922
30 8668 10230 16922 26678
31 6158 9980 13788 28198
32 12422 16076 24206 29887
33 8778 10649 18747 22111
34 21029 22677 27150 28980
35 7918 15423 27672 27803
36 5927 18086 23525
37 3397 15058 30224
38 24016 25880 26268
39 1096 4775 7912
40 3259 17301 20802
41 129 8396 15132
42 17825 28119 28676
43 2343 8382 28840
44 3907 18374 20939
45 1132 1290 8786
46 1481 4710 28846
47 2185 3705 26834
48 5496 15681 21854
49 12697 13407 22178
50 12788 21227 22894
51 629 2854 6232
52 2289 18227 27458

TABLE 15-continued

| i | Index of row where 1 is located in the 0th column of the ith column group |
|---|---|
| 53 | 7593 21935 23001 |
| 54 | 3836 7081 12282 |
| 55 | 7925 18440 23135 |
| 56 | 497 6342 9717 |
| 57 | 11199 22046 30067 |
| 58 | 12572 28045 28990 |
| 59 | 1240 2023 10933 |
| 60 | 19566 20629 25186 |
| 61 | 6442 13303 28813 |
| 62 | 4765 10572 16180 |
| 63 | 552 19301 24286 |
| 64 | 6782 18480 21383 |
| 65 | 11267 12288 15758 |
| 66 | 771 5652 15531 |
| 67 | 16131 20047 25649 |
| 68 | 13227 23035 24450 |
| 69 | 4839 13467 27488 |
| 70 | 2352 4677 22993 |
| 71 | 2504 28116 29524 |
| 72 | 12518 17374 24267 |
| 73 | 1222 11859 27922 |
| 74 | 9660 17286 18261 |
| 75 | 232 11296 29978 |
| 76 | 9750 11165 16295 |
| 77 | 4894 9505 23622 |
| 78 | 10861 11980 14110 |
| 79 | 2128 15883 22836 |
| 80 | 6274 17243 21989 |
| 81 | 10866 13202 22517 |
| 82 | 11159 16111 21608 |
| 83 | 3719 18787 22100 |
| 84 | 1756 2020 23901 |
| 85 | 20913 29473 30103 |
| 86 | 2729 15091 26976 |
| 87 | 4410 8217 12963 |
| 88 | 5395 24564 28235 |
| 89 | 3859 17909 23051 |
| 90 | 5733 26005 29797 |
| 91 | 1935 3492 29773 |
| 92 | 11903 21380 29914 |
| 93 | 6091 10469 29997 |
| 94 | 2895 8930 15594 |
| 95 | 1827 10028 20070 |

In another example, when the length $N_{ldpc}$ of the LDPC codeword is 64800, the code rate is 9/15, and M is 360, the indexes of the rows where 1 is located in the $0^{th}$ column of the $i^{th}$ column group of the information word submatrix 210 are as shown in Table 16 presented below:

TABLE 16

| i | Index of row where 1 is located in the 0th column of the ith column group |
|---|---|
| 0 | 113 1557 3316 5680 6241 10407 13404 13947 14040 14353 15522 15698 16079 17363 19374 19543 20530 22833 24339 |
| 1 | 271 1361 6236 7006 7307 7333 12768 15441 15568 17923 18341 20321 21502 22023 23938 25351 25590 25876 25910 |
| 2 | 73 605 872 4008 6279 7653 10346 10799 12482 12935 13604 15909 16526 19782 20506 22804 23629 24859 25600 |
| 3 | 1445 1690 4304 4851 8919 9176 9252 13783 16076 16675 17274 18806 18882 20819 21958 22451 23869 23999 24177 |
| 4 | 1290 2337 5661 6371 8996 10102 10941 11360 12242 14918 16808 20571 23374 24046 25045 25060 25662 25783 25913 |
| 5 | 28 42 1926 3421 3503 8558 9453 10168 15820 17473 19571 19685 22790 23336 23367 23890 24061 25657 25680 |
| 6 | 0 1709 4041 4932 5968 7123 8430 9564 10596 11026 14761 19484 20762 20858 23803 24016 24795 25853 25863 |
| 7 | 29 1625 6500 6609 16831 18517 18568 18738 19387 20159 20544 21603 21941 24137 24269 24416 24803 25154 25395 |
| 8 | 55 66 871 3700 11426 13221 15001 16367 17601 18380 22796 23488 23938 25476 25635 25678 25807 25857 25872 |
| 9 | 1 19 5958 8548 8860 11489 16845 18450 18469 19496 20190 23173 25262 25566 25668 25679 25858 25888 25915 |
| 10 | 7520 7690 8855 9183 14654 16695 17121 17854 18083 18428 19633 20470 20736 21720 22335 23273 25083 258293 25403 |
| 11 | 48 58 410 1299 3786 10668 18523 18963 20864 22106 22308 23033 23107 23128 23990 24286 24409 24595 25802 |
| 12 | 12 51 3894 6539 8276 10885 11644 12777 13427 14039 15954 17078 19053 20537 22863 24521 25087 25463 25838 |
| 13 | 3509 8748 9581 11509 15884 16230 17583 19264 20900 21001 21310 22547 22756 22959 24768 24814 25594 25626 25880 |
| 14 | 21 29 69 1448 2386 4601 6626 6667 10242 13141 13852 14137 18640 19951 22449 23454 24431 25512 25814 |
| 15 | 18 53 7890 9934 10063 16728 19040 19809 20825 21522 21800 23582 24556 25031 25547 255692 25733 25789 25906 |
| 16 | 4096 4582 5766 5894 6517 100127 1282 13247 15207 17041 18958 20133 20503 22228 24332 24613 25689 25855 25883 |
| 17 | 0 25 819 5539 7076 7536 7695 9532 13668 150581 17683 19665 20253 21996 24136 24890 25758 25784 25807 |
| 18 | 34 40 44 4215 6076 7427 7965 8777 11017 15593 19542 22202 22973 23397 23423 24418 24873 25107 25644 |
| 19 | 1595 6216 22850 25439 |
| 20 | 1562 15172 19517 22362 |
| 21 | 7508 12879 24324 24496 |
| 22 | 6298 15819 16757 18721 |
| 23 | 11173 15175 19966 21195 |
| 24 | 59 13505 16941 23793 |
| 25 | 2267 4830 12023 20587 |
| 26 | 8827 9278 13072 16664 |
| 27 | 14419 17463 23398 25348 |
| 28 | 6112 16534 20423 22698 |
| 29 | 493 8914 21103 24799 |
| 30 | 6896 12761 13206 25873 |
| 31 | 2 1380 12322 21701 |
| 32 | 11600 21306 25753 25790 |
| 33 | 8421 13076 14271 15401 |
| 33 | 8421 13076 14271 15401 |
| 34 | 9630 14112 19017 20955 |
| 35 | 212 13932 21781 25824 |
| 36 | 5961 9110 16654 19636 |
| 37 | 58 5434 9936 12770 |
| 38 | 6575 11433 19798 |
| 39 | 2731 7338 20926 |
| 40 | 14253 18463 25404 |
| 41 | 21791 24805 25869 |
| 42 | 2 11646 15850 |
| 43 | 6075 8586 23819 |
| 44 | 18435 22093 24852 |
| 45 | 2103 2368 11704 |
| 46 | 10925 17402 18232 |
| 47 | 9062 25061 25674 |
| 48 | 18497 20853 23404 |
| 49 | 18606 19364 19551 |
| 50 | 7 1022 25543 |
| 51 | 6744 15481 25868 |
| 52 | 9081 17305 25164 |
| 53 | 8 23701 25883 |
| 54 | 9680 19955 22848 |
| 55 | 56 4564 19121 |
| 56 | 5595 15086 25892 |
| 57 | 3174 17127 23183 |
| 58 | 19397 19817 20275 |
| 59 | 12561 24571 25825 |
| 60 | 7111 9889 25865 |
| 61 | 1914 20189 21851 |
| 62 | 549 9686 25548 |
| 63 | 6586 20325 25906 |
| 64 | 3224 20710 21637 |
| 65 | 641 15215 25754 |
| 66 | 13484 23729 25818 |
| 67 | 2043 7493 24246 |
| 68 | 16860 25230 25768 |
| 69 | 22047 24200 247902 |
| 70 | 9391 18040 19499 |
| 71 | 7855 24336 25069 |
| 72 | 23834 25570 25852 |
| 73 | 1977 8800 25756 |
| 74 | 6671 21772 25859 |

TABLE 16-continued

| i | Index of row where 1 is located in the 0th column of the ith column group |
|---|---|
| 75 | 3279 6710 24444 |
| 76 | 24099 25117 25820 |
| 77 | 5553 12306 25915 |
| 78 | 48 11107 23907 |
| 79 | 10832 11974 25773 |
| 80 | 2223 17905 25484 |
| 81 | 16782 17135 20446 |
| 82 | 475 2861 3457 |
| 83 | 16218 22449 24362 |
| 84 | 11716 22200 25897 |
| 85 | 8315 15009 22633 |
| 86 | 13 20480 25852 |
| 87 | 12352 18658 25687 |
| 88 | 3681 14794 23703 |
| 89 | 30 24531 25846 |
| 90 | 4103 22077 24107 |
| 91 | 23837 25622 25812 |
| 92 | 3627 13387 25839 |
| 93 | 908 5367 19388 |
| 94 | 0 6894 25795 |
| 95 | 20322 23546 25181 |
| 96 | 8178 25260 25437 |
| 97 | 2449 13244 22565 |
| 98 | 31 18928 22741 |
| 99 | 1312 5134 14838 |
| 100 | 6085 13937 24220 |
| 101 | 66 14633 25670 |
| 102 | 47 22512 25472 |
| 103 | 8867 24704 25279 |
| 104 | 6742 21623 22745 |
| 105 | 147 9948 24178 |
| 106 | 8522 24261 24307 |
| 107 | 19202 22406 24609 |

In another example, when the length $N_{ldpc}$ of the LDPC codeword is 64800, the code rate is 10/15, and M is 360, the indexes of rows where 1 is located in the $0^{th}$ column of the $i^{th}$ column group of the information word submatrix 210 are defined as shown in Table 17 or 18 below:

TABLE 17

| i | Index of row where 1 is located in the 0th column of the ith column group |
|---|---|
| 0 | 979 1423 4166 469 6341 8258 10334 10548 14098 14514 17051 17333 17653 17830 7990 |
| 1 | 2559 4025 6344 6510 9167 9728 11312 14856 17104 17721 18600 18791 19079 19697 19840 |
| 2 | 3243 6894 7950 10539 12042 13233 13938 14752 16449 16727 17025 18297 18796 19400 21577 |
| 3 | 3272 3574 6341 6722 9191 10807 10957 12531 14036 15580 16651 17007 17309 19415 19845 |
| 4 | 155 4598 10201 10975 11086 11296 12713 15364 15978 16395 17542 18164 18451 18612 20617 |
| 5 | 1128 1999 3926 4069 5558 6085 6337 8386 10693 12450 15438 16223 16370 17308 18634 |
| 6 | 2408 2929 3630 4357 5852 7329 8536 8695 10603 11003 14304 14937 15767 18402 21502 |
| 7 | 199 3066 6446 6849 8973 9536 10452 12857 13675 15913 16717 17654 19802 20115 21579 |
| 8 | 312 870 2095 2586 5517 6196 6757 7311 7368 13046 15384 18576 20349 21424 21587 |
| 9 | 985 1591 3248 359 3706 3847 6174 6276 7864 9033 13618 15675 16446 18355 18843 |
| 10 | 975 3774 4083 5825 6166 7218 7633 9657 10103 13052 14240 17320 18126 19544 20208 |
| 11 | 1795 2005 2544 3418 6148 8051 9066 9725 10676 10752 11512 15171 17523 20481 21059 |
| 12 | 167 315 1824 2325 2640 2868 6070 6597 7016 8109 9815 11608 16142 17912 19625 |
| 13 | 1298 1896 3039 4303 4690 8787 12241 13600 14478 15492 16602 17115 17913 19466 20597 |

TABLE 17-continued

| i | Index of row where 1 is located in the 0th column of the ith column group |
|---|---|
| 14 | 568 3695 6045 6624 8131 8404 8590 9059 9246 11570 14336 18657 18941 19218 21506 |
| 15 | 228 1889 1967 2299 3011 5074 7044 7596 7689 9534 10244 10697 11691 17902 21410 |
| 16 | 1330 1579 1739 2234 3701 3865 5713 6677 7263 11172 12143 12765 17121 20011 21436 |
| 17 | 303 1668 2501 4925 5778 5985 9635 10140 10820 11779 11849 12058 15650 20426 20527 |
| 18 | 698 2484 3071 3219 4054 4125 5663 5939 6928 7086 8054 12173 16280 17945 19302 |
| 19 | 232 1619 3040 4901 7438 8135 9117 9233 10131 13321 17347 17436 18193 18586 19929 |
| 20 | 12 3721 6254 6609 7880 8139 10437 12262 13928 14065 14149 15032 15694 16264 18883 |
| 21 | 482 915 1548 1637 6687 9338 10163 11768 11970 15524 15695 17386 18787 19210 19340 |
| 22 | 1291 2500 4109 4511 5099 5194 10014 13165 13256 13972 15409 16113 16214 18584 20998 |
| 23 | 1761 4778 7444 7740 8129 8341 8931 9136 9207 10003 10678 13959 17673 18194 20990 |
| 24 | 3060 3522 5361 5692 6833 8342 8792 11023 11211 11548 11914 13987 15442 15541 19707 |
| 25 | 1322 2348 2970 5632 6349 7577 8782 9113 9267 9376 12042 12943 16680 16970 21321 |
| 26 | 6785 11960 21455 |
| 27 | 1223 15672 19550 |
| 28 | 5976 11335 20385 |
| 29 | 2818 9387 15317 |
| 30 | 2763 3554 18102 |
| 31 | 5230 11489 18997 |
| 32 | 5809 15779 20674 |
| 33 | 2620 17838 18533 |
| 34 | 3025 9342 9931 |
| 35 | 3728 5337 12142 |
| 36 | 2520 6666 9164 |
| 37 | 12892 15307 20912 |
| 38 | 10736 12393 16539 |
| 39 | 1075 2407 12853 |
| 40 | 4921 5411 18206 |
| 41 | 5955 15647 16838 |
| 42 | 6384 10336 19266 |
| 43 | 429 10421 17266 |
| 44 | 4880 10431 12208 |
| 45 | 2910 11895 12442 |
| 46 | 7366 18362 18772 |
| 47 | 4341 7903 14994 |
| 48 | 4564 6714 7378 |
| 49 | 4639 8652 18871 |
| 50 | 15787 18048 20246 |
| 51 | 3241 11079 13640 |
| 52 | 1559 2936 15881 |
| 53 | 2737 6349 10881 |
| 54 | 10394 16107 17073 |
| 55 | 8207 9043 12874 |
| 56 | 7805 16058 17905 |
| 57 | 11189 15767 17764 |
| 58 | 5823 12923 14316 |
| 59 | 11080 20390 20924 |
| 60 | 568 8263 17411 |
| 61 | 1845 3557 6562 |
| 62 | 2890 10936 14756 |
| 63 | 9031 14220 21517 |
| 64 | 3529 12955 15902 |
| 65 | 413 6750 8735 |
| 66 | 6784 12092 16421 |
| 67 | 12019 13794 15308 |
| 68 | 12588 15378 17676 |
| 69 | 8067 14589 19304 |
| 70 | 1244 5877 6085 |
| 71 | 15897 19349 19993 |
| 72 | 1426 2394 12264 |
| 73 | 3456 8931 12075 |
| 74 | 13342 15273 20351 |
| 75 | 9138 13352 20798 |
| 76 | 7031 7626 14081 |
| 77 | 4280 4507 15617 |
| 78 | 4170 10569 14335 |

TABLE 17-continued

Index of row where 1 is located in the 0th column of the ith column group

| i | |
|---|---|
| 79 | 3839 7514 16578 |
| 80 | 4688 12815 18782 |
| 81 | 4861 7858 9435 |
| 82 | 605 5445 12912 |
| 83 | 2280 4734 7311 |
| 84 | 6668 8128 12638 |
| 85 | 3733 10621 19534 |
| 86 | 13933 18316 19341 |
| 87 | 1786 3037 21566 |
| 88 | 2202 13239 16432 |
| 89 | 4882 5808 9300 |
| 90 | 4580 8484 16754 |
| 91 | 14630 17502 18269 |
| 92 | 6889 11119 12447 |
| 93 | 8162 9078 16330 |
| 94 | 6538 17851 18100 |
| 95 | 17763 19793 20816 |
| 96 | 2183 11907 17567 |
| 97 | 6640 14428 15175 |
| 98 | 877 12035 14081 |
| 99 | 1336 6468 12328 |
| 100 | 5948 9146 12003 |
| 101 | 3782 5699 12445 |
| 102 | 1770 7946 8244 |
| 103 | 7384 12639 14989 |
| 104 | 1469 11586 20959 |
| 105 | 7943 10450 15907 |
| 106 | 5005 8153 10035 |
| 107 | 17750 18826 21513 |
| 108 | 4725 8041 10112 |
| 109 | 3837 16266 17376 |
| 110 | 11340 17361 17512 |
| 111 | 1269 4611 4774 |
| 112 | 2322 10813 16157 |
| 113 | 16752 16843 18959 |
| 114 | 70 4325 18753 |
| 115 | 3165 8153 15384 |
| 116 | 160 8045 16823 |
| 117 | 14112 16724 16792 |
| 118 | 4291 7667 18176 |
| 119 | 5943 19879 20721 |

TABLE 18

Index of row where 1 is located in the 0th column of the ith column group

| i | |
|---|---|
| 0 | 316 1271 3692 9495 12147 12849 14928 16671 16938 17864 19108 20502 21097 21115 |
| 1 | 2341 2559 2643 2816 2865 5137 5331 7000 7523 8023 10439 10797 13208 15041 |
| 2 | 5556 6858 7677 10162 10207 11349 12321 12398 14787 15743 15859 15952 19313 20879 |
| 3 | 349 573 910 2702 3654 6214 9246 9353 10638 11772 14447 14953 16620 19888 |
| 4 | 204 1390 2887 3855 6230 6533 7443 7876 9299 10291 10896 13960 18287 20086 |
| 5 | 541 2429 2838 7144 8523 8637 10490 10585 11074 12074 15762 16812 17900 18548 |
| 6 | 733 1659 3838 5323 5805 7882 9429 10682 13697 16909 18846 19587 19592 20904 |
| 7 | 1134 2136 4631 4653 4718 5197 10410 11666 14996 15305 16048 17417 18960 20303 |
| 8 | 734 1001 1283 4959 10016 10176 10973 11579 12051 15550 15915 19022 19430 20121 |
| 9 | 745 4057 5855 9885 10594 10989 13156 13219 13351 13631 13685 14577 17713 20386 |
| 10 | 968 1446 2130 2502 3092 3787 5323 8104 8418 9998 11681 13972 17747 17929 |
| 11 | 3020 3857 5275 5786 6319 8608 11943 14062 17144 17752 18001 18453 19311 21414 |
| 12 | 709 747 1038 2181 5320 8292 10584 10859 13964 15009 15277 16953 20675 21509 |

TABLE 18-continued

Index of row where 1 is located in the 0th column of the ith column group

| i | |
|---|---|
| 13 | 1663 3247 5003 5760 7186 7360 10346 14211 14717 14792 15155 16128 17355 17970 |
| 14 | 516 578 1914 6147 9419 11148 11434 13289 13325 13332 19106 19257 20962 21556 |
| 15 | 5009 5632 6531 9430 9886 10621 11765 13969 16178 16413 18110 18249 20616 20759 |
| 16 | 457 2686 3318 4608 5620 5858 6480 7430 9602 12691 14664 18777 20152 20848 |
| 17 | 33 2877 5334 6851 7907 8654 10688 15401 16123 17942 17969 18747 18931 20224 |
| 18 | 87 897 7636 8663 11425 12288 12672 14199 16435 17615 17950 18953 19667 20281 |
| 19 | 1042 1832 2545 2719 2947 3672 3700 6249 6398 6833 11114 14283 17694 20477 |
| 20 | 326 488 2662 2880 3009 5357 6587 8882 11604 14374 18781 19051 19057 20508 |
| 21 | 854 1294 2436 2852 4903 6466 7761 9072 9564 10321 13638 15658 16946 19119 |
| 22 | 194 899 1711 2408 2786 5391 7108 8079 8716 11453 17303 19484 20989 21389 |
| 23 | 1631 3121 3994 5005 7810 8850 10315 10589 13407 17162 18624 18758 19311 20301 |
| 24 | 736 2424 4792 5600 6370 10061 16053 16775 18600 |
| 25 | 1254 8163 8876 9157 12141 14587 16545 17175 18191 |
| 26 | 388 6641 8974 10607 10716 14477 16825 17191 18400 |
| 27 | 5578 6082 6824 736 7745 8655 11402 11665 12428 |
| 28 | 3603 8729 13463 14698 15210 19112 19550 20727 21052 |
| 29 | 48 1732 3805 5158 15442 16909 19854 21071 21579 |
| 30 | 11707 14014 21531 |
| 31 | 1542 4133 4925 |
| 32 | 10083 13505 21198 |
| 33 | 14300 15765 16752 |
| 34 | 778 1237 11215 |
| 35 | 1325 3199 14534 |
| 36 | 2007 14510 2599 |
| 37 | 1996 5881 16429 |
| 38 | 5111 15018 15980 |
| 39 | 4989 10681 12810 |
| 40 | 3763 10715 16515 |
| 41 | 2259 10080 15642 |
| 42 | 9032 11319 21305 |
| 43 | 3915 15213 20884 |
| 44 | 11150 15022 20201 |
| 45 | 1147 6749 19625 |
| 46 | 12139 12939 18870 |
| 47 | 3840 4634 10244 |
| 48 | 1018 10231 17720 |
| 49 | 2708 13056 13393 |
| 50 | 5781 11588 18888 |
| 51 | 1345 2036 5252 |
| 52 | 5908 8143 15141 |
| 53 | 1804 13693 18640 |
| 54 | 10433 13965 16950 |
| 55 | 9568 10122 15945 |
| 56 | 547 6722 14015 |
| 57 | 321 12844 14095 |
| 58 | 2632 10513 14936 |
| 59 | 6369 11995 20321 |
| 60 | 9920 19136 21529 |
| 61 | 1990 2726 10183 |
| 62 | 5763 12118 15467 |
| 63 | 503 10006 19564 |
| 64 | 9839 11942 194752 |
| 65 | 11205 13552 15389 |
| 66 | 8841 13797 19697 |
| 67 | 124 6053 18224 |
| 68 | 6477 14406 21146 |
| 69 | 1224 8027 16011 |
| 70 | 3046 4422 17717 |
| 71 | 739 12308 17760 |
| 72 | 4014 4130 7835 |
| 73 | 2266 5652 11931 |
| 74 | 2711 7970 18317 |
| 75 | 2196 15229 17217 |
| 76 | 8636 13302 16764 |
| 77 | 5612 15010 16657 |
| 78 | 615 1249 4369 |

TABLE 18-continued

| i | Index of row where 1 is located in the 0th column of the ith column group |
|---|---|
| 79 | 3821 12073 18506 |
| 80 | 1066 16522 21536 |
| 81 | 11307 18363 19740 |
| 82 | 3240 8560 10391 |
| 83 | 3124 11424 20779 |
| 84 | 1604 8861 17394 |
| 85 | 2083 7400 8093 |
| 86 | 3218 7454 9155 |
| 87 | 9855 15998 20533 |
| 88 | 316 2850 20652 |
| 89 | 5583 9768 10333 |
| 90 | 7147 7713 18339 |
| 91 | 12607 17428 21418 |
| 92 | 14216 16954 18164 |
| 93 | 8477 15970 18488 |
| 94 | 1632 8032 9751 |
| 95 | 4573 9080 13507 |
| 96 | 11747 12441 13876 |
| 97 | 1183 15605 16675 |
| 98 | 4408 10264 17109 |
| 99 | 5495 7882 12150 |
| 100 | 1010 3763 5065 |
| 101 | 9828 18054 21599 |
| 102 | 6342 7353 15358 |
| 103 | 6362 9462 19999 |
| 104 | 7184 13693 17622 |
| 105 | 4343 4654 10995 |
| 106 | 7099 8466 18520 |
| 107 | 11505 14395 15138 |
| 108 | 6779 16691 18726 |
| 109 | 7146 12644 20196 |
| 110 | 5865 16728 19634 |
| 111 | 4657 8714 21246 |
| 112 | 4580 5279 18750 |
| 113 | 3767 6620 18905 |
| 114 | 9209 13093 17575 |
| 115 | 12486 15875 19791 |
| 116 | 8046 14636 17491 |
| 117 | 2120 4643 13206 |
| 118 | 6186 9675 12601 |
| 119 | 784 5770 21585 |

In another example, when the length $N_{ldpc}$ of the LDPC codeword is 64800, the code rate is 11/15, and M is 360, the indexes of rows where 1 is located in the $0^{th}$ column of the $i^{th}$ column group of the information word submatrix 210 are defined as shown in Table 19 below.

TABLE 19

| i | Index of row where 1 is located in the 0th column of the ith column group |
|---|---|
| 0 | 696 989 1238 3091 3116 3738 4269 6406 7033 8048 8157 10254 12033 16456 16912 |
| 1 | 444 1488 6541 8626 10735 12447 13111 13706 14135 15195 15947 16453 16916 17137 17268 |
| 2 | 401 460 992 1145 1576 1678 2238 2320 4280 6770 10027 12486 15363 16714 17157 |
| 3 | 1161 3108 3727 4508 5092 5348 5582 7727 11793 12515 12917 13362 14247 16717 17205 |
| 4 | 542 1190 6883 7911 8349 8835 10489 11631 14195 15009 15454 15482 16632 17040 17063 |
| 5 | 17 487 776 880 5077 6172 9771 11446 12798 16016 16109 16171 17087 17132 17226 |
| 6 | 1337 3275 3462 4229 9246 10180 10845 10866 12250 13633 14482 16024 16812 17186 17241 |
| 7 | 15 980 2305 3674 5971 8224 11499 11752 11770 12897 14082 14836 15311 16391 17209 |
| 8 | 0 3926 5869 8696 9351 9391 11371 14052 14172 14636 14974 16619 16961 17033 17237 |
| 9 | 3033 5317 6501 8579 10598 12168 12956 14019 15392 15806 15991 16493 16690 17062 17090 |

TABLE 19-continued

| i | Index of row where 1 is located in the 0th column of the ith column group |
|---|---|
| 10 | 981 1205 4400 6410 11003 13319 13405 14695 15846 16297 16492 16563 16616 16862 16953 |
| 11 | 1725 4276 8869 9588 14062 14486 15474 15548 16300 16432 17042 17050 17060 17175 17273 |
| 12 | 1807 5921 9960 10011 14305 14490 14572 15852 16054 16061 16306 16799 16833 17136 17262 |
| 13 | 2826 4752 6017 6540 7016 8201 14245 14419 14716 15983 16569 16652 17171 17179 17247 |
| 14 | 1662 2516 3345 5229 8086 9686 11456 12210 14595 15808 16011 16421 16525 17112 17195 |
| 15 | 2890 4821 5987 7226 8823 9869 12468 14694 15352 15805 16075 16462 17102 17251 17263 |
| 16 | 3751 3890 4382 5720 10281 10411 11350 12721 13121 14127 14980 15202 15335 16735 17123 |
| 17 | 26 30 2805 5457 6630 7188 7477 7556 11065 16608 16859 16909 16943 17030 17103 |
| 18 | 40 4524 5043 5566 9645 10204 10282 11696 13080 14837 15607 16274 17034 17225 17266 |
| 19 | 904 3157 6284 7151 7984 11712 12887 13767 15547 16099 16753 16829 17044 17250 17259 |
| 20 | 7 311 4876 8334 9249 11267 14072 14559 15003 15235 15686 16331 17177 17238 17253 |
| 21 | 4410 8066 8596 9631 10369 11249 12610 15769 16791 16960 17018 17037 17062 17165 17204 |
| 22 | 24 8261 9691 10138 11607 12782 12786 13424 13933 15262 15795 16476 17084 17193 17220 |
| 23 | 88 11622 14705 15890 |
| 24 | 304 2026 2638 6018 |
| 25 | 1163 4268 11620 17232 |
| 26 | 9701 11785 14463 17260 |
| 27 | 4118 10952 12224 17006 |
| 28 | 3647 10823 11521 12060 |
| 29 | 1717 3753 9199 11642 |
| 30 | 2187 14280 17220 |
| 31 | 14787 16903 17061 |
| 32 | 381 3534 4294 |
| 33 | 3149 6947 8323 |
| 34 | 12562 16724 16881 |
| 35 | 7289 9997 15306 |
| 36 | 5615 13152 17260 |
| 37 | 5666 16926 17027 |
| 38 | 4190 7798 16831 |
| 39 | 4778 10629 17180 |
| 40 | 10001 13884 15453 |
| 41 | 6 2237 8203 |
| 42 | 7831 15144 15160 |
| 43 | 9186 17204 17243 |
| 44 | 9435 17168 17237 |
| 45 | 42 5701 17159 |
| 46 | 7812 14259 15715 |
| 47 | 39 4513 6658 |
| 48 | 38 4513 6658 |
| 49 | 1119 4785 17182 |
| 50 | 5620 16521 16729 |
| 51 | 16 6685 17242 |
| 52 | 210 3452 12383 |
| 53 | 466 14462 16250 |
| 54 | 10548 12633 13962 |
| 55 | 1452 6005 16453 |
| 56 | 22 4120 13684 |
| 57 | 5195 11563 16522 |
| 58 | 5518 16705 17201 |
| 59 | 12233 14552 15471 |
| 60 | 6067 13440 17248 |
| 61 | 8660 8967 17061 |
| 62 | 8673 12176 15051 |
| 63 | 5959 15767 16541 |
| 64 | 3244 12109 12414 |
| 65 | 31 15913 16323 |
| 66 | 3270 15686 16653 |
| 67 | 24 7346 14675 |
| 68 | 12 1531 8740 |
| 69 | 6228 7565 16667 |
| 70 | 16936 17122 17162 |
| 71 | 4868 8451 13183 |
| 72 | 3714 4451 16919 |
| 73 | 11313 13801 17132 |

TABLE 19-continued

| i | Index of row where 1 is located in the 0th column of the ith column group |
|---|---|
| 74 | 17070 17191 17242 |
| 75 | 1911 11201 17186 |
| 76 | 14 17190 17254 |
| 77 | 11760 16008 16832 |
| 78 | 14543 17033 17278 |
| 79 | 16129 16765 17155 |
| 80 | 6891 15561 17007 |
| 81 | 12741 14744 17116 |
| 82 | 8992 16661 17277 |
| 83 | 1861 11130 16742 |
| 84 | 4822 13331 16192 |
| 85 | 13281 14027 14989 |
| 86 | 38 14887 17141 |
| 87 | 10698 13452 15674 |
| 88 | 4 2539 16877 |
| 89 | 857 17170 17249 |
| 90 | 11449 11906 12807 |
| 91 | 285 14118 16831 |
| 92 | 15191 17214 17242 |
| 93 | 39 728 16915 |
| 94 | 2469 12969 15579 |
| 95 | 16644 17151 17164 |
| 96 | 2592 8280 10448 |
| 97 | 9236 12431 17173 |
| 98 | 9064 16892 17233 |
| 99 | 4526 16146 17038 |
| 100 | 31 2116 16083 |
| 101 | 15837 16951 17031 |
| 102 | 5362 8382 16618 |
| 103 | 6137 13199 17221 |
| 104 | 2841 15068 17068 |
| 105 | 24 3620 17003 |
| 106 | 9880 15718 16764 |
| 107 | 1784 10240 17209 |
| 108 | 2731 10293 10846 |
| 109 | 3121 8723 16598 |
| 110 | 8563 15662 17088 |
| 111 | 13 1167 14676 |
| 112 | 29 13850 15963 |
| 113 | 3654 7553 8114 |
| 114 | 23 4362 14865 |
| 115 | 4434 14741 16688 |
| 116 | 8362 13901 17244 |
| 117 | 13687 16736 17232 |
| 118 | 46 4229 13394 |
| 119 | 13169 16383 16972 |
| 120 | 16031 16681 16952 |
| 121 | 3384 9894 12580 |
| 122 | 9841 14414 16165 |
| 123 | 5013 17099 17115 |
| 124 | 2130 8941 17266 |
| 125 | 6907 15428 17241 |
| 126 | 16 1860 17235 |
| 127 | 2151 16014 16643 |
| 128 | 14954 15958 17222 |
| 129 | 3969 8419 15116 |
| 130 | 31 15593 16984 |
| 131 | 11514 16605 17255 |

In another example, when the length $N_{ldpc}$ of the LDPC codeword is 64800, the code rate is 12/15, and M is 360, the indexes of rows where 1 is located in the $0^{th}$ column of the $i^{th}$ column group of the information word submatrix 210 are defined as shown in Table 20 below.

TABLE 20

| i | Index of row where 1 is located in the 0th column of the ith column group |
|---|---|
| 0 | 584 1472 1621 1867 3338 3568 3723 4185 5126 5889 7737 8632 8940 9725 |
| 1 | 221 445 590 3779 3835 6939 7743 8280 8448 8491 9367 10042 11242 12917 |
| 2 | 4662 4837 4900 5029 6449 6687 6751 8684 9936 11681 11811 11886 12089 12909 |
| 3 | 2418 3018 3647 4210 4473 7447 7502 9490 10067 11092 11139 11256 12201 12383 |
| 4 | 2591 2947 3349 3406 4417 4519 5176 6672 8498 8863 9201 11294 11376 12184 |
| 5 | 27 101 197 290 871 1727 3911 5411 6676 8701 9350 10310 10798 12439 |
| 6 | 1765 1897 2923 3584 3901 4048 6963 7054 7132 9165 10184 10824 11278 12669 |
| 7 | 2183 3740 4808 5217 5660 6375 6787 8219 8466 9037 10353 10583 11118 12762 |
| 8 | 73 1594 2146 2715 3501 3572 3639 3725 6959 7187 8406 10120 10507 10691 |
| 9 | 240 732 1215 2185 2788 2830 3499 3881 4197 4991 6425 7061 9756 10491 |
| 10 | 831 1568 1828 3424 4319 4516 4639 6018 9702 10203 10417 11240 11518 12458 |
| 11 | 2024 2970 3048 3638 3676 4152 5284 5779 5926 9426 9945 10873 11787 11837 |
| 12 | 1049 1218 1651 2328 3493 4363 5750 6483 7613 8782 9738 9803 11744 11937 |
| 13 | 1193 2060 2289 2964 3478 4592 4756 6709 7162 8231 8326 11140 11908 12243 |
| 14 | 978 2120 2439 3338 3850 4589 6567 8745 9656 9708 10161 10542 10711 12639 |
| 15 | 2403 2938 3117 3247 3711 5593 5844 5932 7801 10152 10226 11498 12162 12941 |
| 16 | 1781 2229 2276 2533 3582 3951 5279 5774 7930 9824 10920 11038 12340 12440 |
| 17 | 289 384 1980 2230 3464 3873 5958 8656 8942 9006 10175 11425 11745 12530 |
| 18 | 155 354 1090 1330 2002 2236 3559 3705 4922 5958 6576 8564 9972 12760 |
| 19 | 303 876 2059 2142 5244 5330 6644 7576 8614 9598 10410 10718 11033 12957 |
| 20 | 3449 3617 4408 4602 4727 6182 8835 8928 9372 9644 10237 10747 11655 12747 |
| 21 | 811 2565 2820 8677 8974 9632 11069 11548 11839 12107 12411 12695 12812 12890 |
| 22 | 972 4123 4943 6385 6449 7339 7477 8379 9177 9359 10074 11709 12552 12831 |
| 23 | 842 973 1541 2262 2905 5276 6758 7099 7894 8128 8325 8663 8875 10050 |
| 24 | 474 791 968 3902 4924 4965 5085 5908 6109 6329 7931 9038 9401 10568 |
| 25 | 1397 4461 4658 5911 6037 7127 7318 8678 8924 9000 9473 9602 10446 12692 |
| 26 | 1334 7571 12881 |
| 27 | 1393 1447 7972 |
| 28 | 633 1257 10597 |
| 29 | 4843 5102 11056 |
| 30 | 3294 8015 10513 |
| 31 | 1108 10374 10546 |
| 32 | 5353 7824 10111 |
| 33 | 3398 7674 8569 |
| 34 | 7719 9478 10503 |
| 35 | 2997 9418 9581 |
| 36 | 5777 6519 11229 |
| 37 | 1966 5214 9899 |
| 38 | 6 4088 5827 |
| 39 | 836 9248 9612 |
| 40 | 483 7229 7548 |
| 41 | 7865 8289 9804 |
| 42 | 2915 11098 11900 |
| 43 | 6180 7096 9481 |
| 44 | 1431 6786 8924 |
| 45 | 748 6757 8625 |
| 46 | 3312 4475 7204 |
| 47 | 1852 8958 11020 |
| 48 | 1915 2903 4006 |
| 49 | 6776 10886 12531 |
| 50 | 2594 9998 12742 |
| 51 | 159 2002 12079 |
| 52 | 853 3281 3762 |
| 53 | 5201 5798 6413 |
| 54 | 3882 6062 12047 |

TABLE 20-continued

| i | Index of row where 1 is located in the 0th column of the ith column group |
|---|---|
| 55 | 4133 6775 9657 |
| 56 | 228 6874 11183 |
| 57 | 7433 10728 10864 |
| 58 | 7735 8073 12734 |
| 59 | 2844 4621 11779 |
| 60 | 3909 7103 12804 |
| 61 | 6002 9704 11060 |
| 62 | 5864 6856 7681 |
| 63 | 3652 5869 7605 |
| 64 | 2546 2657 4461 |
| 65 | 2423 4203 9111 |
| 66 | 244 1855 4691 |
| 67 | 1106 2178 6371 |
| 68 | 391 1617 10126 |
| 69 | 250 9259 10603 |
| 70 | 3435 4614 6924 |
| 71 | 1742 8045 9529 |
| 72 | 7667 8875 11451 |
| 73 | 4023 6108 6911 |
| 74 | 8621 10184 11650 |
| 75 | 6726 10861 12348 |
| 76 | 3228 6302 7388 |
| 77 | 1 1137 5358 |
| 78 | 381 2424 8537 |
| 79 | 3256 7508 10044 |
| 80 | 1980 2219 4569 |
| 81 | 2468 5699 10319 |
| 82 | 2803 3314 12808 |
| 83 | 8578 9642 11533 |
| 84 | 829 4585 7923 |
| 85 | 59 329 5575 |
| 86 | 1067 5709 6867 |
| 87 | 1175 4744 12219 |
| 88 | 109 2518 6756 |
| 89 | 2105 10626 11153 |
| 90 | 5192 10696 10749 |
| 91 | 6260 7641 8233 |
| 92 | 2998 3094 11214 |
| 93 | 3398 6466 11494 |
| 94 | 6574 10448 12160 |
| 95 | 2734 10755 12780 |
| 96 | 1028 7958 10825 |
| 97 | 8545 8602 10793 |
| 98 | 392 3398 11417 |
| 99 | 6639 9291 12571 |
| 100 | 1067 7919 8934 |
| 101 | 1064 2848 12753 |
| 102 | 6076 8656 12690 |
| 103 | 5504 6193 10171 |
| 104 | 1951 7156 7356 |
| 105 | 4389 4780 7889 |
| 106 | 526 4804 9141 |
| 107 | 1238 3648 10464 |
| 108 | 2587 5624 12557 |
| 109 | 5560 5903 11963 |
| 110 | 1134 2570 3297 |
| 111 | 10041 11583 12157 |
| 112 | 1263 9585 12912 |
| 113 | 3744 7898 10646 |
| 114 | 45 9074 10315 |
| 115 | 1051 6188 10038 |
| 116 | 2242 8394 12712 |
| 117 | 3598 9025 12651 |
| 118 | 2295 3540 5610 |
| 119 | 1914 4378 12423 |
| 120 | 1766 3635 12759 |
| 121 | 5177 9586 11143 |
| 122 | 943 3590 11649 |
| 123 | 4864 6905 10454 |
| 124 | 5852 6042 10421 |
| 125 | 6095 8285 12349 |
| 126 | 2070 7171 8563 |
| 127 | 718 12234 12716 |
| 128 | 512 10667 11353 |
| 129 | 3629 6485 7040 |
| 130 | 2880 8865 11466 |
| 131 | 4490 10220 11796 |
| 132 | 5440 8819 9103 |
| 133 | 5262 7543 12411 |
| 134 | 516 7779 10940 |
| 135 | 2515 5843 9202 |
| 136 | 4684 5994 10586 |
| 137 | 573 2270 3324 |
| 138 | 7870 8317 10322 |
| 139 | 6856 7638 12909 |
| 140 | 1583 7669 10781 |
| 141 | 8141 9085 12555 |
| 142 | 3903 5485 9992 |
| 143 | 4467 11998 12904 |

In another example, when the length $N_{ldpc}$ of the LDPC codeword is 64800, the code rate is 13/15, and M is 360, the indexes of rows where 1 exists in the $0^{th}$ column of the $i^{th}$ column group of the information word submatrix 210 are defined as shown in Table 21 below:

TABLE 21

| i | Index of row where 1 is located in the 0th column of the ith column group |
|---|---|
| 0 | 142 2307 2598 2650 4028 4434 5781 5881 6016 6323 6681 6698 8125 |
| 1 | 2932 4928 5248 5256 5983 6773 6828 7789 8426 8494 8534 8539 8583 |
| 2 | 899 3295 3833 5399 6820 7400 7753 7890 8109 8451 8529 8564 8602 |
| 3 | 21 3060 4720 5429 5636 5927 6966 8110 8170 8247 8355 8365 8616 |
| 4 | 20 1745 2838 3799 4380 4418 4646 5059 7343 8161 8302 8456 8631 |
| 5 | 9 6274 6725 6792 7195 7333 8027 8186 8209 8273 8442 8548 8632 |
| 6 | 494 1365 2405 3799 5188 5291 7644 7926 8139 8458 8504 8594 8625 |
| 7 | 192 574 1179 4387 4695 5089 5831 7673 7789 8298 8301 8612 8632 |
| 8 | 11 20 1406 6111 6176 6256 6708 6834 7828 8232 8457 8495 8602 |
| 9 | 6 2654 3554 4483 4966 5866 6795 8069 8249 8301 8497 8509 8623 |
| 10 | 21 1144 2355 3124 6773 6805 6887 7742 7994 8358 8374 8580 8611 |
| 11 | 335 4473 4883 5528 6096 7543 7586 7921 8197 8319 8394 8489 8636 |
| 12 | 2919 4331 4419 4735 6366 6393 6844 7193 8165 8205 8544 8586 8617 |
| 13 | 12 19 742 930 3009 4330 6213 6224 7292 7430 7792 7922 8137 |
| 14 | 710 1439 1588 2434 3516 5239 6248 6827 8230 8448 8515 8581 8619 |
| 15 | 200 1075 1868 5581 7349 7642 7698 8037 8201 8210 8320 8391 8526 |
| 16 | 3 2501 4252 5256 5292 5567 6136 6321 6430 6486 7571 8521 8636 |
| 17 | 3062 4599 5885 6529 6616 7314 7319 7567 8024 8153 8302 8372 8598 |
| 18 | 105 381 1574 4351 5452 5603 5943 7467 7788 7933 8362 8513 8587 |
| 19 | 787 1857 3386 3659 6550 7131 7965 8015 8040 8312 8484 8525 8537 |
| 20 | 15 1118 4226 5197 5575 5761 6762 7038 8260 8338 8444 8512 8568 |
| 21 | 36 5216 5368 5616 6029 6591 8038 8067 8299 8351 8565 8578 8585 |
| 22 | 1 23 4300 4530 5426 5532 5817 6967 7124 7979 8022 8270 8437 |
| 23 | 629 2133 4828 5475 5875 5890 7194 8042 8345 8385 8518 8598 8612 |
| 24 | 11 1065 3782 4237 4993 7104 7863 7904 8104 8228 8321 8383 8565 |

TABLE 21-continued

| i | Index of row where 1 is located in the 0th column of the ith column group |
|---|---|
| 25 | 2131 2274 3168 3215 3220 5597 6347 7812 8238 8354 8527 8557 8614 |
| 26 | 5600 6591 7491 7696 |
| 27 | 1766 8281 8626 |
| 28 | 1725 2280 5120 |
| 29 | 1650 3445 7652 |
| 30 | 4312 6911 8526 |
| 31 | 15 1013 5892 |
| 32 | 2263 2546 2979 |
| 33 | 1545 5873 7406 |
| 34 | 67 726 3697 |
| 35 | 2860 6443 8542 |
| 36 | 17 911 2820 |
| 37 | 1561 4580 6052 |
| 38 | 79 5269 7134 |
| 39 | 22 2410 2424 |
| 40 | 3501 5642 8627 |
| 41 | 808 6950 8571 |
| 42 | 4099 6389 7482 |
| 43 | 4023 5000 7833 |
| 44 | 5476 5765 7917 |
| 45 | 1008 3194 7207 |
| 46 | 20 495 5411 |
| 47 | 1703 8388 8635 |
| 48 | 6 4395 4921 |
| 49 | 200 2053 8206 |
| 50 | 1089 5126 5562 |
| 51 | 10 4193 7720 |
| 52 | 1967 2151 4608 |
| 53 | 22 738 3513 |
| 54 | 3385 5066 8152 |
| 55 | 440 1118 8537 |
| 56 | 3429 6058 7716 |
| 57 | 5213 7519 8382 |
| 58 | 5564 8365 8620 |
| 59 | 43 3219 8603 |
| 60 | 4 5409 5815 |
| 61 | 5 6376 7654 |
| 62 | 4091 5724 5953 |
| 63 | 5348 6754 8613 |
| 64 | 1634 6398 6632 |
| 65 | 72 2058 8605 |
| 66 | 3497 5811 7579 |
| 67 | 3846 6743 8559 |
| 68 | 15 5933 8629 |
| 69 | 2133 5859 7068 |
| 70 | 4151 4617 8566 |
| 71 | 2960 8270 8410 |
| 72 | 2059 3617 8210 |
| 73 | 544 1441 6895 |
| 74 | 4043 7482 8592 |
| 75 | 294 2180 8524 |
| 76 | 3058 8227 8373 |
| 77 | 364 5756 8617 |
| 78 | 5383 8555 8619 |
| 79 | 1704 2480 4181 |
| 80 | 7338 7929 7990 |
| 81 | 2615 3905 7981 |
| 82 | 4298 4548 8296 |
| 83 | 8262 8319 8630 |
| 84 | 892 1893 8028 |
| 85 | 5694 7237 8595 |
| 86 | 1487 5012 5810 |
| 87 | 4335 8593 8624 |
| 88 | 3509 4531 5273 |
| 89 | 10 22 830 |
| 90 | 4161 5208 6280 |
| 91 | 275 7063 8634 |
| 92 | 4 2725 3113 |
| 93 | 2279 7403 8174 |
| 94 | 1637 3328 3930 |
| 95 | 2810 4939 5624 |
| 96 | 3 1234 7687 |
| 97 | 2799 7740 8616 |
| 98 | 22 7701 8636 |
| 99 | 4302 7857 7993 |
| 100 | 7477 7794 8592 |
| 101 | 9 6111 8591 |
| 102 | 5 8606 8628 |
| 103 | 347 3497 4033 |
| 104 | 1747 2613 8636 |
| 105 | 1827 5600 7042 |
| 106 | 580 1822 6842 |
| 107 | 232 7134 7783 |
| 108 | 4629 5000 7231 |
| 109 | 951 2806 4947 |
| 110 | 571 3474 8577 |
| 111 | 2437 2496 7945 |
| 112 | 23 5873 8162 |
| 113 | 12 1168 7686 |
| 114 | 8315 8540 8596 |
| 115 | 1766 2506 4733 |
| 116 | 929 1516 3338 |
| 117 | 21 1216 6555 |
| 118 | 782 1452 8617 |
| 119 | 8 6083 6087 |
| 120 | 667 3240 4583 |
| 121 | 4030 4661 5790 |
| 122 | 559 7122 8553 |
| 123 | 3202 4388 4909 |
| 124 | 2533 3673 8594 |
| 125 | 1991 3954 6206 |
| 126 | 6835 7900 7980 |
| 127 | 189 5722 8573 |
| 128 | 2680 4928 4998 |
| 129 | 243 2579 7735 |
| 130 | 4281 8132 8566 |
| 131 | 7656 7671 8609 |
| 132 | 1116 2291 4166 |
| 133 | 21 388 8021 |
| 134 | 6 1123 8369 |
| 135 | 311 4918 8511 |
| 136 | 0 3248 6290 |
| 137 | 13 6762 7172 |
| 138 | 4209 5632 7563 |
| 139 | 49 127 8074 |
| 140 | 581 1735 4075 |
| 141 | 0 2235 5470 |
| 142 | 2178 5820 6179 |
| 143 | 16 3575 6054 |
| 144 | 1095 4564 6458 |
| 145 | 9 1581 5953 |
| 146 | 2537 6469 8552 |
| 147 | 14 3874 4844 |
| 148 | 0 3269 3551 |
| 149 | 2114 7372 7926 |
| 150 | 1875 2388 4057 |
| 151 | 3232 4042 6663 |
| 152 | 9 401 583 |
| 153 | 13 4100 6584 |
| 154 | 2299 4190 4410 |
| 155 | 21 3670 4979 |

According to an exemplary embodiment, even when the order of numbers in a sequence corresponding to the $i^{th}$ column group of the parity check matrix 200 as shown in the above-described Tables 4 to 21 is changed, the changed parity check matrix is a parity check matrix used for the same code. Therefore, a case in which the order of numbers in the sequence corresponding to the $i^{th}$ column group in Tables 4 to 21 is changed is covered by the inventive concept.

According to an exemplary embodiment, even when the arrangement order of sequences corresponding to each column group is changed in Tables 4 to 21, cycle characteristics on a graph of a code and algebraic characteristics such as degree distribution are not changed. Therefore, a case in which the arrangement order of the sequences shown in Tables 4 to 21 is changed is also covered by the inventive concept.

In addition, even when a multiple of $Q_{ldpc}$ is equally added to all sequences corresponding to a certain column group in Tables 4 to 21, the cycle characteristics on the graph of the code or the algebraic characteristics such as degree distribution are not changed. Therefore, a result of equally adding a multiple of $Q_{ldpc}$ to the sequences shown in Tables 4 to 21 is also covered by the inventive concept. However, it should be noted that, when the resulting value obtained by adding the multiple of $Q_{ldpc}$ to a given sequence is greater than or equal to $(N_{ldpc}-K_{ldpc})$, a value obtained by applying a modulo operation for $(N_{ldpc}-K_{ldpc})$ to the resulting value should be applied instead.

Once positions of the rows where 1 exists in the $0^{th}$ column of the $i^{th}$ column group of the information word submatrix 210 are defined as shown in Tables 4 to 21, positions of rows where 1 exists in another column of each column group may be defined since the positions of the rows where 1 exists in the $0^{th}$ column are cyclic-shifted by $Q_{ldpc}$ in the next column.

For example, in the case of Table 4, in the $0^{th}$ column of the $0^{th}$ column group of the information word submatrix 210, 1 exists in the $245^{th}$ row, $449^{th}$ row, $491^{st}$ row, . . . .

In this case, since $Q_{ldpc}=(N_{ldpc}-K_{ldpc})/M=(16200-5400)/360=30$, the indexes of the rows where 1 is located in the $1^{st}$ column of the $0^{th}$ column group may be 275(=245+30), 479(=449+30), 521(=491+30), . . . , and the indexes of the rows where 1 is located in the $2^{nd}$ column of the $0^{th}$ column group may be 305(=275+30), 509(=479+30), 551(=521+30), . . . .

In the above-described method, the indexes of the rows where 1 is located in all rows of each column group may be defined.

The parity submatrix 220 of the parity check matrix 200 shown in FIG. 2 may be defined as follows:

The parity submatrix 220 includes $N_{ldpc}-K_{ldpc}$ number of columns (that is, $K_{ldpc}^{th}$ column to $(N_{lpdc}-1)^{th}$ column), and has a dual diagonal or staircase configuration. Accordingly, the degree of columns except the last column (that is, $(N_{ldpc}-1)^{th}$ column) from among the columns included in the parity submatrix 220 is 2, and the degree of the last column is 1.

As a result, the information word submatrix 210 of the parity check matrix 200 may be defined by Tables 4 to 21, and the parity submatrix 220 of the parity check matrix 200 may have a dual diagonal configuration.

Figure 3:
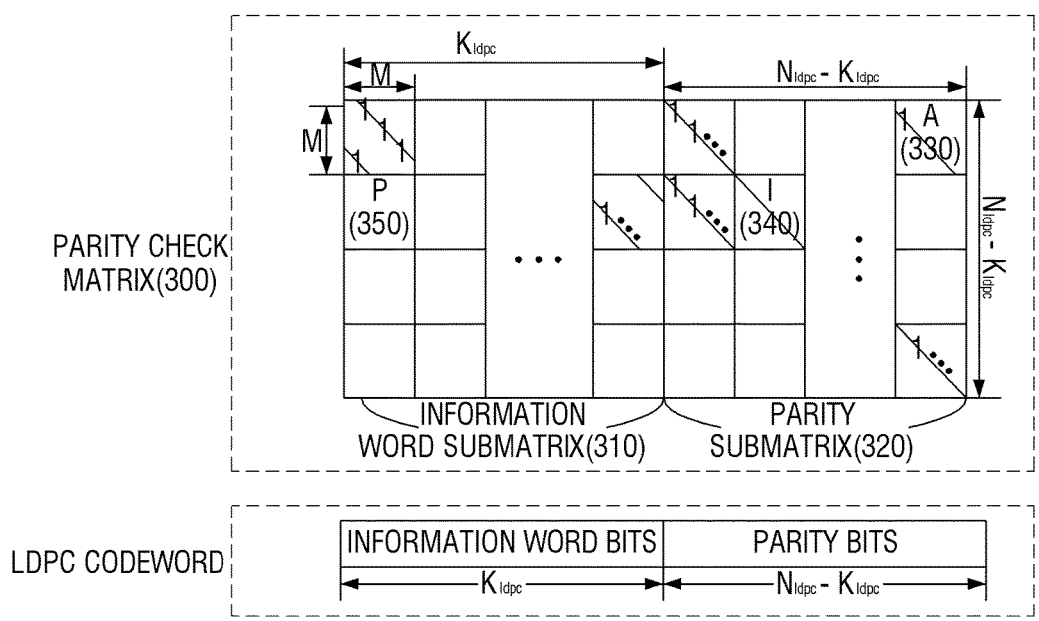

When the columns and rows of the parity check matrix 200 shown in FIG. 2 are permutated based on Equation 4 and Equation 5, the parity check matrix shown in FIG. 2 may be changed to a parity check matrix 300 shown in FIG. 3.

$$Q_{ldpc} \cdot i + j \Rightarrow M \cdot j + i (0 \leq i < M, 0 \leq j < Q_{ldpc}) \quad (4)$$

$$K_{ldpc} + Q_{ldpc} \cdot k + l \Rightarrow K_{ldpc} + M \cdot l + k (0 \leq k < M, 0 \leq l < Q_{ldpc}) \quad (5)$$

The method for permutating based on Equation 4 and Equation 5 will be explained below. Since row permutation and column permutation apply the same principle, the row permutation will be explained by the way of an example.

In the case of the row permutation, regarding the $X^{th}$ row, i and j satisfying $X=Q_{ldpc} \times i+j$ are calculated and the $X^{th}$ row is permutated by assigning the calculated i and j to M×j+i. For example, regarding the $7^{th}$ row, i and j satisfying $7=2\times i+j$ are 3 and 1, respectively. Therefore, the $7^{th}$ row is permutated to the $13^{th}$ row ($10 \times 1+3=13$).

When the row permutation and the column permutation are performed in the above-described method, the parity check matrix of FIG. 2 may be converted into the parity check matrix of FIG. 3.

Referring to FIG. 3, the parity check matrix 300 is divided into a plurality of partial blocks, and a quasi-cyclic matrix of M×M corresponds to each partial block.

Accordingly, the parity check matrix 300 having the configuration of FIG. 3 is formed of matrix units of M×M. That is, the submatrices of M×M are arranged in the plurality of partial blocks, constituting the parity check matrix 300.

Since the parity check matrix 300 is formed of the quasi-cyclic matrices of M×M, M number of columns may be referred to as a column block and M number of rows may be referred to as a row block. Accordingly, the parity check matrix 300 having the configuration of FIG. 3 is formed of $N_{qc\_column}=N_{ldpc}/M$ number of column blocks and $N_{qc\_row}=N_{parity}/M$ number of row blocks.

Hereinafter, the submatrix of M×M will be explained.

First, the $(N_{qc\_column}-1)^{th}$ column block of the $0^{th}$ row block has a form shown in Equation 6 presented below:

$$A = \begin{bmatrix} 0 & 0 & \cdots & 0 & 0 \\ 1 & 0 & \cdots & 0 & 0 \\ 0 & 1 & \cdots & 0 & 0 \\ \vdots & \vdots & \vdots & \vdots & \vdots \\ 0 & 0 & \cdots & 1 & 0 \end{bmatrix} \quad (6)$$

As described above, A 330 is an M×M matrix, values of the $0^{th}$ row and the $(M-1)^{th}$ column are all "0", and, regarding $0 \leq i \leq (M-2)$, the $(i+1)^{th}$ row of the $i^{th}$ column is "1" and the other values are "0".

Second, regarding $0 \leq i \leq (N_{ldpc}-K_{ldpc})/M-1$ in the parity submatrix 320, the $i^{th}$ row block of the $(K_{ldpc}/M+i)^{th}$ column block is configured by a unit matrix $I_{M \times M}$ 340. In addition, regarding $0 \leq i \leq (N_{ldpc}-K_{ldpc})/M-2$, the $(i+1)^{th}$ row block of the $(K_{ldpc}/M+i)^{th}$ column block is configured by a unit matrix $I_{M \times M}$ 340.

Third, a block 350 constituting the information word submatrix 310 may have a cyclic-shifted format of a cyclic matrix P, $P^{a_{ij}}$, or an added format of the cyclic-shifted matrix $P^{a_{ij}}$ of the cyclic matrix P (or an overlapping format).

For example, a format in which the cyclic matrix P is cyclic-shifted to the right by 1 may be expressed by Equation 7 presented below:

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix} \quad (7)$$

The cyclic matrix P is a square matrix having an M×M size and is a matrix in which a weight of each of M number of rows is 1 and a weight of each of M number of columns is 1. When $a_{ij}$ is 0, the cyclic matrix P, that is, $P^0$ indicates a unit matrix $I_{M \times M}$, and when is $\infty$, $P^\infty$ is a zero matrix.

A submatrix existing where the $i^{th}$ row block and the $j^{th}$ column block intersect in the parity check matrix 300 of FIG. 3 may be $P^{a_{ij}}$. Accordingly, i and j indicate the number of row blocks and the number of column blocks in the partial blocks corresponding to the information word. Accordingly, in the parity check matrix 300, the total number of columns is $N_{ldpc}=M \times N_{qc\_column}$, and the total number of rows is $N_{parity}=M \times N_{qc\_row}$. That is, the parity check matrix 300 is formed of $N_{qc\_column}$ number of "column blocks" and $N_{qc\_row}$ number of "row blocks".

Hereinafter, a method for performing LDPC encoding based on the parity check matrix 200 as shown in FIG. 2 will be explained. An LDPC encoding process when the parity check matrix 200 is defined as shown in Table 10 by way of an example will be explained for the convenience of explanation.

First, when information word bits having a length of $K_{ldpc}$ are $[i_0, i_1, i_2, \ldots, i_{K_{ldpc}-1}]$, and parity bits having a length of $N_{ldpc}-K_{ldpc}$ are $[p_0, p_1, p_2, \ldots p_{N_{ldpc}-K_{ldpc}-1}]$, the LDPC encoding is performed by the following process.

Step 1) Parity bits are initialized as That is, $p_0 = p_1 = p_2 = \ldots = p_{N_{ldpc}-K_{ldpc}-1} = 0$.

Step 2) The $0^{th}$ information word bit $i_0$ is accumulated in a parity bit having the address of the parity bit defined in the first row (that is, the row of i=0) of Table 10 as the index of the parity bit. This may be expressed by Equation 8 presented below:

$$P_{49} = P_{49} \oplus i_0 \ P_{2685} = P_{2685} \oplus i_0$$

$$P_{719} = P_{719} \oplus i_0 \ P_{2873} = P_{2873} \oplus i_0$$

$$P_{784} = P_{784} \oplus i_0 \ P_{2974} = P_{2974} \oplus i_0$$

$$P_{794} = P_{794} \oplus i_0 \ P_{2995} = P_{2995} \oplus i_0$$

$$P_{968} = P_{968} \oplus i_0 \ P_{3540} = P_{3540} \oplus i_0$$

$$P_{2382} = P_{2382} \oplus i_0 \ P_{4179} = P_{4179} \oplus i_0 \tag{8}$$

Herein, $i_0$ is a $0^{th}$ information word bit, $p_i$ is an ith parity bit, and $\oplus$ is a binary operation. According to the binary operation, $1 \oplus 1$ equals 0, $1 \oplus 0$ equals 1, $0 \oplus 1$ equals 1, $0 \oplus 0$ equals 0.

Step 3) The other 359 information word bits $i_m$ (m= 1, 2, ..., 359) are accumulated in the parity bit. The other information word bits may belong to the same column group as that of $i_0$. In this case, the address of the parity bit may be determined based on Equation 9 presented below:

$$(x + (m \bmod 360) \times Q_{ldpc}) \bmod (N_{ldpc} - K_{ldpc}) \tag{9}$$

Herein, x is an address of a parity bit accumulator corresponding to the information word bit $i_0$, and $Q_{ldpc}$ is a size by which each column is cyclic-shifted in the information word submatrix, and may be 12 in the case of Table 10. In addition, since m=1, 2, ..., 359, (m mod 360) in Equation 9 may be regarded as m.

As a result, information word bits $i_m$ (m=1, 2, ..., 359) are accumulated in the parity bits having the address of the parity bit calculated based on Equation 9 as the index. For example, an operation as shown in Equation 10 presented below may be performed for the information word bit $i_1$:

$$P_{61} = P_{61} \oplus i_1 \ P_{2697} = P_{2697} \oplus i_1$$

$$P_{731} = P_{731} \oplus i_1 \ P_{2885} = P_{2885} \oplus i_1$$

$$P_{796} = P_{796} \oplus i_1 \ P_{2986} = P_{2986} \oplus i_1$$

$$P_{806} = P_{806} \oplus i_1 \ P_{3007} = P_{3007} \oplus i_1$$

$$P_{980} = P_{980} \oplus i_1 \ P_{3552} = P_{3552} \oplus i_1$$

$$P_{2394} = P_{2394} \oplus i_1 \ P_{4191} = P_{4191} \oplus i_1 \tag{10}$$

Herein, $i_1$ is a $1^{st}$ information word bit, $p_i$ is an ith parity bit, and $\oplus$ is a binary operation. According to the binary operation, $1 \oplus 1$ equals 0, $1 \oplus 0$ equals 1, $0 \oplus 1$ equals 1, $0 \oplus 0$ equals 0.

Step 4) The $360^{th}$ information word bits $i_{360}$ is accumulated in a parity bit having the address of the parity bit defined in the $2^{nd}$ row (that is, the row of i=1) of Table 10 as the index of the parity bit.

Step 5) The other 359 information word bits belonging to the same group as that of the information word bit $i_{360}$ are accumulated in the parity bit. In this case, the address of the parity bit may be determined based on Equation 9. However, in this case, x is the address of the parity bit accumulator corresponding to the information word bit $i_{360}$.

Step 6) Steps 4 and 5 described above are repeated for all of the column groups of Table 10.

Step 7) As a result, a parity bit $p_1$ is calculated based on Equation 11 presented below. In this case, i is initialized as 1.

$$p_i = p_i \oplus p_{i-1} \ i = 1, 2, \ldots, N_{ldpc} - K_{ldpc} - 1 \tag{11}$$

In Equation 11, $p_1$ is an ith parity bit, $N_{ldpc}$ is a length of an LDPC codeword, $K_{ldpc}$ is a length of an information word of the LDPC codeword, and $\oplus$ is a binary operation.

As a result, the encoder 110 may calculate the parity bits according to the above-described method.

Figure 4:
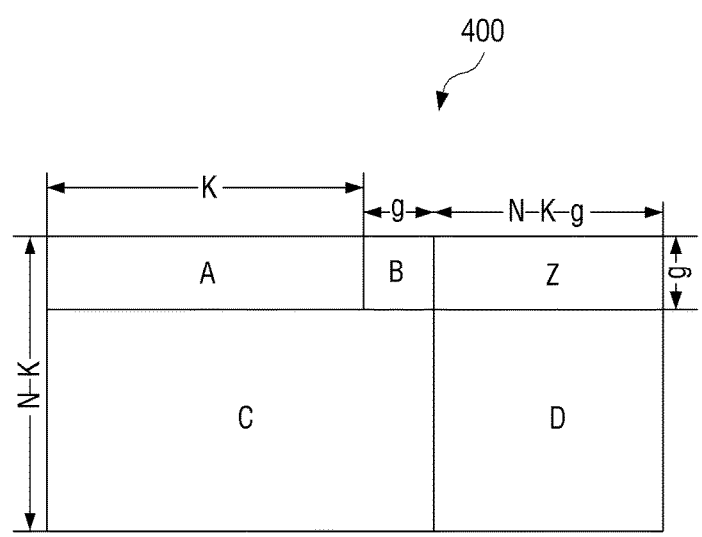

In another example, a parity check matrix according to an exemplary embodiment may have a configuration as shown in FIG. 4.

Referring to FIG. 4, the parity check matrix 400 may be formed of 5 matrices A, B, C, Z, and D. Hereinafter, the configuration of each matrix will be explained to explain the configuration of the parity check matrix 400.

First, $M_1$, $M_2$, $Q_1$, and $Q_2$, which are parameter values related to the parity check matrix 400 as shown in FIG. 4, may be defined as shown in Table 22 presented below according to the length and the code rate of the LDPC codeword.

TABLE 22

| Rate | Length | Sizes | | | |
|---|---|---|---|---|---|
| | | $M_1$ | $M_2$ | $Q_1$ | $Q_2$ |
| 1/15 | 16200 | 2520 | 12600 | 7 | 35 |
| | 64800 | 1080 | 59400 | 3 | 165 |
| 2/15 | 16200 | 3240 | 10800 | 9 | 30 |
| | 64800 | 1800 | 54360 | 5 | 151 |
| 3/15 | 16200 | 1080 | 11880 | 3 | 33 |
| | 64800 | 1800 | 50040 | 5 | 139 |
| 4/15 | 16200 | 1080 | 10800 | 3 | 30 |
| | 64800 | 1800 | 45720 | 5 | 127 |
| 5/15 | 16200 | 720 | 10080 | 2 | 28 |
| | 64800 | 1440 | 41760 | 4 | 116 |
| 6/15 | 16200 | 1080 | 8640 | 3 | 24 |
| | 64800 | 1080 | 37800 | 3 | 105 |

The matrix A is formed of K number of columns and g number of rows, and the matrix C is formed of K+g number of columns and N−K−g number of rows. Herein, K is a length of information word bits, and N is a length of the LDPC codeword.

Indexes of rows where 1 is located in the $0^{th}$ column of the ith column group in the matrix A and the matrix C may be defined based on Tables 23 to 31 according to the length and the code rate of the LDPC codeword. In this case, an interval at which a pattern of a column is repeated in each of the matrix A and the matrix C, that is, the number of columns belonging to the same group, may be 360.

For example, when the length N of the LDPC codeword is 64800 and the code rate is 3/15, the indexes of rows where 1 is located in the $0^{th}$ column of the ith column group in the matrix A and the matrix C are defined as shown in Table 23 presented below:

TABLE 23

| i | Index of row where 1 is located in the 0th column of the ith column group |
|---|---|
| 0 | 920 963 1307 2648 6529 17455 18883 19848 19909 24149 24249 38395 41589 48032 50313 |
| 1 | 297 736 744 5951 8438 9881 15522 16462 23036 25071 34915 41193 42975 43412 49612 |
| 2 | 10 223 879 4662 6400 8691 14561 16626 17408 22810 31795 32580 43639 45223 47511 |
| 3 | 629 842 1666 3150 7596 9465 12327 18649 19052 19279 29743 30197 40106 48371 51155 |
| 4 | 857 953 1116 8725 8726 10508 17112 21007 30649 32113 36962 39254 46636 49599 50099 |
| 5 | 700 894 1128 5527 6216 15123 21510 24584 29026 31416 37158 38460 42511 46932 51832 |
| 6 | 430 592 1521 3018 10430 18090 18092 18388 20017 34383 35006 38255 41700 42158 45211 |
| 7 | 91 1485 1733 11624 12969 17531 21324 23657 27148 27509 28753 35093 43352 48104 51648 |
| 8 | 18 34 117 6739 8679 11018 12163 16733 24113 25906 30605 32700 36465 40799 43359 |
| 9 | 481 1545 1644 4216 4606 6015 6609 14659 16966 18056 19137 26670 28001 30668 49061 |
| 10 | 174 1208 1387 10580 11507 13751 16344 22735 23559 26492 27672 33399 44787 44842 45992 |
| 11 | 1151 1185 1472 6727 10701 14755 15688 17441 21281 23692 23994 31366 35854 37301 43148 |
| 12 | 200 799 1583 3451 5880 7604 8194 13428 16109 18584 20463 22373 31977 47073 50087 |
| 13 | 346 843 1352 13409 17376 18233 19119 19382 20578 24183 32052 32912 43204 48539 49893 |
| 14 | 76 457 1169 13516 14520 14638 22391 25294 31067 31325 36711 44072 44854 49274 51624 |
| 15 | 759 798 1420 6661 12101 12573 13796 15510 18384 26649 30875 36856 38994 43634 49281 |
| 16 | 551 797 1000 3999 10040 11246 15793 23298 23822 38480 39209 45334 46603 46625 47633 |
| 17 | 441 875 1554 5336 25948 28842 30329 31503 39203 39673 46250 47021 48555 49229 51421 |
| 18 | 963 1470 1642 3180 3943 6513 9125 15641 17083 18876 28499 32764 42420 43922 45762 |
| 19 | 293 324 867 8803 10582 17926 19830 22497 24848 30034 34659 37721 41523 42534 47806 |
| 20 | 687 975 1356 2721 3002 3874 4119 12336 17119 21251 22482 22833 24681 26225 48514 |
| 21 | 549 951 1268 9144 11710 12623 18949 19362 22769 32603 34559 34683 36338 47140 51069 |
| 22 | 52 890 1669 3905 5670 14712 18314 22297 30328 33389 35447 35512 35516 40587 41918 |
| 23 | 656 1063 1694 3338 3793 4513 6009 7441 13393 20920 26501 27576 29623 31261 42093 |
| 24 | 425 1018 1086 9226 10024 17552 24714 24877 25853 28918 30945 31205 33103 42564 47214 |
| 25 | 32 1145 1438 4916 4945 14830 17505 19919 24118 28506 30173 31754 34230 48608 50291 |
| 26 | 559 1216 1272 2856 8703 9371 9708 16180 19127 24337 26390 36649 41105 42988 44096 |
| 27 | 362 658 1191 7769 8998 14068 15921 18471 18780 31995 32798 32864 37293 39468 44308 |
| 28 | 1136 1389 1785 8800 12541 14723 15210 15859 26569 30127 31357 32898 38760 50523 51715 |
| 29 | 44 80 1368 2010 2228 6614 6767 9275 25237 30208 39537 42041 49906 50701 51199 |
| 30 | 1522 1536 1765 3914 5350 10869 12278 12886 16379 22743 23987 26306 30966 33854 41356 |
| 31 | 212 648 709 3443 7007 7545 12484 13358 17008 20433 25862 31945 39207 39752 40313 |
| 32 | 789 1062 1431 12280 17415 18098 23729 37278 38454 38763 41039 44600 50700 51139 51696 |
| 33 | 825 1298 1391 4882 12738 17569 19177 19896 27401 37041 39181 39199 41832 43636 45775 |
| 34 | 992 1053 1485 3806 16929 18596 22017 23435 23932 30211 30390 34469 37213 46220 49646 |
| 35 | 771 850 1039 5180 7653 13547 17980 23365 25318 34374 36115 38753 42993 49696 51031 |

TABLE 23-continued

| i | Index of row where 1 is located in the 0th column of the ith column group |
|---|---|
| 36 | 7383 14780 15959 18921 22579 28612 32038 36727 40851 41947 42707 50480 |
| 37 | 8733 9464 13148 13899 19396 22933 23039 25047 29938 33588 33796 48930 |
| 38 | 2493 12555 16706 23905 35400 36330 37065 38866 40305 43807 43917 50621 |
| 39 | 6437 11927 14542 16617 17317 17755 18832 24772 29273 31136 36925 46663 |
| 40 | 2191 3431 6288 6430 9908 13069 23014 24822 29818 39914 46010 47246 |

In another example, when the length N of the LDPC codeword is 16200 and the code rate is 4/15, the indexes of rows where 1 is located in the $0^{th}$ column of the ith column group in the matrix A and the matrix C are defined as shown in Table 24 presented below:

TABLE 24

| i | Indexes of rows where 1 is located in the 0th column of the ith column group |
|---|---|
| 0 | 19 585 710 3241 3276 3648 6345 9224 9890 10841 |
| 1 | 181 494 894 2562 3201 4382 5130 5308 6493 10135 |
| 2 | 150 569 919 1427 2347 4475 7857 8904 9903 |
| 3 | 1005 1018 1025 2933 3280 3946 4049 4166 5209 |
| 4 | 420 554 778 6908 7959 8344 8462 10912 11099 |
| 5 | 231 506 859 4478 4957 7664 7731 7908 8980 |
| 6 | 179 537 979 3717 5092 6315 6883 9353 9935 |
| 7 | 147 205 830 3609 3720 4667 7441 10196 11809 |
| 8 | 60 1021 1061 1554 4918 5690 6184 7986 11296 |
| 9 | 145 719 768 2290 2919 7272 8561 9145 10233 |
| 10 | 388 590 852 1579 1698 1974 9747 10192 10255 |
| 11 | 231 343 485 1546 3155 4829 7710 10394 11336 |
| 12 | 4381 5398 5987 9123 10365 11018 11153 |
| 13 | 2381 5196 6613 6844 7357 8732 11082 |
| 14 | 1730 4599 5693 6318 7626 9231 10663 |

In another example, when the length N of the LDPC codeword is 64800 and the code rate is 4/15, the indexes of rows where 1 is located in the $0^{th}$ column of the ith column group in the matrix A and the matrix C are defined as shown in Table 25 presented below:

TABLE 25

| i | Indexes of rows where 1 is located in the 0th column of the ith column group |
|---|---|
| 0 | 276 1754 1780 3597 8549 15196 26305 27003 33883 37189 41042 41849 42356 |
| 1 | 730 873 927 9310 9867 17594 21969 23106 25922 31167 35434 37742 45866 |
| 2 | 925 1202 1564 2575 2831 2951 5193 13096 18363 20592 33786 34090 40900 |
| 3 | 973 1045 1071 8545 8980 11983 18649 21323 22789 22843 26821 36720 37856 |
| 4 | 402 1038 1689 2466 2893 13474 15710 24137 29709 30451 35568 35966 46436 |
| 5 | 263 271 395 5089 5645 15488 16314 28778 29729 34350 34533 39608 45371 |
| 6 | 387 1059 1306 1955 6990 20001 24606 28167 33802 35181 38481 38688 45140 |
| 7 | 53 851 1750 3493 11415 18882 20244 23411 28715 30722 36487 38019 45416 |
| 8 | 810 1044 1772 3906 5832 16793 17333 17910 23946 29650 34190 40673 45828 |
| 9 | 97 491 948 12156 13788 24970 33774 37539 39750 39820 41195 46464 46820 |
| 10 | 192 899 1283 3732 7310 13637 13810 19005 24227 26772 31273 37665 44005 |

TABLE 25-continued

| i | Indexes of rows where 1 is located in the 0th column of the ith column group |
|---|---|
| 11 | 424 531 1300 4860 8983 10137 16323 16888 17933 22458 26917 27835 37931 |
| 12 | 130 279 731 3024 6378 18838 19746 21007 22825 23109 28644 32048 34667 |
| 13 | 938 1041 1482 9589 10065 11535 17477 25816 27966 35022 35025 42536 |
| 14 | 170 454 1312 5326 6765 23408 24090 26072 33037 38088 42985 46413 |
| 15 | 220 804 843 2921 4841 7760 8303 11259 21058 21276 34346 37604 |
| 16 | 676 713 832 11937 12006 12309 16329 26438 34214 37471 38179 42420 |
| 17 | 714 931 1580 6837 9824 11257 15556 26730 32053 34461 35889 45821 |
| 18 | 28 1097 1340 8767 9406 17253 29558 32857 37856 38593 41781 47101 |
| 19 | 158 722 754 14489 23851 28160 30371 30579 34963 44216 46462 47463 |
| 20 | 833 1326 1332 7032 9566 11011 21424 26827 29789 31699 32876 37498 |
| 21 | 251 504 1075 4470 7736 11242 20397 32719 34453 36571 40344 46341 |
| 22 | 330 581 868 15168 20265 26354 33624 35134 38609 44965 45209 46909 |
| 23 | 729 1643 1732 3946 4912 9615 19699 30993 33658 38712 39424 46799 |
| 24 | 546 982 1274 9264 11017 11868 15674 16277 19204 28606 39063 43331 |
| 25 | 73 1160 1196 4334 12560 13583 14703 18270 18719 19327 38985 46779 |
| 26 | 1147 1625 1759 3767 5912 11599 18561 19330 29619 33671 43346 44098 |
| 27 | 104 1507 1586 9387 17890 23532 27008 27861 30966 33579 35541 39801 |
| 28 | 1700 1746 1793 4941 7814 13746 20375 27441 30262 30392 35385 42848 |
| 29 | 183 555 1029 3090 5412 8148 19662 23312 23933 28179 29962 35514 |
| 30 | 891 908 1127 2827 4077 4376 4570 26923 27456 33699 43431 46071 |
| 31 | 404 1110 1782 6003 14452 19247 26998 30137 31404 31624 46621 47366 |
| 32 | 886 1627 1704 8193 8980 9648 10928 16267 19774 35111 38545 44735 |
| 33 | 268 380 1214 4797 5168 9109 9288 17992 21309 33210 36210 41429 |
| 34 | 572 1121 1165 6944 7114 20978 23540 25863 26190 26365 41521 44690 |
| 35 | 18 185 496 5885 6165 20468 23895 24745 31226 33680 37665 38587 |
| 36 | 289 527 1118 11275 12015 18088 22805 24679 28262 30160 34892 43212 |
| 37 | 658 926 1589 7634 16231 22193 25320 26057 26512 27498 29472 34219 |
| 38 | 337 801 1525 2023 3512 16031 26911 32719 35620 39035 43779 44316 |
| 39 | 248 534 670 6217 11430 24090 26509 28712 33073 33912 38048 39813 |
| 40 | 82 1556 1575 7879 7892 14714 22404 22773 25531 34170 38203 38254 |
| 41 | 247 313 1224 3694 14304 24033 26394 28101 37455 37859 38997 41344 |
| 42 | 790 887 1418 2811 3288 9049 9704 13303 14262 38149 40109 40477 |
| 43 | 1310 1384 1471 3716 8250 25371 26329 26997 30138 40842 41041 44921 |
| 44 | 86 288 367 1860 8713 18211 22628 22811 28342 28463 40415 45845 |
| 45 | 719 1438 1741 8258 10797 29270 29404 32096 34433 34616 36030 45597 |
| 46 | 215 1182 1364 8146 9949 10498 18603 19304 19803 23685 43304 45121 |
| 47 | 1243 1496 1537 8484 8851 16589 17665 20152 24283 28993 34274 39795 |
| 48 | 6320 6785 15841 16309 20512 25804 27421 28941 43871 44647 |
| 49 | 2207 2713 4450 12217 16506 21188 23933 28789 38099 42392 |
| 50 | 14064 14307 14599 14866 17540 18881 21065 25823 30341 36963 |
| 51 | 14259 14396 17037 26769 29219 29319 31689 33013 35631 37319 |
| 52 | 7798 10495 12868 14298 17221 23344 31908 39809 41001 41965 |

In another example, when the length N of the LDPC codeword is 16200 and the code rate is 5/15, the indexes of rows where 1 is located in the $0^{th}$ column of the ith column group in the matrix A and the matrix C are defined as shown in Table 26 presented below:

TABLE 26

| i | Indexes of rows where 1 is located in the 0th column of the ith column group |
|---|---|
| 0 | 69 244 706 5145 5994 6066 6763 6815 8509 |
| 1 | 257 541 618 3933 6188 7048 7484 8424 9104 |
| 2 | 69 500 536 1494 1669 7075 7553 8202 10305 |
| 3 | 11 189 340 2103 3199 6775 7471 7918 10530 |
| 4 | 333 400 434 1806 3264 5693 8534 9274 10344 |
| 5 | 111 129 260 3562 3676 3680 3809 5169 7308 8280 |
| 6 | 100 303 342 3133 3952 4226 4713 5053 5717 9931 |
| 7 | 83 87 374 828 2460 4943 6311 8657 9272 9571 |
| 8 | 114 166 325 2680 4698 7703 7886 8791 9978 10684 |
| 9 | 281 542 549 1671 3178 3955 7153 7432 9052 10219 |
| 10 | 202 271 608 3860 4173 4203 5169 6871 8113 9757 |
| 11 | 16 359 419 3333 4198 4737 6170 7987 9573 10095 |
| 12 | 235 244 584 4640 5007 5563 6029 6816 7678 9968 |
| 13 | 123 449 646 2460 3845 4161 6610 7245 7686 8651 |
| 14 | 136 231 468 835 2622 3292 5158 5294 6584 9926 |
| 15 | 3085 4683 8191 9027 9922 9928 10550 |
| 16 | 2462 3185 3976 4091 8089 8772 9342 |

In another example, when the length N of the LDPC codeword is 64800 and the code rate is 6/15, the indexes of rows where 1 is located in the $0^{th}$ column of the ith column group in the matrix A and the matrix C are defined as shown in Table 27 presented below:

TABLE 27

| i | Indexes of rows where 1 is located in the 0th column of the ith column group |
|---|---|
| 0 | 221 1011 1218 4299 7143 8728 11072 15533 17356 33909 36833 |
| 1 | 360 1210 1375 2313 3493 16822 21373 23588 23656 26267 34098 |
| 2 | 544 1347 1433 2457 9186 10945 13583 14858 19195 34606 37441 |
| 3 | 37 596 715 4134 8091 12106 24307 24658 34108 40591 42883 |
| 4 | 235 398 1204 2075 6742 11670 13512 23231 24784 27915 34752 |
| 5 | 204 873 890 13550 16570 19774 34012 35249 37655 39885 42890 |
| 6 | 221 371 514 11984 14972 15690 28827 29069 30531 31018 43121 |
| 7 | 280 549 1435 1889 3310 10234 11575 15243 20748 30469 36005 |
| 8 | 223 666 1248 13304 14433 14732 18943 21248 23127 38529 39272 |
| 9 | 370 819 1065 9461 10319 25294 31958 33542 37458 39681 40039 |
| 10 | 585 870 1028 5087 5216 12228 16216 16381 16937 27132 27893 |
| 11 | 164 167 1210 7386 11151 20413 22713 23134 24188 36771 38992 |
| 12 | 298 511 809 4620 7347 8873 19602 24162 29198 34304 41145 |
| 13 | 105 830 1212 2415 14759 15440 16361 16748 22123 32684 42575 |
| 14 | 659 665 668 6458 22130 25972 30697 31074 32048 36078 37129 |
| 15 | 91 808 953 8015 8988 13492 13987 15979 28355 34509 39698 |
| 16 | 594 983 1265 3028 4029 9366 11069 11512 27066 40939 41639 |
| 17 | 506 740 1321 1484 10747 16376 17384 20285 31502 38925 42606 |
| 18 | 338 356 975 2022 3578 18689 18772 19826 22914 24733 27431 |
| 19 | 709 1264 1366 4617 8893 25226 27800 29080 30277 37781 39644 |
| 20 | 840 1179 1338 2973 3541 7043 12712 15005 17149 19910 36795 |
| 21 | 1009 1267 1380 4919 12679 22889 29638 30987 34637 36232 37284 |
| 22 | 466 913 1247 1646 3049 5924 9014 20539 34546 35029 36540 |

TABLE 27-continued

Indexes of rows where 1 is located in the 0th column of the ith column group

| i | |
|---|---|
| 23 | 374 697 984 1654 5870 10883 11684 20294 28888 31612 34031 |
| 24 | 117 240 635 5093 8673 11323 12456 14145 21397 39619 42559 |
| 25 | 122 1265 1427 13528 14282 15241 16852 17227 34723 36836 39791 |
| 26 | 595 1180 1310 6952 17916 24725 24971 27243 29555 32138 35987 |
| 27 | 140 470 1017 13222 13253 18462 20806 21117 28673 31598 37235 |
| 28 | 7 710 1072 8014 10804 13303 14292 16690 26676 36443 41966 |
| 29 | 48 189 759 12438 14523 16388 23178 27315 28656 29111 29694 |
| 30 | 285 387 410 4294 4467 5949 25386 27898 34880 41169 42614 |
| 31 | 474 545 1320 10506 13186 18126 27110 31498 35353 36193 37322 |
| 32 | 1075 1130 1424 11390 13312 14161 16927 25071 25844 34287 38151 |
| 33 | 161 396 427 5944 17281 22201 25218 30143 35566 38261 42513 |
| 34 | 233 247 694 1446 3180 3507 9069 20764 21940 33422 39358 |
| 35 | 271 508 1013 6271 21760 21858 24887 29808 31099 35475 39924 |
| 36 | 8 674 1329 3135 5110 14460 28108 28388 31043 31137 31863 |
| 37 | 1035 1222 1409 8287 16083 24450 24888 29356 30329 37834 39684 |
| 38 | 391 1090 1128 1866 4095 10643 13121 14499 20056 22195 30593 |
| 39 | 55 161 1402 6289 6837 8791 17937 21425 26602 30461 37241 |
| 40 | 110 377 1228 6875 13253 17032 19008 23274 32285 33452 41630 |
| 41 | 360 638 1355 5933 12593 13533 23377 23881 24586 26040 41663 |
| 42 | 535 1240 1333 3354 10860 16032 32573 34908 34957 39255 40759 |
| 43 | 526 936 1321 7992 10260 18527 28248 29356 32636 34666 35552 |
| 44 | 336 785 875 7530 13062 13075 18925 27963 28703 33688 36502 |
| 45 | 36 591 1062 1518 3821 7048 11197 17781 19408 22731 24783 |
| 46 | 214 1145 1223 1546 9475 11170 16061 21273 38688 40051 42479 |
| 47 | 1136 1226 1423 20227 22573 24951 26462 29586 34915 42441 43048 |
| 48 | 26 276 1425 6048 7224 7917 8747 27559 28515 35002 37649 |
| 49 | 127 294 437 4029 8585 9647 11904 24115 28514 36893 39722 |
| 50 | 748 1093 1403 9536 19305 20468 31049 38667 40502 40720 41949 |
| 51 | 96 638 743 9806 12101 17751 22732 24937 32007 32594 38504 |
| 52 | 649 904 1079 2770 3337 9158 20125 24619 32921 33698 35173 |
| 53 | 401 518 984 7372 12438 12582 18704 35874 39420 39503 39790 |
| 54 | 10 451 1077 8078 16320 17409 25807 28814 30613 41261 42955 |
| 55 | 405 592 1178 15936 18418 19585 21966 24219 30637 34536 37838 |
| 56 | 50 584 851 9720 11919 22544 22545 25851 35567 41587 41876 |
| 57 | 911 1113 1176 1806 10058 10809 14220 19044 20748 29424 36671 |
| 58 | 441 550 1135 1956 11254 18699 30249 33099 34587 35243 39952 |
| 59 | 510 1016 1281 8621 13467 13780 15170 16289 20925 26426 34479 |
| 60 | 4969 5223 17117 21950 22144 24043 27151 39809 |
| 61 | 11452 13622 18918 19670 23995 32647 37200 37399 |
| 62 | 6351 6426 13185 13973 16699 22524 31070 31916 |
| 63 | 4098 10617 14854 18004 28580 36158 37500 38552 |

In another example, when the length N of the LDPC codeword is 16200 and the code rate is 6/15, the indexes of rows where 1 is located in the $0^{th}$ column of the ith column group in the matrix A and the matrix C are defined as shown in Table 28 presented below:

TABLE 28

Indexes of rows where 1 is located in the 0th column of the ith column group

| i | |
|---|---|
| 0 | 15 593 1066 1714 5358 6168 7077 7979 |
| 1 | 339 731 769 1399 4678 7100 8114 8696 |
| 2 | 247 344 510 5273 5668 6136 8569 9147 |
| 3 | 21 283 521 4055 4548 4957 6557 7718 |
| 4 | 3 110 880 1410 4143 8297 9105 9115 |
| 5 | 2 559 636 1934 2947 3765 4060 5072 |
| 6 | 741 754 1040 1827 2112 3338 4693 6498 |
| 7 | 213 338 775 2464 2974 3852 4353 4787 |
| 8 | 211 428 432 2439 2694 4541 6025 8071 |
| 9 | 28 239 855 2060 3791 7217 8722 |
| 10 | 407 555 814 2635 3037 4619 8473 |
| 11 | 203 846 988 2599 4890 7749 9671 |
| 12 | 641 682 801 2577 4612 4916 5286 |
| 13 | 111 577 728 2998 4109 5547 8002 |
| 14 | 197 391 480 1526 9016 9434 9447 |
| 15 | 382 446 546 3865 6824 7752 8076 |
| 16 | 307 321 1031 4476 7858 8463 9604 |

TABLE 28-continued

Indexes of rows where 1 is located in the 0th column of the ith column group

| i | |
|---|---|
| 17 | 112 252 446 1665 2189 4869 5570 |
| 18 | 4566 6695 7966 8371 9608 |
| 19 | 2490 3419 6716 9038 9232 |
| 20 | 1117 1203 6031 7193 7320 |

In another example, when the length N of the LDPC codeword is 64800 and the code rate is 6/15, the indexes of rows where 1 is located in the $0^{th}$ column of the ith column group in the matrix A and the matrix C are defined as shown in Table 29 presented below:

TABLE 29

Index of row where 1 is located in the 0th column of the ith column group

| i | |
|---|---|
| 0 | 71 276 856 6867 12964 17373 18159 26420 28460 28477 |
| 1 | 257 322 672 2533 5316 6578 9037 10231 13845 36497 |
| 2 | 233 765 904 1366 3875 13145 15409 18620 23910 30825 |
| 3 | 100 224 405 12776 13866 14787 16781 23886 29099 31419 |
| 4 | 23 496 891 2512 12589 14074 19392 20339 27658 28684 |
| 5 | 473 712 759 1283 4374 9898 12551 13814 24242 32728 |
| 6 | 511 567 815 11823 17106 17900 19338 22315 24396 26448 |
| 7 | 45 733 836 1923 3727 17468 25746 33806 35995 36657 |
| 8 | 17 487 675 2670 3922 5145 18009 23993 31073 36624 |
| 9 | 72 751 773 1937 17324 28512 30666 30934 31016 31849 |
| 10 | 257 343 594 14041 19141 24914 26864 28809 32055 34753 |
| 11 | 99 241 491 2650 9670 17433 17785 18988 22235 30742 |
| 12 | 198 299 655 6737 8304 10917 16092 19387 20755 37690 |
| 13 | 351 916 926 18151 21708 23216 30321 33578 34052 37949 |
| 14 | 54 332 373 2010 3332 5623 16301 34337 36451 37861 |
| 15 | 139 257 1068 11090 20289 29694 29732 32640 35133 36404 |
| 16 | 457 885 968 2115 4956 5422 5949 17570 26673 32387 |
| 17 | 137 570 619 5006 6099 7979 14429 16650 25443 32789 |
| 18 | 46 282 287 10258 18383 20258 27186 27494 28429 38266 |
| 19 | 445 486 1058 1868 9976 11294 20364 23695 30826 35330 |
| 20 | 134 900 931 12518 14544 17715 19623 21111 33668 34570 |
| 21 | 62 66 586 8020 20270 23831 31041 31965 32224 35189 |
| 22 | 174 290 784 6740 14673 17642 26286 27382 33447 34879 |
| 23 | 332 675 1033 1838 12004 15439 20765 31721 34225 38863 |
| 24 | 527 558 832 3867 6318 8317 10883 13466 18427 25377 |
| 25 | 431 780 1021 1112 2873 7675 13059 17793 20570 20771 |
| 26 | 339 536 1015 5725 6916 10846 14487 21156 28123 32614 |
| 27 | 456 830 1078 7511 11801 12362 12705 17401 28867 34032 |
| 28 | 222 538 989 5593 6022 8302 14008 23445 25127 29022 |
| 29 | 37 393 788 3025 7768 11367 22276 22761 28232 30394 |
| 30 | 234 257 1045 1307 2908 6337 26530 28142 34129 35997 |
| 31 | 35 46 978 9912 9978 12567 17843 24194 34887 35206 |
| 32 | 39 959 967 5027 10847 14657 18859 28075 28214 36325 |
| 33 | 275 477 823 11376 18073 28997 30521 31661 31941 32116 |
| 34 | 185 580 966 11733 12013 12760 13358 19372 32534 35504 |
| 35 | 760 891 1046 11150 20358 21638 29930 31014 33050 34840 |
| 36 | 360 389 1057 5316 5938 14186 16404 32445 34021 35722 |
| 37 | 306 344 679 5224 6674 10305 18753 25583 30585 36943 |
| 38 | 103 171 1016 8780 11741 12144 19470 20955 22495 27377 |
| 39 | 818 832 894 3883 14279 14497 22505 28129 28719 31246 |
| 40 | 215 411 760 5886 25612 28556 32213 32704 35901 36130 |
| 41 | 229 489 1067 2385 8587 20565 23431 28102 30147 32859 |
| 42 | 288 664 980 8138 8531 21676 23787 26708 28798 34490 |
| 43 | 89 552 847 6656 9889 23949 26226 27080 31236 35823 |
| 44 | 66 142 443 3339 3813 7977 14944 15464 19186 25983 |
| 45 | 605 876 931 16682 17669 25800 28220 33432 35738 37382 |
| 46 | 346 423 806 5669 7668 8789 9928 19724 24039 27893 |
| 47 | 48 460 1055 3512 7389 7549 20216 22180 28221 35437 |
| 48 | 187 636 824 1678 4508 13588 19683 21750 30311 33480 |
| 49 | 25 768 935 2856 8187 9052 21850 29941 33217 34293 |
| 50 | 349 624 716 2698 6395 6435 8974 10649 15932 17378 |
| 51 | 336 410 871 3582 9830 10885 13892 18027 19203 36659 |
| 52 | 176 849 1078 17302 19379 27964 28164 28720 32557 35495 |
| 53 | 234 890 1075 9431 9605 9700 10113 11332 12679 24268 |
| 54 | 516 638 733 8851 19871 22740 25791 30152 32659 35568 |

TABLE 29-continued

| i | Index of row where 1 is located in the 0th column of the ith column group |
|---|---|
| 55 | 253 830 879 2086 16885 22952 23765 25389 34656 37293 |
| 56 | 94 954 998 2003 3369 6870 7321 29856 31373 34888 |
| 57 | 79 350 933 4853 6252 11932 12058 21631 24552 24876 |
| 58 | 246 647 778 4036 10391 10656 13194 32335 32360 34179 |
| 59 | 149 339 436 6971 8356 8715 11577 22376 28684 31249 |
| 60 | 36 149 220 6936 18408 19192 19288 23063 28411 35312 |
| 61 | 273 683 1042 6327 10011 18041 21704 29097 30791 31425 |
| 62 | 46 138 722 2701 10984 13002 19930 26625 28458 28965 |
| 63 | 12 1009 1040 1990 2930 5302 21215 22625 23011 29288 |
| 64 | 125 241 819 2245 3199 8415 21133 26786 27226 38838 |
| 65 | 45 476 1075 7393 15141 20414 31244 33336 35004 38391 |
| 66 | 432 578 667 1343 10466 11314 11507 23314 27720 34465 |
| 67 | 248 291 556 1971 3989 8992 18000 19998 23932 34652 |
| 68 | 68 694 837 2246 7472 7873 11078 12868 20937 35591 |
| 69 | 272 924 949 2030 4360 6203 9737 19705 19902 38039 |
| 70 | 21 314 979 2311 2632 4109 19527 21920 31413 34277 |
| 71 | 197 253 804 1249 4315 10021 14358 20559 27099 30525 |
| 72 | 9802 16164 17499 22378 22403 22704 26742 29908 |
| 73 | 9064 10904 12305 14057 16156 26000 32613 34536 |
| 74 | 5178 6319 10239 19343 25628 30577 31110 32291 |

In another example, when the length N of the LDPC codeword is 16200 and the code rate is 7/15, the indexes of rows where 1 is located in the $0^{th}$ column of the ith column group in the matrix A and the matrix C are defined as shown in Table 30 presented below:

TABLE 30

| i | Indexes of rows where 1 is located in the 0th column of the ith column group |
|---|---|
| 0 | 56 330 835 1133 1731 2171 5077 7762 |
| 1 | 21 259 845 1827 2503 3258 7361 7490 |
| 2 | 105 779 1069 1366 7074 7251 7294 7514 |
| 3 | 16 558 923 2455 4076 6294 7507 8475 |
| 4 | 37 197 384 2184 2223 6347 6525 7258 |
| 5 | 197 393 844 1961 3881 5842 6368 8032 |
| 6 | 374 588 1069 3093 4484 5868 7320 |
| 7 | 243 767 790 1603 1867 4804 7416 |
| 8 | 0 242 730 2141 4235 4642 5063 |
| 9 | 148 327 431 2291 3847 5133 7977 |
| 10 | 110 864 925 2730 4227 6604 7219 |
| 11 | 571 746 867 1384 3974 5944 6713 |
| 12 | 268 347 948 1515 3629 5598 7538 |
| 13 | 876 904 1049 4249 5198 6938 7701 |
| 14 | 690 748 782 1304 2117 4528 4589 |
| 15 | 14 300 703 2968 4571 6102 7754 |
| 16 | 832 998 1071 2591 3865 4812 6321 |
| 17 | 458 903 976 5179 5520 6862 8068 |
| 18 | 155 358 984 1417 1602 2697 3044 |
| 19 | 312 701 784 1636 2183 3501 5170 |
| 20 | 85 981 989 2893 2951 4457 4685 |
| 21 | 5091 5244 5293 5404 6009 |
| 22 | 2171 2203 2344 3255 6338 |
| 23 | 3072 4338 6965 7045 8061 |

In another example, when the length N of the LDPC codeword is 64800 and the code rate is 7/15, the indexes of rows where 1 is located in the $0^{th}$ column of the ith column group in the matrix A and the matrix C are defined as shown in Table 31 presented below:

TABLE 31

| i | Indexes of rows where 1 is located in the 0th column of the ith column group |
|---|---|
| 0 | 460 792 1007 4580 11452 13130 26882 27020 32439 |
| 1 | 35 472 1056 7154 12700 13326 13414 16828 19102 |
| 2 | 45 440 772 4854 7863 26945 27684 28651 31875 |

TABLE 31-continued

| i | Indexes of rows where 1 is located in the 0th column of the ith column group |
|---|---|
| 3 | 744 812 892 1509 9018 12925 14140 21357 25106 |
| 4 | 271 474 761 4268 6706 9609 19701 19707 24870 |
| 5 | 223 477 662 1987 9247 18376 22148 24948 27694 |
| 6 | 44 379 786 8823 12322 14666 16377 28688 29924 |
| 7 | 104 219 562 5832 19665 20615 21043 22759 32180 |
| 8 | 41 43 870 7963 13718 14136 17216 30470 33428 |
| 9 | 592 744 887 4513 6192 18116 19482 25032 34095 |
| 10 | 456 821 1078 7162 7443 8774 15567 17243 33085 |
| 11 | 151 666 977 6946 10358 11172 18129 19777 32234 |
| 12 | 236 793 870 2001 6805 9047 13877 30131 34252 |
| 13 | 297 698 772 3449 4204 11608 22950 26071 27512 |
| 14 | 202 428 474 3205 3726 6223 7708 20214 25283 |
| 15 | 139 719 915 1447 2938 11864 15932 21748 28598 |
| 16 | 135 853 902 3239 18590 20579 30578 33374 34045 |
| 17 | 9 13 971 11834 13642 17628 21669 24741 30965 |
| 18 | 344 531 730 1880 16895 17587 21901 28620 31957 |
| 19 | 7 192 380 3168 3729 5518 6827 20372 34168 |
| 20 | 28 521 681 4313 7465 14209 21501 23364 25980 |
| 21 | 269 393 898 3561 11066 11985 17311 26127 30309 |
| 22 | 42 82 707 4880 4890 9818 23340 25959 31695 |
| 23 | 189 262 707 6573 14082 22259 24230 24390 24664 |
| 24 | 383 565 573 5498 13449 13990 16904 22629 34203 |
| 25 | 585 596 820 2440 2488 21956 28261 23703 29591 |
| 26 | 755 763 795 5636 16433 21714 23452 31150 34545 |
| 27 | 23 343 669 1159 3507 13096 17978 24241 34321 |
| 28 | 316 384 944 4872 8491 18913 21085 23198 24798 |
| 29 | 64 314 765 3706 7136 8634 14227 17127 23437 |
| 30 | 220 693 899 8791 12417 13487 18335 22126 27428 |
| 31 | 285 794 1045 8624 8801 9547 19167 21894 32657 |
| 32 | 386 621 1045 1634 1882 3172 13686 16027 22448 |
| 33 | 95 622 693 2827 7098 11452 14112 18831 31308 |
| 34 | 446 813 928 7976 8935 13146 27117 27766 33111 |
| 35 | 89 138 241 3218 9283 20458 31484 31538 34216 |
| 36 | 277 420 704 9281 12576 12788 14496 15357 20585 |
| 37 | 141 643 758 4894 10264 15144 16357 22478 26461 |
| 38 | 17 108 160 13183 15424 17939 19276 23714 26655 |
| 39 | 109 285 608 1682 20223 21791 24615 29622 31983 |
| 40 | 123 515 622 7037 13946 15292 15606 16262 23742 |
| 41 | 264 565 923 6460 13622 13934 23181 25475 26134 |
| 42 | 202 548 789 8003 10993 12478 16051 25114 27579 |
| 43 | 121 450 575 5972 10062 18693 21852 23874 28031 |
| 44 | 507 560 889 12064 13316 19629 21547 25461 28732 |
| 45 | 664 786 1043 9137 9294 10163 23389 31436 34297 |
| 46 | 45 830 907 10730 16541 21232 30354 30605 31847 |
| 47 | 203 507 1060 6971 12216 13321 17861 22671 29825 |
| 48 | 369 881 952 3035 12279 12775 17682 17805 34281 |
| 49 | 683 709 1032 3787 17623 24138 26775 31432 33626 |
| 50 | 524 732 1042 12249 14765 18601 25811 32422 33163 |
| 51 | 137 639 688 7182 8169 10443 22530 24597 29039 |
| 52 | 159 643 749 16386 17401 24135 28429 33468 33469 |
| 53 | 107 481 555 7322 13234 19344 23498 26581 31378 |
| 54 | 249 389 523 3421 10150 17616 19085 20545 32069 |
| 55 | 395 738 1045 2415 3005 3820 19541 23543 31068 |
| 56 | 27 293 703 1717 3460 8326 8501 10290 32625 |
| 57 | 126 247 515 6031 9549 10643 22067 29490 34450 |
| 58 | 331 471 1007 3020 3922 7580 23358 28620 30946 |
| 59 | 222 542 1021 3291 3652 13130 16349 33009 34348 |
| 60 | 532 719 1038 5891 7528 23252 25472 31395 31774 |
| 61 | 145 398 774 7816 13887 14936 23708 31712 33160 |
| 62 | 88 536 600 1239 1887 12195 13782 16726 27998 |
| 63 | 151 269 585 1445 3178 3970 15568 20358 21051 |
| 64 | 650 819 865 15567 18546 25571 32038 33350 33620 |
| 65 | 93 469 800 6059 10405 12296 17515 21354 22231 |
| 66 | 97 206 951 6161 16376 27022 29192 30190 30665 |
| 67 | 412 549 986 5833 10583 10766 24946 28878 31937 |
| 68 | 72 604 659 5267 12227 21714 32120 33472 33974 |
| 69 | 25 902 912 1137 2975 9642 11598 25919 28278 |
| 70 | 420 976 1055 8473 11512 20198 21662 25443 30119 |
| 71 | 1 24 932 6426 11899 13217 13935 16548 29737 |
| 72 | 53 618 988 6280 7267 11676 13575 15532 25787 |
| 73 | 111 739 809 8133 12717 12741 20253 20608 27850 |
| 74 | 120 683 943 14496 15162 15440 18660 27543 32404 |
| 75 | 600 754 1055 7873 9679 17351 27268 33508 |
| 76 | 344 755 1054 7102 7193 22903 24720 27883 |
| 77 | 582 1003 1046 11344 23756 27497 27977 32853 |
| 78 | 28 429 509 11106 11767 12729 13100 31792 |
| 79 | 131 555 907 5113 10259 10300 20580 23029 |

TABLE 31-continued

| i | Indexes of rows where 1 is located in the 0th column of the ith column group |
|---|---|
| 80 | 406 915 977 12244 20259 26616 27899 32228 |
| 81 | 46 195 224 1229 4116 10263 13608 17830 |
| 82 | 19 819 953 7965 9998 13959 30580 30754 |
| 83 | 164 1003 1032 12920 15975 16582 22624 27357 |
| 84 | 8433 11894 13531 17675 25889 31384 |
| 85 | 3166 3813 8596 10368 25104 29584 |
| 86 | 2466 8241 12424 13376 24837 32711 |

Hereinafter, positions of rows where 1 exists in the matrix A and the matrix C will be explained with reference to Table 24 by way of an example.

Since the length N of the LDPC codeword is 16200 and the code rate is 4/15 in Table 24, $M_1=1080$, $M_2=10800$, $Q_1=3$, and $Q_2=30$ in the parity check matrix 400 defined by Table 24 with reference to Table 22.

Herein, $Q_1$ is a size by which columns of the same column group are cyclic-shifted in the matrix A, and $Q_2$ is a size by which columns of the same column group are cyclic-shifted in the matrix C.

In addition, $Q_1=M_1/L$, $Q_2=M_2/L$, $M_1=g$, and $M_2=N-K-g$, and L is an interval at which a pattern of a column is repeated in the matrix A and the matrix C, and for example, may be 360.

The index of the row where 1 is located in the matrix A and the matrix C may be determined based on the $M_1$ value.

For example, since $M_1=1080$ in the case of Table 24, the positions of the rows where 1 exists in the $0^{th}$ column of the ith column group in the matrix A may be determined based on values smaller than 1080 from among the index values of Table 24, and the positions of the rows where 1 exists in the $0^{th}$ column of the ith column group in the matrix C may be determined based on values greater than or equal to 1080 from among the index values of Table 24.

Specifically, in Table 24, the sequence corresponding to the $0^{th}$ column group is "19, 585, 710, 3241, 3276, 3648, 6345, 9224, 9890, and 10841". Accordingly, in the case of the $0^{th}$ column of the $0^{th}$ column group of the matrix A, 1 may be located in the $19^{th}$ row, $585^{th}$ row, and $710^{th}$ row, and, in the case of the $0^{th}$ column of the $0^{th}$ column group of the matrix C, 1 may be located in the $3241^{st}$ row, $3276^{th}$ row, $3648^{th}$ row, $6345^{th}$ row, $9224^{th}$ row, $9890^{th}$ row, and $10841^{st}$ row.

Once positions of 1 in the $0^{th}$ column of each column group of the matrix A are defined, positions of rows where 1 exists in another column of each column group may be defined by cyclic-shifting from the previous column by $Q_1$. Once positions of 1 in the $0^{th}$ column of each column group of the matrix C are defined, position of rows where 1 exists in another column of each column group may be defined by cyclic-shifting from the previous column by $Q_2$.

In the above-described example, in the case of the $0^{th}$ column of the $0^{th}$ column group of the matrix A, 1 exists in the $19^{th}$ row, $585^{th}$ row, and $710^{th}$ row. In this case, since $Q_1=3$, the indexes of rows where 1 exists in the $1^{st}$ column of the $0^{th}$ column group are 22(=19+3), 588(=585+3), and 713(=710+3), and the index of rows where 1 exists in the $2^{nd}$ column of the $0^{th}$ column group are 25(=22+3), 591 (=588+3), and 716(=713+3).

In the case of the $0^{th}$ column of the $0^{th}$ column group of the matrix C, 1 exists in the $3241^{st}$ row, $3276^{th}$ row, $3648^{th}$ row, $6345^{th}$ row, $9224^{th}$ row, $9890^{th}$ row, and $10841^{st}$ row. In this case, since $Q_2=30$, the index of rows where 1 exists in the $1^{st}$ column of the $0^{th}$ column group are 3271 (=3241+30), 3306(=3276+30), 3678 (=3648+30), 6375 (=6345+30), 9254 (=9224+30), 9920 (=9890+30), and 10871 (=10841+30), and the indexes of rows where 1 exists in the $2^{nd}$ column of the $0^{th}$ column group are 3301 (=3271+30), 3336(=3306+30), 3708 (=3678+30), 6405 (=6375+30), 9284 (=9254+30), 9950 (=9920+30), 10901 (=10871+30).

In this method, the positions of rows where 1 exists in all column groups of the matrix A and the matrix C are defined.

The matrix B may have a dual diagonal configuration, the matrix D may have a diagonal configuration (that is, the matrix D is an identity matrix), and the matrix Z may be a zero matrix.

As a result, the parity check matrix 400 shown in FIG. 4 may be defined by the matrices A, B, C, D, and Z having the above-described configurations.

Hereinafter, a method for performing LDPC encoding based on the parity check matrix 400 shown in FIG. 4 will be explained. An LDPC encoding process when the parity check matrix 400 is defined as shown in Table 24 by way of an example will be explained for the convenience of explanation.

For example, when an information word block $S=(s_0, s_1, \ldots, s_{K-1})$ is LDPC-encoded, an LDPC codeword $\Lambda=(\lambda_0, \lambda_1, \ldots, \lambda_{N-1})=(s_0, s_1, \ldots, s_{K-1}, p_0, p_1, \ldots, p_{M_1+M_2-1})$ including a parity bit $P=(p_0, p_1, \ldots, P_{M_1+M_2-1})$.

$M_1$ and $M_2$ indicate the size of the matrix B having the dual diagonal configuration and the size of the matrix C having the diagonal configuration, respectively, and $M_1=g$, $M_2=N-K-g$.

A process of calculating a parity bit is as follows. In the following explanation, the parity check matrix 400 is defined as shown in Table 24 by way of an example, for the convenience of explanation.

Step 1) $\lambda$ and p are initialized as $\lambda_i=s_i$ (i=0, 1, ..., K−1), $p_j=0$ (j=0, 1, ..., $M_1+M_2-1$).

Step 2) The $0^{th}$ information word bit $\lambda_0$ is accumulated in the address of the parity bit defined in the first row (that is, the row of i=0) of Table 24. This may be expressed by Equation 12 presented below:

$$P_{19}=P_{19}\oplus\lambda_0 \; P_{5345}=P_{5345}\oplus\lambda_0$$

$$P_{719}=P_{719}\oplus\lambda_0 \; P_{2873}=P_{2873}\oplus\lambda_0$$

$$P_{585}=P_{585}\oplus\lambda_0 \; P_{9224}=P_{9224}\oplus\lambda_0$$

$$P_{710}=P_{710}\oplus\lambda_0 \; P_{9890}=P_{9890}\oplus\lambda_0$$

$$P_{3241}=P_{3241}\oplus\lambda_0 \; P_{10841}=P_{10841}\oplus\lambda_0$$

$$P_{3276}=P_{3276}\oplus\lambda_0$$

$$P_{3648}=P_{3648}\oplus\lambda_0 \quad (12)$$

Step 3) Regarding the next L−1 number of information word bits $\lambda_m$ (m=1, 2, ..., L−1), $\lambda_m$ is accumulated in the parity bit address calculated based on Equation 13 presented below:

$$(\chi+m\times Q_1)\bmod M_1 (\text{if } \chi<M_1)$$

$$M_1+\{(\chi-M_1+m\times Q_2)\bmod M_2\}(\text{if } \chi\geq M_1) \quad (13)$$

Herein, x is an address of a parity bit accumulator corresponding to the $0^{th}$ information word bit $\lambda_0$.

In addition, $Q_1=M_1/L$ and $Q_2=M_2/L$. In addition, since the length N of the LDPC codeword is 16200 and the code rate is 4/15 in Table 24, $M_1=1080$, $M_2=10080$, $Q_1=3$, $Q_2=30$, and $L=360$ with reference to Table 22.

Accordingly, an operation as shown in Equation 14 presented below may be performed for the 1$^{st}$ information word bit $\lambda_1$:

$$P_{22}=P_{22}\oplus\lambda_1\ P_{6375}=P_{6375}\oplus\lambda_1$$

$$P_{588}=P_{588}\oplus\lambda_1\ P_{9254}=P_{9254}\oplus\lambda_1$$

$$P_{713}=P_{713}\oplus\lambda_1\ P_{9920}=P_{9920}\oplus\lambda_1$$

$$P_{3271}=P_{3271}\oplus\lambda_1\ P_{10871}=P_{10871}\oplus\lambda_1$$

$$P_{3306}=P_{3306}\oplus\lambda_1$$

$$P_{3678}=P_{3678}\oplus\lambda_0 \quad (12)$$

Step 4) Since the same address of the parity bit as in the second row (that is the row of i=1) of Table 24 is given to the Lth information word bit $\lambda_L$, in a similar method to the above-described method, the address of the parity bit regarding the next L−1 number of information word bits $\lambda_m$ (m=L+1, L+2, . . . , 2L−1) is calculated based on Equation 13. In this case, x is the address of the parity bit accumulator corresponding to the information word bit $\lambda_L$, and may be obtained based on the second row of Table 24.

Step 5) The above-described processes are repeated for L number of new information word bits of each group by considering new rows of Table 24 as the address of the parity bit accumulator.

Step 6) After the above-described processes are repeated for the codeword bits $\lambda_0$ to $\lambda_{K-1}$, values regarding Equation 15 presented below are calculated in sequence from i=1:

$$P_i=P_i\oplus P_{i-1}(i=1,2,\ldots,M_1-1) \quad (15)$$

Step 7) Parity bits $\lambda_K$ to $\lambda_{K+M_1-1}$ corresponding to the matrix B having the dual diagonal configuration are calculated based on Equation 16 presented below:

$$\lambda_{K+L\times t+s}=P_{Q_1\times S+t}(0\leq s<L, 0\leq t<Q_1) \quad (16)$$

Step 8) The address of the parity bit accumulator regarding L number of new codeword bits $\lambda_K$ to $\lambda_{K+M_1-1}$ of each group is calculated based on Table 24 and Equation 13.

Step 9) After the codeword bits $\lambda_K$ to $\lambda_{K+M_1-1}$ are calculated, parity bits $\lambda_{K+M_1}$ to $\lambda_{K+M_1+M_2-1}$ corresponding to the matrix C having the diagonal configuration are calculated based on Equation 17 presented below:

$$\lambda_{K+M_1+L\times t+s}=p_{M_1+Q_2\times S+t}(0\leq s<L, 0\leq t<Q_2) \quad (17)$$

As a result, the parity bits may be calculated in the above-described method.

Referring back to FIG. 1, the encoder 110 may perform the LDPC encoding by using various code rates such as 3/15, 4/15, 5/15, 6/15, 7/15, 8/15, 9/15, 10/15, 11/15, 12/15, 13/15, etc. In addition, the encoder 110 may generate an LDPC codeword having various lengths such as 16200, 64800, etc., based on the length of the information word bits and the code rate.

In this case, the encoder 110 may perform the LDPC encoding by using the parity check matrix, and the parity check matrix is configured as shown in FIGS. 2 to 4.

In addition, the encoder 110 may perform Bose, Chaudhuri, Hocquenghem (BCH) encoding as well as LDPC encoding. To achieve this, the encoder 110 may further include a BCH encoder (not shown) to perform BCH encoding.

In this case, the encoder 110 may perform encoding in an order of BCH encoding and LDPC encoding. Specifically, the encoder 110 may add BCH parity bits to input bits by performing BCH encoding and LDPC-encodes the information word bits including the input bits and the BCH parity bits, thereby generating the LDPC codeword.

The interleaver 120 interleaves the LDPC codeword. That is, the interleaver 120 receives the LDPC codeword from the encoder 110, and interleaves the LDPC codeword based on various interleaving rules.

In particular, the interleaver 120 may interleave the LDPC codeword such that a bit included in a predetermined bit group from among a plurality of bit groups constituting the LDPC codeword (that is, a plurality of groups or a plurality of blocks) is mapped onto a predetermined bit of a modulation symbol.

In this case, the interleaver 120 may interleave the LDPC codeword such that bits included in continuous bit groups from among the plurality of bit groups of the LDPC codeword are mapped onto the same modulation symbol.

In addition, when check nodes connected only to a single parity bit in the parity check matrix of the LDPC code exists in plurality number, the interleaver 120 may interleave the LDPC codeword such that bits included in the bit groups corresponding to the parity bit to which the check nodes are connected are selectively mapped onto the modulation symbol.

Accordingly, the modulator 130 may map the bit included in the predetermined bit group from among the plurality of bit groups of the LDPC codeword onto a predetermined bit of the modulation symbol.

That is, the modulator 130 may map the bits included in the continuous bit groups from among the plurality of bit groups of the LDPC codeword onto the same modulation symbol. In addition, when the check nodes connected only to a single parity bit in the parity check matrix of the LDPC code exists in plurality number, the modulator 130 may selectively map the bits included in the bit groups corresponding to the parity bit to which the check nodes are connected onto the same modulation symbol.

Figure 5:
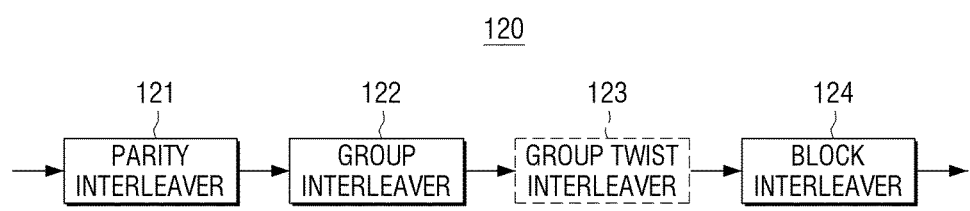
FIG. 5 is a block diagram to illustrate a configuration of an interleaver according to an exemplary embodiment.

To achieve this, as shown in FIG. 5, the interleaver 120 may include a parity interleaver 121, a group interleaver (or a group-wise interleaver 122), a group twist interleaver 123 and a block interleaver 124.

The parity interleaver 121 interleaves the parity bits constituting the LDPC codeword.

Specifically, when the LDPC codeword is generated based on the parity check matrix 200 having the configuration of FIG. 2, the parity interleaver 121 may interleave only the parity bits of the LDPC codeword by using Equations 18 presented below:

$$u_i=c_i \text{ for } 0\leq i<K_{ldpc}, \text{ and}$$

$$u_{K_{ldpc}+M-t+s}=c_{K_{ldpc}+Q_{ldpc}-s+t} \text{ for } 0\leq s<M, 0\leq t<Q_{ldpc} \quad (18),$$

where M is an interval at which a pattern of a column group is repeated in the information word submatrix 210, that is, the number of columns included in a column group (for example, M=360), and $Q_{ldpc}$ is a size by which each column is cyclic-shifted in the information word submatrix 210. That is, the parity interleaver 121 performs parity interleaving with respect to the LDPC codeword $c=(c_0, c_1, \ldots, c_{N_{ldpc}-1})$, and outputs $U=(u_0, u_1, \ldots, u_{N_{ldpc}-1})$.

The LDPC codeword parity-interleaved in the above-described method may be configured such that a predetermined number of continuous bits of the LDPC codeword have similar decoding characteristics (cycle distribution, a degree of a column, etc.).

For example, the LDPC codeword may have the same characteristics on the basis of M number of continuous bits. Herein, M is an interval at which a pattern of a column group is repeated in the information word submatrix 210 and, for example, may be 360.

Specifically, a product of the LDPC codeword bits and the parity check matrix should be "0". This means that a sum of products of the $i^{th}$ LDPC codeword bit, $c_i$ (i=0, 1, . . . , $N_{ldpc}$−1) and the $i^{th}$ column of the parity check matrix should be a "0" vector. Accordingly, the $i^{th}$ LDPC codeword bit may be regarded as corresponding to the $i^{th}$ column of the parity check matrix.

In the case of the parity check matrix 200 of FIG. 2, M number of columns in the information word submatrix 210 belong to the same group and the information word submatrix 210 has the same characteristics on the basis of a column group (for example, the columns belonging to the same column group have the same degree distribution and the same cycle characteristic).

In this case, since M number of continuous bits in the information word bits correspond to the same column group of the information word submatrix 210, the information word bits may be formed of M number of continuous bits having the same codeword characteristics. When the parity bits of the LDPC codeword are interleaved by the parity interleaver 121, the parity bits of the LDPC codeword may be formed of M number of continuous bits having the same codeword characteristics.

However, regarding the LDPC codeword encoded based on the parity check matrix 300 of FIG. 3 and the parity check matrix 400 of FIG. 4, parity interleaving may not be performed. In this case, the parity interleaver 121 may be omitted.

The group interleaver 122 may divide the parity-interleaved LDPC codeword into a plurality of bit groups and rearrange the order of the plurality of bit groups in bit group wise (or bit group unit). That is, the group interleaver 122 may interleave the plurality of bit groups in bit group wise.

According to an exemplary embodiment, when the parity interleaver 121 is omitted, the group interleaver 122 may divide the LDPC codeword into a plurality of bit groups and rearrange the order of the plurality of bit groups in bit group wise.

To achieve this, the group interleaver 122 divides the parity-interleaved LDPC codeword into a plurality of bit groups by using Equation 19 or Equation 20 presented below.

$$X_j = \left\{ u_k \mid j = \left\lfloor \frac{k}{360} \right\rfloor, 0 \leq k < N_{ldpc} \right\} \text{ for } 0 \leq j < N_{group} \quad (19)$$

$$X_j = \{u_k \mid 360 \times j \leq k < 360 \times (j+1), 0 \leq k < N_{ldpc}\} \text{ for } 0 \leq j < N_{group}, \quad (20)$$

where $N_{group}$ is the total number of bit groups, $X_j$ is the $j^{th}$ bit group, and $u_k$ is the $k^{th}$ LDPC codeword bit input to the group interleaver 122. In addition, $$\left\lfloor \frac{k}{360} \right\rfloor$$

is the largest integer below k/360.

Since 360 in these equations indicates an example of the interval M at which the pattern of a column group is repeated in the information word submatrix, 360 in these equations can be changed to M.

Figure 6:
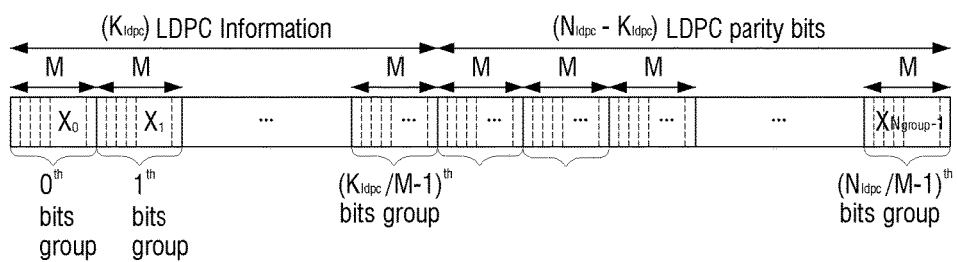
FIGS. 6 to 8 illustrate an interleaving method according to exemplary embodiments.

The LDPC codeword which is divided into the plurality of bit groups may be as shown in FIG. 6.

Referring to FIG. 6, the LDPC codeword is divided into the plurality of bit groups and each bit group is formed of M number of continuous bits. When M is 360, each of the plurality of bit groups may be formed of 360 bits. Accordingly, the bit groups may be formed of bits corresponding to the column groups of the parity check matrix.

Specifically, since the LDPC codeword is divided by M number of continuous bits, $K_{ldpc}$ number of information word bits are divided into ($K_{ldpc}$/M) number of bit groups and $N_{ldpc}-K_{ldpc}$ number of parity bits are divided into ($N_{ldpc}-K_{ldpc}$)/M number of bit groups. Accordingly, the LDPC codeword may be divided into ($N_{ldpc}$/M) number of bit groups in total.

For example, when M=360 and the length $N_{ldpc}$ of the LDPC codeword is 64800, the number of bit groups $N_{groups}$ is 180(=64800/360), and, when the M=360 and the length $N_{ldpc}$ of the LDPC codeword is 16200, the number of bit groups $N_{group}$ is 45(=16200/360).

As described above, the group interleaver 122 divides the LDPC codeword such that M number of continuous bits are included in a same group since the LDPC codeword has the same codeword characteristics on the basis of M number of continuous bits. Accordingly, when the LDPC codeword is grouped by M number of continuous bits, the bits having the same codeword characteristics belong to the same group.

In the above-described example, the number of bits constituting each bit group is M. However, this is merely an example and the number of bits constituting each bit group is variable.

For example, the number of bits constituting each bit group may be an aliquot part of M. That is, the number of bits constituting each bit group may be an aliquot part of the number of columns constituting a column group of the information word submatrix of the parity check matrix. In this case, each bit group may be formed of aliquot part of M number of bits. For example, when the number of columns constituting a column group of the information word submatrix is 360, that is, M=360, the group interleaver 122 may divide the LDPC codeword into a plurality of bit groups such that the number of bits constituting each bit group is one of the aliquot parts of 360.

In the following explanation, the number of bits constituting a bit group is M by way of an example, for the convenience of explanation.

Thereafter, the group interleaver 122 interleaves the LDPC codeword in bit group wise. Specifically, the group interleaver 122 may group the LDPC codeword into the plurality of bit groups and rearrange the plurality of bit groups in bit group wise. That is, the group interleaver 122 changes positions of the plurality of bit groups constituting the LDPC codeword and rearranges the order of the plurality of bit groups constituting the LDPC codeword in bit group wise.

Herein, the group interleaver 122 may rearrange the order of the plurality of bit groups in bit group wise such that bit groups including bits mapped onto the same modulation symbol from among the plurality of bit groups are spaced apart from one another at predetermined intervals.

In this case, the group interleaver 122 may rearrange the order of the plurality of bit groups in bit group wise by considering at least one of the number of rows and columns of the block interleaver 124, the number of bit groups of the LDPC codeword, and the number of bits included in each bit group, such that bit groups including bits mapped onto the same modulation symbol are spaced apart from one another at predetermined intervals.

To achieve this, the group interleaver 122 may rearrange the order of the plurality of bit groups in bit group wise by using Equation 21 presented below:

$$Y_j = X_{\pi(j)} (0 \leq j < N_{group}) \quad (21),$$

where $X_j$ is the $j^{th}$ bit group before group interleaving, and $Y_j$ is the $j^{th}$ bit group after group interleaving. In addition, $\pi(j)$ is a parameter indicating an interleaving order and is determined by at least one of a length of an LDPC codeword, a modulation method, and a code rate. That is, $\pi(j)$ denotes a permutation order for group wise interleaving.

Accordingly, $X_{\pi(j)}$ is a $\pi(j)^{th}$ bit group before group interleaving, and Equation 21 means that the pre-interleaving $\pi(j)^{th}$ bit group is interleaved into the $j^{th}$ bit group.

According to an exemplary embodiment, an example of $\pi(j)$ may be defined as in Tables 32 to 56 presented below.

In this case, $\pi(j)$ is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in bit group wise based on $\pi(j)$ satisfying the corresponding length of the LDPC codeword and code rate.

For example, when the encoder 110 performs LDPC encoding at a code rate of 7/15 to generate an LDPC codeword of a length of 16200, the group interleaver 122 may perform interleaving by using $\pi(j)$ which is defined according to the length of the LDPC codeword of 16200 and the code rate of 7/15 in Tables 32 to 56 presented below.

For example, when the length $N_{ldpc}$ of the LDPC codeword is 16200, the code rate is 5/15, and the modulation method (or modulation format) is Quadrature Phase Shift Keying (QPSK), $\pi(j)$ may be defined as in Table 32 presented below. In particular, Table 32 may be applied when LDPC encoding is performed based on the parity check matrix defined by Table 26.

TABLE 32

| | Order of bits group to be block interleaved $\pi(j)$ (0 ≤ j < 45) | | | | | | | | | | | | | | | | | | | | | | |
|---|---|---|---|---|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 35 | 7 | 29 | 11 | 14 | 32 | 38 | 28 | 20 | 17 | 25 | 39 | 19 | 4 | 1 | 12 | 10 | 30 | 0 | 44 | 43 | 2 | 21 |
| | 5 | 13 | 34 | 37 | 23 | 15 | 36 | 18 | 42 | 16 | 33 | 31 | 27 | 22 | 3 | 6 | 40 | 24 | 41 | 9 | 26 | 8 | |

In the case of Table 32, Equation 21 may be expressed as $Y_0 = X_{\pi(0)} = X_{35}$, $Y_1 = X_{\pi(1)} = X_7$, $Y_2 = X_{\pi(2)} = X_{29}$, ..., $Y_{43} = X_{\pi(43)} = X_{26}$, and $Y_{44} = X_{\pi(44)} = X_8$. Accordingly, the group interleaver 122 may rearrange the order of the plurality of bit groups in bit group wise by changing the $35^{th}$ bit group to the $0^{th}$ bit group, the $7^{th}$ bit group to the $1^{st}$ bit group, the $29^{th}$ bit group to the $2^{nd}$ bit group, ..., the $26^{th}$ bit group to the $43^{rd}$ bit group, and the $8^{th}$ bit group to the $44^{th}$ bit group.

In another example, when the length $N_{ldpc}$ of the LDPC codeword is 16200, the code rate is 7/15, and the modulation method is QPSK, $\pi(j)$ may be defined as in Table 33 presented below. In particular, Table 33 may be applied when LDPC encoding is performed based on the parity check matrix defined by Table 6.

TABLE 33

| | Order of bits group to be block interleaved $\pi(j)$ (0 ≤ j < 45) | | | | | | | | | | | | | | | | | | | | | | |
|---|---|---|---|---|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 4 | 22 | 23 | 44 | 34 | 1 | 3 | 2 | 32 | 42 | 6 | 15 | 30 | 40 | 18 | 5 | 28 | 38 | 7 | 14 | 26 | 36 | 9 |
| | 0 | 16 | 43 | 33 | 17 | 11 | 12 | 31 | 41 | 21 | 20 | 29 | 39 | 10 | 24 | 27 | 37 | 13 | 19 | 25 | 35 | 8 | |

In the case of Table 33, Equation 21 may be expressed as $Y_0 = X_{\pi(0)} = X_4$, $Y_1 = X_{\pi(1)} = X_{22}$, $Y_2 = X_{\pi(2)} = X_{23}$, ..., $Y_{43} = X_{\pi(43)} = X_{35}$, and $Y_{44} = X_{\pi(44)} = X_8$. Accordingly, the group interleaver 122 may rearrange the order of the plurality of bit groups in bit group wise by changing the $4^{th}$ bit group to the $0^{th}$ bit group, the $22^{nd}$ bit group to the $1^{st}$ bit group, the $23^{rd}$ bit group to the $2^{nd}$ bit group, ..., the $35^{th}$ bit group to the $43^{rd}$ bit group, and the $8^{th}$ bit group to the $44^{th}$ bit group.

In another example, when the length $N_{ldpc}$ of the LDPC codeword is 16200, the code rate is 9/15, and the modulation method is QPSK, $\pi(j)$ may be defined as in Table 34 presented below. In particular, Table 34 may be applied when LDPC encoding is performed based on the parity check matrix defined by Table 8.

TABLE 34

Order of bits group to be block interleaved
$\pi(j)$ $(0 \le j < 45)$

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 28 | 16 | 13 | 42 | 32 | 22 | 14 | 20 | 36 | 26 | 6 | 4 | 40 | 30 | 8 | 9 | 44 | 34 | 24 | 10 | 17 | 38 | 27 |
| | 12 | 19 | 41 | 31 | 21 | 1 | 15 | 35 | 25 | 2 | 0 | 39 | 29 | 3 | 5 | 43 | 33 | 23 | 7 | 11 | 37 | 18 | |

In the case of Table 34, Equation 21 may be expressed as $Y_0 = X_{\pi(0)} = X_{28}$, $Y_1 = X_{\pi(1)} = X_{16}$, $Y_2 = X_{\pi(2)} = X_{13}$, . . . , $Y_{43} = X_{\pi(43)} = X_{37}$, and $Y_{44} = X_{\pi(44)} = X_{18}$. Accordingly, the group interleaver 122 may rearrange the order of the plurality of bit groups in bit group wise by changing the $28^{th}$ bit group to the $0^{th}$ bit group, the $16^{th}$ bit group to the $1^{st}$ bit group, the $13^{th}$ bit group to the $2^{nd}$ bit group, . . . , the $37^{th}$ bit group to the $43^{rd}$ bit group, and the $18^{th}$ bit group to the $44^{th}$ bit group.

In another example, when the length $N_{ldpc}$ of the LDPC codeword is 16200, the code rate is 11/15, and the modulation method is QPSK, $\pi(j)$ may be defined as in Table 35 presented below. In particular, Table 35 may be applied when LDPC encoding is performed based on the parity check matrix defined by Table 10.

TABLE 35

Order of bits group to be block interleaved
$\pi(j)$ $(0 \le j < 45)$

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 1 | 2 | 40 | 14 | 27 | 24 | 36 | 7 | 9 | 11 | 12 | 42 | 18 | 17 | 28 | 38 | 31 | 5 | 32 | 34 | 44 | 23 | 0 |
| | 25 | 39 | 26 | 10 | 29 | 35 | 8 | 15 | 16 | 13 | 41 | 3 | 6 | 4 | 37 | 19 | 22 | 20 | 33 | 43 | 30 | 21 | |

In the case of Table 35, Equation 21 may be expressed as $Y_0 = X_{\pi(0)} = X_1$, $Y_1 = X_{\pi(1)} = X_2$, $Y_2 = X_{\pi(2)} = X_{40}$, . . . , $Y_{43} = X_{\pi(43)} = X_{30}$, and $Y_{44} = X_{\pi(44)} = X_{21}$. Accordingly, the group interleaver 122 may rearrange the order of the plurality of bit groups in bit group wise by changing the $1^{st}$ bit group to the $0^{th}$ bit group, the $2^{nd}$ bit group to the $1^{st}$ bit group, the $40^{th}$ bit group to the $2^{nd}$ bit group, . . . , the $30^{th}$ bit group to the $43^{rd}$ bit group, and the $21^{st}$ bit group to the $44^{th}$ bit group.

In another example, when the length $N_{ldpc}$ of the LDPC codeword is 16200, the code rate is 13/15, and the modulation method is QPSK, $\pi(j)$ may be defined as in Table 36 presented below. In particular, Table 36 may be applied when LDPC encoding is performed based on the parity check matrix defined by Table 12.

TABLE 36

Order of bits group to be block interleaved
$\pi(j)$ $(0 \le j < 45)$

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 26 | 10 | 12 | 38 | 28 | 15 | 0 | 44 | 34 | 24 | 14 | 8 | 40 | 30 | 20 | 13 | 42 | 32 | 22 | 11 | 9 | 36 | 25 |
| | 7 | 5 | 37 | 27 | 4 | 16 | 43 | 33 | 23 | 2 | 18 | 39 | 29 | 19 | 6 | 41 | 31 | 21 | 3 | 17 | 35 | 1 | |

In the case of Table 36, Equation 21 may be expressed as $Y_0=X_{\pi(0)}=X_{26}$, $Y_1=X_{\pi(1)}=X_{10}$, $Y_2=X_{\pi(2)}=X_{12}$, ..., $Y_{43}=X_{\pi(43)}=X_{35}$, and $Y_{44}=X_{\pi(44)}=X_1$. Accordingly, the group interleaver 122 may rearrange the order of the plurality of bit groups in bit group wise by changing the $26^{th}$ bit group to the $0^{th}$ bit group, the $10^{th}$ bit group to the $1^{st}$ bit group, the $12^{th}$ bit group to the $2^{nd}$ bit group, ..., the $35^{th}$ bit group to the $43^{rd}$ bit group, and the $1^{st}$ bit group to the $44^{th}$ bit group.

In another example, when the length $N_{ldpc}$ of the LDPC codeword is 16200, the code rate is 5/15, and the modulation method is QPSK, $\pi(j)$ may be defined as in Table 37 presented below. In particular, Table 37 may be applied when LDPC encoding is performed based on the parity check matrix defined by Table 4.

TABLE 37

Order of bits group to be block interleaved
$\pi(j)$ ($0 \le j < 45$)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 5 | 20 | 30 | 40 | 12 | 18 | 28 | 38 | 1 | 7 | 24 | 34 | 44 | 2 | 22 | 32 | 42 | 10 | 8 | 26 | 36 | 14 | 13 |
| | 19 | 29 | 39 | 9 | 17 | 27 | 37 | 15 | 3 | 23 | 33 | 43 | 16 | 21 | 31 | 41 | 0 | 4 | 25 | 35 | 11 | 6 | |

In the case of Table 37, Equation 21 may be expressed as $Y_0=X_{\pi(0)}=X_5$, $Y_1=X_{\pi(1)}=X_{20}$, $Y_2=X_{\pi(2)}=X_{30}$, ..., $Y_{43}=X_{\pi(43)}=X_{11}$, and $Y_{44}=X_{\pi(44)}=X_6$. Accordingly, the group interleaver 122 may rearrange the order of the plurality of bit groups in bit group wise by changing the $5^{th}$ bit group to the $0^{th}$ bit group, the $20^{th}$ bit group to the $1^{st}$ bit group, the $30^{th}$ bit group to the $2^{nd}$ bit group, ..., the $11^{th}$ bit group to the $43^{rd}$ bit group, and the $6^{th}$ bit group to the $44^{th}$ bit group.

In another example, when the length $N_{ldpc}$ of the LDPC codeword is 16200, the code rate is 7/15, and the modulation method is QPSK, $\pi(j)$ may be defined as in Table 38 presented below. In particular, Table 38 may be applied when LDPC encoding is performed based on the parity check matrix defined by Table 5.

TABLE 38

Order of bits group to be block interleaved
$\pi(j)$ ($0 \le j < 45$)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 26 | 10 | 12 | 38 | 28 | 15 | 0 | 44 | 34 | 24 | 14 | 8 | 40 | 30 | 20 | 13 | 42 | 32 | 22 | 11 | 9 | 36 | 25 |
| | 7 | 5 | 37 | 27 | 4 | 16 | 43 | 33 | 23 | 2 | 18 | 39 | 29 | 19 | 6 | 41 | 31 | 21 | 3 | 17 | 35 | 1 | |

In the case of Table 38, Equation 21 may be expressed as $Y_0=X_{\pi(0)}=X_{26}$, $Y_1=X_{\pi(1)}=X_{10}$, $Y_2=X_{\pi(2)}=X_{12}$, ..., $Y_{43}=X_{\pi(43)}=X_{35}$, and $Y_{44}=X_{\pi(44)}=X_1$. Accordingly, the group interleaver 122 may rearrange the order of the plurality of bit groups in bit group wise by changing the $26^{th}$ bit group to the $0^{th}$ bit group, the $10^{th}$ bit group to the $1^{st}$ bit group, the $12^{th}$ bit group to the $2^{nd}$ bit group, ..., the $35^{th}$ bit group to the $43^{rd}$ bit group, and the $1^{st}$ bit group to the $44^{th}$ bit group.

In another example, when the length $N_{ldpc}$ of the LDPC codeword is 16200, the code rate is 9/15, and the modulation method is QPSK, $\pi(j)$ may be defined as in Table 39 presented below. In particular, Table 39 may be applied when LDPC encoding is performed based on the parity check matrix defined by Table 7.

TABLE 39

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 4 | 22 | 23 | 44 | 34 | 1 | 3 | 2 | 32 | 42 | 6 | 15 | 30 | 40 | 18 | 5 | 28 | 38 | 7 | 14 | 26 | 36 | 9 |
| | 0 | 16 | 43 | 33 | 17 | 11 | 12 | 31 | 41 | 21 | 20 | 29 | 39 | 10 | 24 | 27 | 37 | 13 | 19 | 25 | 35 | 8 | |

In the case of Table 39, Equation 21 may be expressed as $Y_0 = X_{\pi(0)} = X_4$, $Y_1 = X_{\pi(1)} = X_{22}$, $Y_2 = X_{\pi(2)} = X_{23}$, ..., $Y_{43} = X_{\pi(43)} = X_{35}$, and $Y_{44} = X_{\pi(44)} = X_8$. Accordingly, the group interleaver 122 may rearrange the order of the plurality of bit groups in bit group wise by changing the 4$^{th}$ bit group to the 0$^{th}$ bit group, the 22$^{nd}$ bit group to the 1$^{st}$ bit group, the 23$^{rd}$ bit group to the 2$^{nd}$ bit group, ..., the 35$^{th}$ bit group to the 43$^{rd}$ bit group, and the 8$^{th}$ bit group to the 44$^{th}$ bit group.

In another example, when the length $N_{ldpc}$ of the LDPC codeword is 16200, the code rate is 11/15, and the modulation method is QPSK, $\pi(j)$ may be defined as in Table 40 presented below. In particular, Table 40 may be applied when LDPC encoding is performed based on the parity check matrix defined by Table 9.

TABLE 40

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 4 | 22 | 23 | 44 | 34 | 1 | 3 | 2 | 32 | 42 | 6 | 15 | 30 | 40 | 18 | 5 | 28 | 38 | 7 | 14 | 26 | 36 | 9 |
| | 0 | 16 | 43 | 33 | 17 | 11 | 12 | 31 | 41 | 21 | 20 | 29 | 39 | 10 | 24 | 27 | 37 | 13 | 19 | 25 | 35 | 8 | |

In the case of Table 40, Equation 21 may be expressed as $Y_0 = X_{\pi(0)} = X_4$, $Y_1 = X_{\pi(1)} = X_{22}$, $Y_2 = X_{\pi(2)} = X_{23}$, ..., $Y_{43} = X_{\pi(43)} = X_{35}$, and $Y_{44} = X_{\pi(44)} = X_8$. Accordingly, the group interleaver 122 may rearrange the order of the plurality of bit groups in bit group wise by changing the 4$^{th}$ bit group to the 0$^{th}$ bit group, the 22$^{nd}$ bit group to the 1$^{st}$ bit group, the 23$^{rd}$ bit group to the 2$^{nd}$ bit group, ..., the 35$^{th}$ bit group to the 43$^{rd}$ bit group, and the 8$^{th}$ bit group to the 44$^{th}$ bit group.

In another example, when the length $N_{ldpc}$ of the LDPC codeword is 16200, the code rate is 13/15, and the modulation method is QPSK, $\pi(j)$ may be defined as in Table 41 presented below. In particular, Table 41 may be applied when LDPC encoding is performed based on the parity check matrix defined by Table 11.

TABLE 41

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 6 | 3 | 30 | 40 | 9 | 11 | 28 | 38 | 22 | 7 | 24 | 34 | 44 | 13 | 8 | 32 | 42 | 1 | 12 | 26 | 36 | 0 | 10 |
| | 15 | 29 | 39 | 17 | 19 | 27 | 37 | 2 | 4 | 23 | 33 | 43 | 20 | 21 | 31 | 41 | 14 | 18 | 25 | 35 | 16 | 5 | |

In the case of Table 41, Equation 21 may be expressed as $Y_0=X_{\pi(0)}=X_6$, $Y_1=X_{\pi(1)}=X_3$, $Y_2=X_{\pi(2)}=X_{30}$, ..., $Y_{43}=X_{\pi(43)}=X_{16}$, and $Y_{44}=X_{\pi(44)}=X_5$. Accordingly, the group interleaver 122 may rearrange the order of the plurality of bit groups in bit group wise by changing the 6$^{th}$ bit group to the 0$^{th}$ bit group, the 3$^{rd}$ bit group to the 1$^{st}$ bit group, the 30$^{th}$ bit group to the 2$^{nd}$ bit group, ..., the 16$^{th}$ bit group to the 43$^{rd}$ bit group, and the 5$^{th}$ bit group to the 44$^{th}$ bit group.

In another example, when the length $N_{ldpc}$ of the LDPC codeword is 16200, the code rate is 7/15, and the modulation method is QPSK, $\pi(j)$ may be defined as in Table 42 presented below. In particular, Table 42 may be applied when LDPC encoding is performed based on the parity check matrix defined by Table 6.

TABLE 42

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 3 | 22 | 7 | 18 | 6 | 1 | 4 | 14 | 5 | 15 | 2 | 23 | 26 | 28 | 30 | 32 | 34 | 36 | 10 | 38 | 21 | 44 | 9 |
| | 0 | 33 | 40 | 42 | 17 | 11 | 19 | 24 | 20 | 12 | 16 | 25 | 27 | 29 | 31 | 13 | 35 | 37 | 39 | 41 | 43 | 8 | |

In the case of Table 42, Equation 21 may be expressed as $Y_0=X_{\pi(0)}=X_3$, $Y_1=X_{\pi(1)}=X_{22}$, $Y_2=X_{\pi(2)}=X_7$, ..., $Y_{43}=X_{\pi(43)}=X_{43}$, and $Y_{44}=X_{\pi(44)}=X_8$. Accordingly, the group interleaver 122 may rearrange the order of the plurality of bit groups in bit group wise by changing the 3$^{rd}$ bit group to the 0$^{th}$ bit group, the 22$^{nd}$ bit group to the 1$^{st}$ bit group, the 7$^{th}$ bit group to the 2$^{nd}$ bit group, ..., the 43$^{rd}$ bit group to the 43$^{rd}$ bit group, and the 8$^{th}$ bit group to the 44$^{th}$ bit group.

In another example, when the length $N_{ldpc}$ of the LDPC codeword is 16200, the code rate is 5/15, and the modulation method is QPSK, $\pi(j)$ may be defined as in Table 43 presented below.

TABLE 43

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 28 | 20 | 8 | 39 | 21 | 25 | 22 | 17 | 29 | 38 | 15 | 7 | 43 | 24 | 11 | 35 | 30 | 27 | 14 | 10 | 6 | 9 | 13 |
| | 42 | 40 | 23 | 36 | 31 | 3 | 34 | 1 | 41 | 2 | 18 | 44 | 19 | 0 | 37 | 26 | 12 | 32 | 4 | 33 | 16 | 5 | |

In the case of Table 43, Equation 21 may be expressed as $Y_0=X_{\pi(0)}=X_{28}$, $Y_1=X_{\pi(1)}=X_{20}$, $Y_2=X_{\pi(2)}=X_8$, ..., $Y_{43}=X_{\pi(43)}=X_{16}$, and $Y_{44}=X_{\pi(44)}=X_5$. Accordingly, the group interleaver 122 may rearrange the order of the plurality of bit groups in bit group wise by changing the 28$^{th}$ bit group to the 0$^{th}$ bit group, the 20$^{th}$ bit group to the 1$^{st}$ bit group, the 8$^{th}$ bit group to the 2$^{nd}$ bit group, ..., the 16$^{th}$ bit group to the 43$^{rd}$ bit group, and the 5$^{th}$ bit group to the 44$^{th}$ bit group.

In another example, when the length $N_{ldpc}$ of the LDPC codeword is 16200, the code rate is 6/15, and the modulation method is QPSK, $\pi(j)$ may be defined as in Table 44 presented below.

TABLE 44

Order of bits group to be block interleaved
$\pi(j)$ $(0 \le j < 45)$

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 36 | 2 | 31 | 18 | 13 | 6 | 40 | 43 | 29 | 26 | 22 | 41 | 12 | 25 | 34 | 35 | 30 | 3 | 20 | 27 | 44 | 37 | 39 |
| | 1 | 33 | 24 | 28 | 5 | 42 | 17 | 21 | 15 | 9 | 38 | 32 | 10 | 23 | 7 | 0 | 11 | 19 | 14 | 8 | 4 | 16 | |

In the case of Table 44, Equation 21 may be expressed as $Y_0 = X_{\pi(0)} = X_{36}$, $Y_1 = X_{\pi(1)} = X_2$, $Y_2 = X_{\pi(2)} = X_{31}$, ..., $Y_{43} = X_{\pi(43)} = X_4$, and $Y_{44} = X_{\pi(44)} = X_{16}$. Accordingly, the group interleaver 122 may rearrange the order of the plurality of bit groups in bit group wise by changing the $36^{th}$ bit group to the $0^{th}$ bit group, the $2^{nd}$ bit group to the $1^{st}$ bit group, the $31^{st}$ bit group to the $2^{nd}$ bit group, ..., the $4^{th}$ bit group to the $43^{rd}$ bit group, and the $16^{th}$ bit group to the $44^{th}$ bit group.

In another example, when the length $N_{ldpc}$ of the LDPC codeword is 16200, the code rate is 7/15, and the modulation method is QPSK, $\pi(j)$ may be defined as in Table 45 presented below.

TABLE 45

Order of bits group to be block interleaved
$\pi(j)$ $(0 \le j < 45)$

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 12 | 39 | 21 | 17 | 11 | 0 | 24 | 26 | 16 | 40 | 22 | 5 | 36 | 20 | 41 | 32 | 33 | 19 | 44 | 7 | 15 | 23 | 30 |
| | 43 | 9 | 14 | 4 | 8 | 25 | 6 | 35 | 37 | 13 | 29 | 10 | 1 | 18 | 28 | 38 | 42 | 31 | 3 | 27 | 34 | 2 | |

In the case of Table 45, Equation 21 may be expressed as $Y_0 = X_{\pi(0)} = X_{12}$, $Y_1 = X_{\pi(1)} = X_{39}$, $Y_2 = X_{\pi(2)} = X_{21}$, ..., $Y_{43} = X_{\pi(43)} = X_{34}$, and $Y_{44} = X_{\pi(44)} = X_2$. Accordingly, the group interleaver 122 may rearrange the order of the plurality of bit groups in bit group wise by changing the $12^{th}$ bit group to the $0^{th}$ bit group, the $39^{th}$ bit group to the $1^{st}$ bit group, the $21^{st}$ bit group to the $2^{nd}$ bit group, ..., the $34^{th}$ bit group to the $43^{rd}$ bit group, and the $2^{nd}$ bit group to the $44^{th}$ bit group.

In another example, when the length $N_{ldpc}$ of the LDPC codeword is 16200, the code rate is 9/15, and the modulation method is QPSK, $\pi(j)$ may be defined as in Table 46 presented below.

TABLE 46

Order of bits group to be block interleaved
$\pi(j)$ $(0 \le j < 45)$

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 41 | 37 | 26 | 22 | 32 | 9 | 23 | 21 | 8 | 4 | 25 | 15 | 10 | 17 | 19 | 16 | 2 | 6 | 36 | 3 | 30 | 24 | 1 |
| | 29 | 13 | 5 | 0 | 34 | 27 | 42 | 12 | 33 | 43 | 28 | 35 | 40 | 14 | 44 | 11 | 18 | 7 | 31 | 20 | 39 | 38 | |

In the case of Table 46, Equation 21 may be expressed as $Y_0 = X_{\pi(0)} = X_{41}$, $Y_1 = X_{\pi(1)} = X_{37}$, $Y_2 = X_{\pi(2)} = X_{26}$, ..., $Y_{43} = X_{\pi(43)} = X_{39}$, and $Y_{44} = X_{\pi(44)} = X_{38}$. Accordingly, the group interleaver 122 may rearrange the order of the plurality of bit groups in bit group wise by changing the $41^{st}$ bit group to the $0^{th}$ bit group, the $37^{th}$ bit group to the $1^{st}$ bit group, the $26^{th}$ bit group to the $2^{nd}$ bit group, ..., the $39^{th}$ bit group to the $43^{rd}$ bit group, and the $38^{th}$ bit group to the $44^{th}$ bit group.

In another example, when the length $N_{ldpc}$ of the LDPC codeword is 64800, the code rate is 5/15, and the modulation method is QPSK, $\pi(j)$ may be defined as in Table 47 presented below.

TABLE 47

Order of bits group to be block interleaved
π(j) (0 ≤ j < 180)

| j-th block of Group-wise interleaver output | | | | | | | | | | | | | | | | | | | | | | |
|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| 161 | 162 | 163 | 164 | 165 | 165 | 167 | 168 | 169 | 170 | 171 | 172 | 173 | 174 | 175 | 176 | 177 | 178 | 179 | | | | |

| π(j)-th block of Group-wise interleaver input, | | | | | | | | | | | | | | | | | | | | | | |
|---|---|---|---|---|---|---|---|---|---|---|---|---|---|---|---|---|---|---|---|---|---|---|
| 120 | 75 | 171 | 13 | 147 | 56 | 97 | 134 | 41 | 87 | 160 | 23 | 109 | 2 | 178 | 77 | 62 | 148 | 130 | 50 | 96 | 34 | 18 |
| 115 | 4 | 159 | 81 | 169 | 71 | 136 | 149 | 94 | 39 | 21 | 110 | 121 | 60 | 8 | 174 | 73 | 131 | 142 | 157 | 40 | 24 | 107 |
| 86 | 117 | 3 | 54 | 58 | 175 | 140 | 154 | 164 | 16 | 28 | 100 | 82 | 42 | 119 | 65 | 179 | 143 | 132 | 5 | 17 | 162 | 104 |
| 92 | 52 | 76 | 118 | 176 | 27 | 66 | 38 | 151 | 1 | 138 | 103 | 91 | 128 | 116 | 51 | 26 | 170 | 11 | 36 | 67 | 145 | 79 |
| 98 | 127 | 112 | 155 | 48 | 25 | 173 | 15 | 64 | 137 | 37 | 84 | 126 | 95 | 153 | 74 | 105 | 163 | 7 | 58 | 47 | 31 | 141 |
| 129 | 89 | 19 | 152 | 72 | 105 | 165 | 59 | 6 | 46 | 33 | 133 | 85 | 177 | 146 | 122 | 22 | 69 | 167 | 0 | 111 | 55 | 99 |
| 45 | 12 | 32 | 83 | 125 | 139 | 158 | 70 | 168 | 57 | 113 | 102 | 44 | 30 | 88 | 123 | 20 | 9 | 78 | 166 | 61 | 144 | 101 |
| 49 | 456 | 35 | 124 | 114 | 10 | 90 | 172 | 63 | 135 | 80 | 53 | 150 | 29 | 43 | 108 | 14 | 93 | 161 | | | | |

In the case of Table 47, Equation 21 may be expressed as $Y_0=X_{\pi(0)}=X_{120}$, $Y_1=X_{\pi(1)}=X_{75}$, $Y_2=X_{\pi(2)}=X_{171}$, ..., $Y_{178}=X_{\pi(178)}=X_{93}$, and $Y_{179}=X_{\pi(179)}=X_{161}$. Accordingly, the group interleaver 122 may rearrange the order of the plurality of bit groups in bit group wise by changing the $120^{th}$ bit group to the $0^{th}$ bit group, the $75^{th}$ bit group to the $1^{st}$ bit group, the $171^{st}$ bit group to the $2^{nd}$ bit group, ..., the $93^{rd}$ bit group to the $178^{th}$ bit group, and the $161^{st}$ bit group to the $179^{th}$ bit group.

In another example, when the length $N_{ldpc}$ of the LDPC codeword is 64800, the code rate is 6/15, and the modulation method is QPSK, π(j) may be defined as in Table 48 presented below.

TABLE 48

Order of bits group to be block interleaved
π(j) (0 ≤ j < 180)

| j-th block of Group-wise interleaver output | | | | | | | | | | | | | | | | | | | | | | |
|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| 161 | 162 | 163 | 164 | 165 | 165 | 167 | 168 | 169 | 170 | 171 | 172 | 173 | 174 | 175 | 176 | 177 | 178 | 179 | | | | |

| π(j)-th block of Group-wise interleaver input, | | | | | | | | | | | | | | | | | | | | | | |
|---|---|---|---|---|---|---|---|---|---|---|---|---|---|---|---|---|---|---|---|---|---|---|
| 92 | 79 | 168 | 44 | 15 | 63 | 147 | 109 | 197 | 26 | 136 | 94 | 124 | 2 | 42 | 14 | 64 | 176 | 105 | 155 | 92 | 144 | 86 |
| 116 | 133 | 24 | 38 | 65 | 9 | 167 | 102 | 156 | 55 | 177 | 112 | 128 | 28 | 76 | 45 | 142 | 4 | 89 | 99 | 60 | 175 | 153 |
| 118 | 35 | 19 | 129 | 46 | 139 | 6 | 81 | 70 | 179 | 151 | 95 | 57 | 18 | 115 | 30 | 169 | 41 | 135 | 78 | 125 | 148 | 104 |
| 62 | 16 | 91 | 29 | 161 | 40 | 3 | 174 | 51 | 73 | 123 | 113 | 61 | 84 | 97 | 13 | 34 | 138 | 172 | 158 | 0 | 23 | 71 |
| 47 | 59 | 83 | 117 | 98 | 134 | 146 | 170 | 7 | 159 | 27 | 69 | 43 | 88 | 58 | 101 | 121 | 140 | 17 | 111 | 1 | 178 | 75 |
| 166 | 87 | 37 | 54 | 126 | 150 | 12 | 22 | 114 | 103 | 72 | 160 | 82 | 93 | 50 | 171 | 33 | 137 | 149 | 11 | 107 | 127 | 21 |
| 77 | 96 | 66 | 162 | 36 | 48 | 145 | 10 | 108 | 119 | 25 | 131 | 85 | 67 | 163 | 173 | 49 | 141 | 39 | 106 | 152 | 5 | 122 |
| 90 | 20 | 72 | 164 | 56 | 132 | 32 | 110 | 143 | 100 | 8 | 120 | 154 | 80 | 68 | 53 | 130 | 31 | 165 | | | | |

In the case of Table 48, Equation 21 may be expressed as $Y_0=X_{\pi(0)}=X_{92}$, $Y_1=X_{\pi(1)}=X_{79}$, $Y_2=X_{\pi(2)}=X_{168}$, ..., $Y_{178}=X_{\pi(178)}=X_{31}$, and $Y_{179}=X_{\pi(179)}=X_{165}$. Accordingly, the group interleaver 122 may rearrange the order of the plurality of bit groups in bit group wise by changing the $92^{nd}$ bit group to the $0^{th}$ bit group, the $79^{th}$ bit group to the $1^{st}$ bit group, the $168^{th}$ bit group to the $2^{nd}$ bit group, ..., the $31^{st}$ bit group to the $178^{th}$ bit group, and the $165^{th}$ bit group to the $179^{th}$ bit group.

In another example, when the length $N_{ldpc}$ of the LDPC codeword is 64800, the code rate is 6/15, and the modulation method is QPSK, π(j) may be defined as in Table 49 presented below.

TABLE 49

Order of bits group to be block interleaved
π(j) (0 ≤ j < 180)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| | 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| | 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| | 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| | 161 | 162 | 163 | 164 | 165 | 165 | 167 | 168 | 169 | 170 | 171 | 172 | 173 | 174 | 175 | 176 | 177 | 178 | 179 | | | | |
| π(j)-th block of Group-wise interleaver input, | 53 | 65 | 29 | 159 | 39 | 13 | 134 | 148 | 108 | 120 | 85 | 174 | 75 | 54 | 164 | 1 | 21 | 44 | 95 | 13 | 144 | 118 | 154 |
| | 33 | 76 | 58 | 106 | 167 | 11 | 96 | 0 | 23 | 136 | 151 | 177 | 78 | 60 | 42 | 122 | 165 | 102 | 92 | 12 | 24 | 147 | 179 |
| | 82 | 67 | 52 | 38 | 117 | 105 | 135 | 94 | 160 | 27 | 171 | 2 | 146 | 17 | 69 | 49 | 123 | 37 | 110 | 133 | 158 | 87 | 173 |
| | 98 | 8 | 19 | 57 | 72 | 121 | 36 | 132 | 149 | 86 | 176 | 100 | 7 | 26 | 59 | 73 | 166 | 47 | 112 | 153 | 84 | 141 | 99 |
| | 4 | 31 | 131 | 64 | 16 | 172 | 119 | 109 | 48 | 83 | 143 | 3 | 157 | 93 | 30 | 129 | 169 | 61 | 103 | 15 | 113 | 71 | 142 |
| | 43 | 456 | 89 | 32 | 5 | 168 | 124 | 56 | 104 | 77 | 138 | 18 | 152 | 114 | 178 | 46 | 163 | 28 | 62 | 125 | 81 | 6 | 91 |
| | 139 | 107 | 150 | 41 | 162 | 25 | 66 | 175 | 79 | 14 | 55 | 126 | 115 | 140 | 35 | 45 | 90 | 68 | 101 | 161 | 9 | 80 | 22 |
| | 128 | 111 | 145 | 50 | 34 | 70 | 97 | 170 | 155 | 10 | 20 | 127 | 116 | 137 | 51 | 40 | 74 | 63 | 88 | | | | |

In the case of Table 49, Equation 21 may be expressed as $Y_0=X_{\pi(0)}=X_{53}$, $Y_1=X_{\pi(1)}=X_{65}$, $Y_2=X_{\pi(2)}=X_{29}$, ..., $Y_{178}=X_{\pi(178)}=X_{63}$, and $Y_{179}=X_{\pi(179)}=X_{88}$. Accordingly, the group interleaver 122 may rearrange the order of the plurality of bit groups in bit group wise by changing the 53$^{rd}$ bit group to the 0$^{th}$ bit group, the 65$^{th}$ bit group to the 1$^{st}$ bit group, the 29$^{th}$ bit group to the 2$^{nd}$ bit group, ..., the 63$^{rd}$ bit group to the 178$^{th}$ bit group, and the 88$^{th}$ bit group to the 179$^{th}$ bit group.

In another example, when the length $N_{ldpc}$ of the LDPC codeword is 64800, the code rate is 6/15, and the modulation method is QPSK, π(j) may be defined as in Table 50 presented below.

TABLE 50

Order of bits group to be block interleaved
π(j) (0 ≤ j < 180)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| | 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| | 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| | 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| | 161 | 162 | 163 | 164 | 165 | 165 | 167 | 168 | 169 | 170 | 171 | 172 | 173 | 174 | 175 | 176 | 177 | 178 | 179 | | | | |
| π(j)-th block of Group-wise interleaver input, | 18 | 169 | 30 | 63 | 155 | 132 | 99 | 1 | 87 | 117 | 145 | 73 | 179 | 19 | 56 | 167 | 43 | 32 | 128 | 156 | 112 | 4 | 89 |
| | 140 | 69 | 14 | 100 | 49 | 34 | 168 | 151 | 120 | 0 | 89 | 110 | 136 | 64 | 13 | 74 | 45 | 170 | 160 | 125 | 149 | 91 | 111 |
| | 2 | 139 | 55 | 67 | 41 | 21 | 161 | 77 | 31 | 121 | 173 | 104 | 5 | 143 | 58 | 94 | 44 | 159 | 84 | 71 | 116 | 16 | 27 |
| | 6 | 133 | 57 | 106 | 42 | 150 | 172 | 70 | 122 | 83 | 26 | 95 | 3 | 15 | 162 | 134 | 38 | 108 | 148 | 124 | 176 | 54 | 76 |
| | 96 | 17 | 28 | 166 | 40 | 107 | 138 | 118 | 153 | 52 | 82 | 62 | 7 | 97 | 163 | 24 | 178 | 135 | 123 | 36 | 152 | 80 | 66 |
| | 53 | 105 | 12 | 164 | 23 | 174 | 127 | 39 | 115 | 137 | 85 | 147 | 60 | 101 | 72 | 25 | 10 | 126 | 48 | 165 | 35 | 90 | 146 |
| | 59 | 103 | 113 | 78 | 9 | 20 | 175 | 131 | 47 | 88 | 158 | 61 | 142 | 37 | 98 | 109 | 22 | 75 | 11 | 51 | 119 | 129 | 177 |
| | 157 | 33 | 93 | 65 | 144 | 79 | 8 | 50 | 114 | 130 | 171 | 154 | 29 | 102 | 92 | 68 | 141 | 81 | 46 | | | | |

In the case of Table 50, Equation 21 may be expressed as $Y_0=X_{\pi(0)}=X_{18}$, $Y_1=X_{\pi(1)}=X_{169}$, $Y_2=X_{\pi(2)}=X_{30}$, ..., $Y_{178}=X_{\pi(178)}=X_{81}$, and $Y_{179}=X_{\pi(179)}=X_{46}$. Accordingly, the group interleaver 122 may rearrange the order of the plurality of bit groups in bit group wise by changing the 18$^{th}$ bit group to the 0$^{th}$ bit group, the 169$^{th}$ bit group to the 1$^{st}$ bit group, the 30$^{th}$ bit group to the 2$^{nd}$ bit group, ..., the 81$^{st}$ bit group to the 178$^{th}$ bit group, and the 46$^{th}$ bit group to the 179$^{th}$ bit group.

In another example, when the length $N_{ldpc}$ of the LDPC codeword is 64800, the code rate is 6/15, and the modulation method is QPSK, π(j) may be defined as in Table 51 presented below.

TABLE 51

Order of bits group to be block interleaved
π(j) (0 ≤ j < 180)

| j-th block of Group-wise interleaver output | | | | | | | | | | | | | | | | | | | | | | |
|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| 161 | 162 | 163 | 164 | 165 | 166 | 167 | 168 | 169 | 170 | 171 | 172 | 173 | 174 | 175 | 176 | 177 | 178 | 179 | | | | |

| π(j)-th block of Group-wise interleaver input, | | | | | | | | | | | | | | | | | | | | | | |
|---|---|---|---|---|---|---|---|---|---|---|---|---|---|---|---|---|---|---|---|---|---|---|
| 18 | 169 | 30 | 63 | 155 | 132 | 99 | 1 | 87 | 117 | 145 | 73 | 179 | 19 | 56 | 167 | 43 | 32 | 128 | 156 | 112 | 4 | 89 |
| 140 | 69 | 14 | 100 | 49 | 34 | 168 | 151 | 120 | 0 | 86 | 110 | 136 | 64 | 13 | 74 | 45 | 170 | 160 | 125 | 149 | 91 | 111 |
| 2 | 139 | 55 | 67 | 41 | 21 | 161 | 77 | 31 | 121 | 173 | 104 | 5 | 143 | 58 | 94 | 44 | 159 | 84 | 71 | 116 | 16 | 27 |
| 6 | 133 | 57 | 106 | 42 | 150 | 172 | 70 | 122 | 83 | 26 | 95 | 3 | 15 | 162 | 134 | 38 | 108 | 148 | 124 | 176 | 54 | 76 |
| 96 | 17 | 28 | 166 | 40 | 107 | 138 | 118 | 153 | 52 | 82 | 62 | 7 | 97 | 163 | 24 | 178 | 135 | 123 | 36 | 152 | 80 | 66 |
| 53 | 105 | 12 | 164 | 23 | 174 | 127 | 39 | 115 | 137 | 85 | 147 | 60 | 101 | 72 | 25 | 10 | 126 | 48 | 165 | 35 | 90 | 146 |
| 59 | 103 | 113 | 78 | 9 | 20 | 175 | 131 | 47 | 88 | 158 | 61 | 142 | 37 | 98 | 109 | 22 | 75 | 11 | 51 | 119 | 129 | 177 |
| 157 | 33 | 93 | 65 | 144 | 79 | 8 | 50 | 114 | 130 | 171 | 154 | 29 | 102 | 92 | 68 | 141 | 81 | 46 | | | | |

In the case of Table 51, Equation 21 may be expressed as $Y_0=X_{\pi(0)}=X_{18}$, $Y_1=X_{\pi(1)}=X_{169}$, $Y_2=X_{\pi(2)}=X_{30}$, . . . , $Y_{178}=X_{\pi(178)}=X_{81}$, and $Y_{179}=X_{\pi(179)}=X_{46}$. Accordingly, the group interleaver 122 may rearrange the order of the plurality of bit groups in bit group wise by changing the 18$^{th}$ bit group to the 0$^{th}$ bit group, the 169$^{th}$ bit group to the 1$^{st}$ bit group, the 30$^{th}$ bit group to the 2$^{nd}$ bit group, . . . , the 81$^{st}$ bit group to the 178$^{th}$ bit group, and the 46$^{th}$ bit group to the 179$^{th}$ bit group.

In another example, when the length $N_{ldpc}$ of the LDPC codeword is 64800, the code rate is 6/15, and the modulation method is QPSK, π(j) may be defined as in Table 52 presented below.

TABLE 52

Order of bits group to be block interleaved
π(j) (0 ≤ j < 180)

| j-th block of Group-wise interleaver output | | | | | | | | | | | | | | | | | | | | | | |
|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| 161 | 162 | 163 | 164 | 165 | 166 | 167 | 168 | 169 | 170 | 171 | 172 | 173 | 174 | 175 | 176 | 177 | 178 | 179 | | | | |

| π(j)-th block of Group-wise interleaver input, | | | | | | | | | | | | | | | | | | | | | | |
|---|---|---|---|---|---|---|---|---|---|---|---|---|---|---|---|---|---|---|---|---|---|---|
| 18 | 169 | 30 | 63 | 155 | 132 | 99 | 2 | 87 | 117 | 145 | 73 | 179 | 19 | 56 | 167 | 43 | 32 | 128 | 156 | 112 | 4 | 89 |
| 140 | 69 | 14 | 100 | 49 | 34 | 168 | 151 | 120 | 0 | 86 | 110 | 136 | 64 | 13 | 74 | 45 | 170 | 160 | 125 | 149 | 91 | 111 |
| 2 | 139 | 55 | 67 | 41 | 21 | 161 | 77 | 31 | 121 | 173 | 104 | 5 | 143 | 58 | 94 | 44 | 159 | 84 | 71 | 116 | 16 | 27 |
| 6 | 133 | 57 | 106 | 42 | 150 | 172 | 70 | 122 | 83 | 26 | 95 | 3 | 15 | 162 | 134 | 38 | 108 | 148 | 124 | 176 | 54 | 76 |
| 96 | 17 | 28 | 166 | 40 | 107 | 138 | 118 | 153 | 52 | 82 | 62 | 7 | 97 | 163 | 24 | 178 | 135 | 123 | 36 | 152 | 80 | 66 |
| 53 | 105 | 12 | 164 | 23 | 174 | 127 | 39 | 115 | 137 | 85 | 147 | 60 | 101 | 72 | 25 | 10 | 126 | 48 | 165 | 35 | 90 | 146 |
| 59 | 103 | 113 | 78 | 9 | 20 | 175 | 131 | 47 | 88 | 158 | 61 | 142 | 37 | 98 | 109 | 22 | 75 | 11 | 51 | 119 | 129 | 177 |
| 157 | 33 | 93 | 65 | 144 | 79 | 8 | 50 | 114 | 130 | 171 | 152 | 29 | 102 | 92 | 68 | 141 | 81 | 46 | | | | |

In the case of Table 52, Equation 21 may be expressed as $Y_0=X_{\pi(0)}=X_{18}$, $Y_1=X_{\pi(1)}=X_{169}$, $Y_2=X_{\pi(2)}=X_{30}$, . . . , $Y_{178}=X_{\pi(178)}=X_{81}$, and $Y_{179}=X_{\pi(179)}=X_{46}$. Accordingly, the group interleaver 122 may rearrange the order of the plurality of bit groups in bit group wise by changing the 18$^{th}$ bit group to the 0$^{th}$ bit group, the 169$^{th}$ bit group to the 1$^{st}$ bit group, the 30$^{th}$ bit group to the 2$^{nd}$ bit group, . . . , the 81$^{st}$ bit group to the 178$^{th}$ bit group, and the 46$^{th}$ bit group to the 179$^{th}$ bit group.

In another example, when the length $N_{ldpc}$ of the LDPC codeword is 64800, the code rate is 6/15, and the modulation method is QPSK, π(j) may be defined as in Table 53 presented below.

TABLE 53

Order of bits group to be block interleaved
π(j) (0 ≤ j < 180)

| | | | | | | | | | | | | | | | | | | | | | | | |
|---|---|---|---|---|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| Group-wise | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| interleaver | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| output | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| | 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| | 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| | 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| | 161 | 162 | 163 | 164 | 165 | 166 | 167 | 168 | 169 | 170 | 171 | 172 | 173 | 174 | 175 | 176 | 177 | 178 | 179 | | | | |
| π(j)-th block | 43 | 150 | 26 | 119 | 108 | 7 | 173 | 163 | 81 | 135 | 71 | 45 | 153 | 55 | 92 | 125 | 16 | 115 | 32 | 177 | 105 | 67 | 140 |
| of | 79 | 54 | 4 | 126 | 154 | 20 | 166 | 37 | 112 | 95 | 64 | 144 | 76 | 48 | 5 | 134 | 124 | 25 | 160 | 176 | 88 | 59 | 100 |
| Group-wise | 74 | 47 | 1 | 12 | 127 | 137 | 36 | 178 | 90 | 162 | 22 | 147 | 117 | 72 | 101 | 2 | 132 | 33 | 52 | 84 | 157 | 172 | 21 |
| interleaver | 143 | 73 | 113 | 98 | 131 | 40 | 60 | 83 | 3 | 167 | 18 | 50 | 149 | 109 | 28 | 93 | 130 | 120 | 65 | 0 | 161 | 175 | 44 |
| input, | 15 | 77 | 148 | 104 | 91 | 114 | 66 | 133 | 165 | 29 | 46 | 56 | 17 | 152 | 105 | 86 | 122 | 6 | 75 | 170 | 138 | 31 | 42 |
| | 62 | 151 | 106 | 85 | 121 | 10 | 96 | 168 | 139 | 24 | 34 | 53 | 179 | 158 | 107 | 69 | 8 | 123 | 87 | 97 | 141 | 38 | 169 |
| | 23 | 57 | 156 | 111 | 13 | 70 | 80 | 99 | 128 | 35 | 145 | 171 | 49 | 155 | 110 | 11 | 61 | 82 | 94 | 129 | 39 | 27 | 142 |
| | 174 | 159 | 116 | 51 | 14 | 63 | 78 | 89 | 103 | 30 | 21 | 136 | 164 | 146 | 118 | 19 | 68 | 9 | 58 | | | | |

In the case of Table 53, Equation 21 may be expressed as $Y_0 = X_{\pi(0)} = X_{43}$, $Y_1 = X_{\pi(1)} = X_{150}$, $Y_2 = X_{\pi(2)} = X_{26}$, . . . , $Y_{178} = X_{\pi(178)} = X_9$, and $Y_{179} = X_{\pi(179)} = X_{58}$. Accordingly, the group interleaver 122 may rearrange the order of the plurality of bit groups in bit group wise by changing the 43$^{rd}$ bit group to the 0$^{th}$ bit group, the 150$^{th}$ bit group to the 1$^{st}$ bit group, the 26$^{th}$ bit group to the 2$^{nd}$ bit group, . . . , the 9$^{th}$ bit group to the 178$^{th}$ bit group, and the 58$^{th}$ bit group to the 179$^{th}$ bit group.

In another example, when the length $N_{ldpc}$ of the LDPC codeword is 64800, the code rate is 6/15, and the modulation method is QPSK, π(j) may be defined as in Table 54 presented below.

TABLE 54

Order of bits group to be block interleaved
π(j) (0 ≤ j < 180)

| | | | | | | | | | | | | | | | | | | | | | | | |
|---|---|---|---|---|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| Group-wise | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| interleaver | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| output | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| | 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| | 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| | 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| | 161 | 162 | 163 | 164 | 165 | 166 | 167 | 168 | 169 | 170 | 171 | 172 | 173 | 174 | 175 | 176 | 177 | 178 | 179 | | | | |
| π(j)-th block | 108 | 178 | 95 | 30 | 159 | 120 | 21 | 45 | 71 | 57 | 137 | 82 | 149 | 174 | 96 | 33 | 117 | 127 | 160 | 19 | 67 | 52 | 0 |
| of | 81 | 179 | 141 | 102 | 37 | 115 | 128 | 163 | 63 | 12 | 151 | 85 | 177 | 27 | 97 | 42 | 73 | 138 | 166 | 62 | 107 | 125 | 156 |
| Group-wise | 15 | 25 | 89 | 176 | 40 | 51 | 145 | 77 | 114 | 61 | 99 | 162 | 28 | 129 | 7 | 17 | 39 | 152 | 86 | 74 | 140 | 53 | 175 |
| interleaver | 101 | 123 | 2 | 13 | 31 | 165 | 88 | 155 | 143 | 41 | 59 | 110 | 132 | 70 | 9 | 24 | 171 | 91 | 122 | 146 | 48 | 36 | 106 |
| input, | 161 | 136 | 14 | 75 | 60 | 94 | 173 | 3 | 119 | 47 | 148 | 109 | 29 | 133 | 84 | 16 | 66 | 167 | 6 | 121 | 49 | 157 | 104 |
| | 26 | 144 | 134 | 93 | 72 | 169 | 1 | 38 | 55 | 116 | 103 | 18 | 153 | 142 | 83 | 126 | 65 | 8 | 172 | 50 | 32 | 100 | 21 |
| | 111 | 154 | 78 | 139 | 124 | 68 | 168 | 90 | 56 | 35 | 4 | 22 | 150 | 113 | 135 | 46 | 79 | 69 | 38 | 164 | 58 | 34 | 5 |
| | 147 | 118 | 23 | 44 | 130 | 80 | 92 | 105 | 64 | 170 | 54 | 10 | 158 | 20 | 43 | 131 | 76 | 87 | 112 | | | | |

In the case of Table 54, Equation 21 may be expressed as $Y_0 = X_{\pi(0)} = X_{108}$, $Y_1 = X_{\pi(1)} = X_{178}$, $Y_2 = X_{\pi(2)} = X_{95}$, . . . , $Y_{178} = X_{\pi(178)} = X_{87}$, and $Y_{179} = X_{\pi(179)} = X_{112}$. Accordingly, the group interleaver 122 may rearrange the order of the plurality of bit groups in bit group wise by changing the 108$^{th}$ bit group to the 0$^{th}$ bit group, the 178$^{th}$ bit group to the 1$^{st}$ bit group, the 95$^{th}$ bit group to the 2$^{nd}$ bit group, . . . , the 87$^{th}$ bit group to the 178$^{th}$ bit group, and the 112$^{th}$ bit group to the 179$^{th}$ bit group.

In another example, when the length $N_{ldpc}$ of the LDPC codeword is 64800, the code rate is 6/15, and the modulation method is QPSK, π(j) may be defined as in Table 55 presented below.

TABLE 55

Order of bits group to be block interleaved
π(j) (0 ≤ j < 180)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| | 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| | 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| | 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| | 161 | 162 | 163 | 164 | 165 | 166 | 167 | 168 | 169 | 170 | 171 | 172 | 173 | 174 | 175 | 176 | 177 | 178 | 179 | | | | |
| π(j)-th block of Group-wise interleaver input | 57 | 154 | 144 | 171 | 111 | 5 | 38 | 82 | 15 | 122 | 99 | 54 | 26 | 151 | 136 | 110 | 67 | 41 | 4 | 87 | 164 | 178 | 16 |
| | 77 | 150 | 123 | 140 | 97 | 53 | 112 | 42 | 63 | 165 | 23 | 78 | 7 | 125 | 176 | 138 | 89 | 153 | 40 | 116 | 65 | 28 | 163 |
| | 52 | 106 | 2 | 131 | 83 | 147 | 12 | 177 | 95 | 32 | 167 | 44 | 59 | 114 | 73 | 84 | 139 | 149 | 124 | 13 | 27 | 101 | 0 |
| | 61 | 113 | 174 | 91 | 74 | 50 | 157 | 134 | 20 | 35 | 1 | 64 | 102 | 169 | 118 | 75 | 46 | 158 | 128 | 141 | 36 | 3 | 18 |
| | 100 | 86 | 56 | 172 | 71 | 160 | 119 | 145 | 43 | 29 | 11 | 96 | 107 | 133 | 173 | 85 | 68 | 159 | 143 | 49 | 37 | 24 | 117 |
| | 6 | 130 | 179 | 80 | 66 | 104 | 142 | 166 | 48 | 17 | 33 | 92 | 120 | 132 | 79 | 156 | 62 | 109 | 175 | 51 | 14 | 39 | 90 |
| | 121 | 137 | 25 | 72 | 161 | 103 | 148 | 58 | 10 | 47 | 93 | 127 | 115 | 22 | 34 | 70 | 162 | 152 | 60 | 8 | 105 | 45 | 129 |
| | 81 | 94 | 30 | 19 | 170 | 146 | 69 | 9 | 55 | 108 | 135 | 125 | 98 | 31 | 88 | 21 | 168 | 155 | 76 | | | | |

In the case of Table 55, Equation 21 may be expressed as $Y_0 = X_{\pi(0)} = X_{57}$, $Y_1 = X_{\pi(1)} = X_{154}$, $Y_2 = X_{\pi(2)} = X_{144}$, ..., $Y_{178} = X_{\pi(178)} = X_{155}$, and $Y_{179} = X_{\pi(179)} = X_{76}$. Accordingly, the group interleaver 122 may rearrange the order of the plurality of bit groups in bit group wise by changing the $57^{th}$ bit group to the $0^{th}$ bit group, the $154^{th}$ bit group to the $1^{st}$ bit group, the $144^{th}$ bit group to the $2^{nd}$ bit group, ..., the $155^{th}$ bit group to the $178^{th}$ bit group, and the $76^{th}$ bit group to the $179^{th}$ bit group.

In another example, when the length $N_{ldpc}$ of the LDPC codeword is 64800, the code rate is 6/15, and the modulation method is QPSK, π(j) may be defined as in Table 56 presented below.

TABLE 56

Order of bits group to be block interleaved
π(j) (0 ≤ j < 180)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
| | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
| | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 |
| | 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 |
| | 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 |
| | 138 | 139 | 140 | 141 | 142 | 143 | 144 | 145 | 146 | 147 | 148 | 149 | 150 | 151 | 152 | 153 | 154 | 155 | 156 | 157 | 158 | 159 | 160 |
| | 161 | 162 | 163 | 164 | 165 | 166 | 167 | 168 | 169 | 170 | 171 | 172 | 173 | 174 | 175 | 176 | 177 | 178 | 179 | | | | |
| π(j)-th block of Group-wise interleaver input | 127 | 38 | 14 | 83 | 58 | 72 | 107 | 150 | 0 | 179 | 117 | 138 | 161 | 22 | 44 | 82 | 32 | 100 | 56 | 5 | 69 | 120 | 133 |
| | 168 | 17 | 157 | 147 | 87 | 104 | 39 | 4 | 60 | 29 | 121 | 131 | 15 | 172 | 156 | 73 | 142 | 43 | 95 | 106 | 59 | 119 | 85 |
| | 21 | 7 | 153 | 177 | 70 | 37 | 130 | 141 | 54 | 103 | 167 | 155 | 24 | 88 | 154 | 75 | 35 | 10 | 128 | 143 | 52 | 178 | 64 |
| | 112 | 89 | 166 | 99 | 34 | 13 | 76 | 155 | 134 | 48 | 65 | 114 | 23 | 145 | 2 | 98 | 124 | 12 | 86 | 159 | 46 | 176 | 62 |
| | 108 | 148 | 25 | 1 | 136 | 74 | 96 | 36 | 158 | 118 | 169 | 47 | 11 | 146 | 57 | 132 | 79 | 67 | 94 | 30 | 111 | 170 | 160 |
| | 3 | 144 | 49 | 125 | 19 | 84 | 61 | 101 | 113 | 171 | 71 | 9 | 31 | 135 | 45 | 149 | 91 | 20 | 55 | 110 | 163 | 81 | 123 |
| | 6 | 33 | 174 | 137 | 66 | 18 | 94 | 50 | 109 | 77 | 152 | 126 | 162 | 40 | 8 | 28 | 173 | 93 | 140 | 63 | 78 | 151 | 122 |
| | 51 | 41 | 105 | 27 | 165 | 90 | 175 | 139 | 80 | 68 | 16 | 129 | 116 | 53 | 42 | 26 | 164 | 102 | 92 | | | | |

In the case of Table 56, Equation 21 may be expressed as $Y_0 = X_{\pi(0)} = X_{127}$, $Y_1 = X_{\pi(1)} = X_{38}$, $Y_2 = X_{\pi(2)} = X_{14}$, ..., $Y_{178} = X_{\pi(178)} = X_{102}$, and $Y_{179} = X_{\pi(179)} = X_{92}$. Accordingly, the group interleaver 122 may rearrange the order of the plurality of bit groups in bit group wise by changing the $127^{th}$ bit group to the $0^{th}$ bit group, the $38^{th}$ bit group to the $1^{st}$ bit group, the $14^{th}$ bit group to the $2^{nd}$ bit group, ..., the $102^{nd}$ bit group to the $178^{th}$ bit group, and the $92^{nd}$ bit group to the $179^{th}$ bit group.

As described above, the group interleaver 122 may rearrange the order of the plurality of bit groups in bit group wise by using Equation 21 and Tables 32 to 56.

"j-th block of Group-wise Interleaver output" in Tables 32 to 56 indicates the j-th bit group output from the group interleaver 122 after interleaving, and "π(j)-th block of Group-wise Interleaver input" indicates the π(j)-th bit group input to the group interleaver 122.

In addition, since the order of the bit groups constituting the LDPC codeword is rearranged by the group interleaver 122 in bit group wise, and then the bit groups are block-interleaved by the block interleaver 124, which will be described below, "Order of bits groups to be block interleaved" is set forth in Tables 32 to 56 in relation to π(j).

Figure 7:
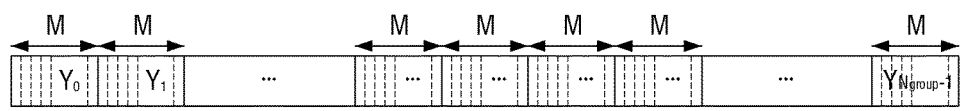

The LDPC codeword which is group-interleaved in the above-described method is illustrated in FIG. 7. Comparing the LDPC codeword of FIG. 7 and the LDPC codeword of FIG. 6 before group interleaving, it can be seen that the order of the plurality of bit groups constituting wherein $Q_{ldpc}$ is a cyclic shift parameter value regarding columns in a column group of an information word submatrix of the parity check matrix, $N_{ldpc}$ is a length of the LDPC codeword, and $K_{ldpc}$ is a length of information word bits of the LDPC codeword.

the LDPC codeword is rearranged.

That is, as shown in FIGS. 6 and 7, the groups of the LDPC codeword are arranged in order of bit group $X_0$, bit group $X_1$, ..., bit group $X_{Ngroup-1}$ before being group-interleaved, and are arranged in an order of bit group $Y_0$, bit group $Y_1$, ..., bit group $Y_{Ngroup-1}$ after being group-interleaved. In this case, the order of arranging the bit groups by the group interleaving may be determined based on Tables 32 to 56.

The group twist interleaver 123 interleaves bits in a same group. That is, the group twist interleaver 123 may rearrange the order of the bits in the same bit group by changing the order of the bits in the same bit group.

In this case, the group twist interleaver 123 may rearrange the order of the bits in the same bit group by cyclic-shifting a predetermined number of bits from among the bits in the same bit group.

Figure 8:
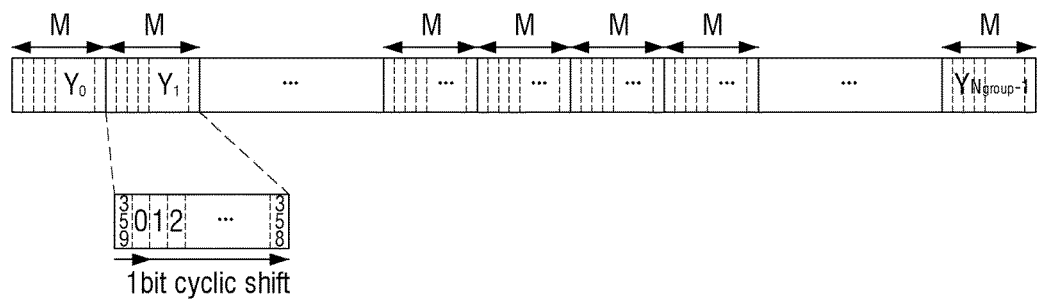

For example, as shown in FIG. 8, the group twist interleaver 123 may cyclic-shift bits included in the bit group $Y_1$ to the right by 1 bit. In this case, the bits located in the $0^{th}$ position, the $1^{st}$ position, the $2^{nd}$ position, . . . , the $358^{th}$ position, and the $359^{th}$ position in the bit group $Y_1$ as shown in FIG. 8 are cyclic-shifted to the right by 1 bit. As a result, the bit located in the $359^{th}$ position before being cyclic-shifted is located in the front of the bit group $Y_1$ and the bits located in the $0^{th}$ position, the $1^{st}$ position, the $2^{nd}$ position, . . . , the $358^{th}$ position before being cyclic-shifted are shifted to the right serially by 1 bit and located.

In addition, the group twist interleaver 123 may rearrange the order of bits in each bit group by cyclic-shifting a different number of bits in each bit group.

For example, the group twist interleaver 123 may cyclic-shift the bits included in the bit group $Y_1$ to the right by 1 bit, and may cyclic-shift the bits included in the bit group $Y_2$ to the right by 3 bits.

However, the above-described group twist interleaver 123 may be omitted according to circumstances.

In addition, the group twist interleaver 123 is placed after the group interleaver 122 in the above-described example. However, this is merely an example. That is, the group twist interleaver 123 changes only the order of bits in a certain bit group and does not change the order of the bit groups. Therefore, the group twist interleaver 123 may be placed before the group interleaver 122.

The block interleaver 124 interleaves the plurality of bit groups the order of which has been rearranged. Specifically, the block interleaver 124 may interleave the plurality of bit groups the order of which has been rearranged by the group interleaver 122 in bit group wise (or bit group unit). The block interleaver 124 is formed of a plurality of columns each including a plurality of rows and may interleave by dividing the plurality of rearranged bit groups based on a modulation order determined according to a modulation method.

In this case, the block interleaver 124 may interleave the plurality of bit groups the order of which has been rearranged by the group interleaver 122 in bit group wise. Specifically, the block interleaver 124 may interleave by dividing the plurality of rearranged bit groups according to a modulation order by using a first part and a second part.

Specifically, the block interleaver 124 interleaves by dividing each of the plurality of columns into a first part and a second part, writing the plurality of bit groups in the plurality of columns of the first part serially in bit group wise, dividing the bits of the other bit groups into groups (or sub bit groups) each including a predetermined number of bits based on the number of columns, and writing the sub bit groups in the plurality of columns of the second part serially.

Herein, the number of bit groups which are interleaved in bit group wise may be determined by at least one of the number of rows and columns constituting the block interleaver 124, the number of bit groups and the number of bits included in each bit group. In other words, the block interleaver 124 may determine the bit groups which are to be interleaved in bit group wise considering at least one of the number of rows and columns constituting the block interleaver 124, the number of bit groups and the number of bits included in each bit group, interleave the corresponding bit groups in bit group wise, and divide bits of the other bit groups into sub bit groups and interleave the sub bit groups. For example, the block interleaver 124 may interleave at least part of the plurality of bit groups in bit group wise using the first part, and divide bits of the other bit groups into sub bit groups and interleave the sub bit groups using the second part.

Meanwhile, interleaving bit groups in bit group wise means that the bits included in the same bit group are written in the same column. In other words, the block interleaver 124, in case of bit groups which are interleaved in bit group wise, may not divide the bits included in the same bit groups and write the bits in the same column, and in case of bit groups which are not interleaved in bit group wise, may divide the bits in the bit groups and write the bits in different columns.

Accordingly, the number of rows constituting the first part is a multiple of the number of bits included in one bit group (for example, 360), and the number of rows constituting the second part may be less than the number of bits included in one bit group.

In addition, in all bit groups interleaved by the first part, the bits included in the same bit group are written and interleaved in the same column of the first part, and in at least one group interleaved by the second part, the bits are divided and written in at least two columns of the second part.

The specific interleaving method will be described later.

Meanwhile, the group twist interleaver 123 changes only the order of bits in the bit group and does not change the order of bit groups by interleaving. Accordingly, the order of the bit groups to be block-interleaved by the block interleaver 124, that is, the order of the bit groups to be input to the block interleaver 124, may be determined by the group interleaver 122. Specifically, the order of the bit groups to be block-interleaved by the block interleaver 124 may be determined by $\pi(j)$ defined in Tables 32 to 56.

As described above, the block interleaver 124 may interleave the plurality of bit groups the order of which has been rearranged in bit group wise by using the plurality of columns each including the plurality of rows.

In this case, the block interleaver 124 may interleave the LDPC codeword by dividing the plurality of columns into at least two parts. For example, the block interleaver 124 may divide each of the plurality of columns into the first part and the second part and interleave the plurality of bit groups constituting the LDPC codeword.

In this case, the block interleaver 124 may divide each of the plurality of columns into N number of parts (N is an integer greater than or equal to 2) according to whether the number of bit groups constituting the LDPC codeword is an integer multiple of the number of columns constituting the block interleaver 124, and may perform interleaving.

When the number of bit groups constituting the LDPC codeword is an integer multiple of the number of columns constituting the block interleaver 124, the block interleaver 124 may interleave the plurality of bit groups constituting the LDPC codeword in bit group wise without dividing each of the plurality of columns into parts.

Specifically, the block interleaver 124 may interleave by writing the plurality of bit groups of the LDPC codeword on each of the columns in bit group wise in a column direction, and reading each row of the plurality of columns in which the plurality of bit groups are written in bit group wise in a row direction.

In this case, the block interleaver 124 may interleave by writing bits included in a predetermined number of bit groups which corresponds to a quotient obtained by dividing the number of bit groups of the LDPC codeword by the number of columns of the block interleaver 124 on each of the plurality of columns serially in a column direction, and reading each row of the plurality of columns in which the bits are written in a row direction.

Hereinafter, the group located in the $j^{th}$ position after being interleaved by the group interleaver 122 will be referred to as group $Y_j$.

For example, it is assumed that the block interleaver 124 is formed of C number of columns each including $R_1$ number of rows. In addition, it is assumed that the LDPC codeword is formed of $N_{group}$ number of bit groups and the number of bit groups $N_{group}$ is a multiple of C.

In this case, when the quotient obtained by dividing $N_{group}$ number of bit groups constituting the LDPC codeword by C number of columns constituting the block interleaver 124 is A ($=N_{group}/C$) (A is an integer greater than 0), the block interleaver 124 may interleave by writing A ($=N_{group}/C$) number of bit groups on each column serially in a column direction and reading bits written on each column in a row direction.

Figure 9:
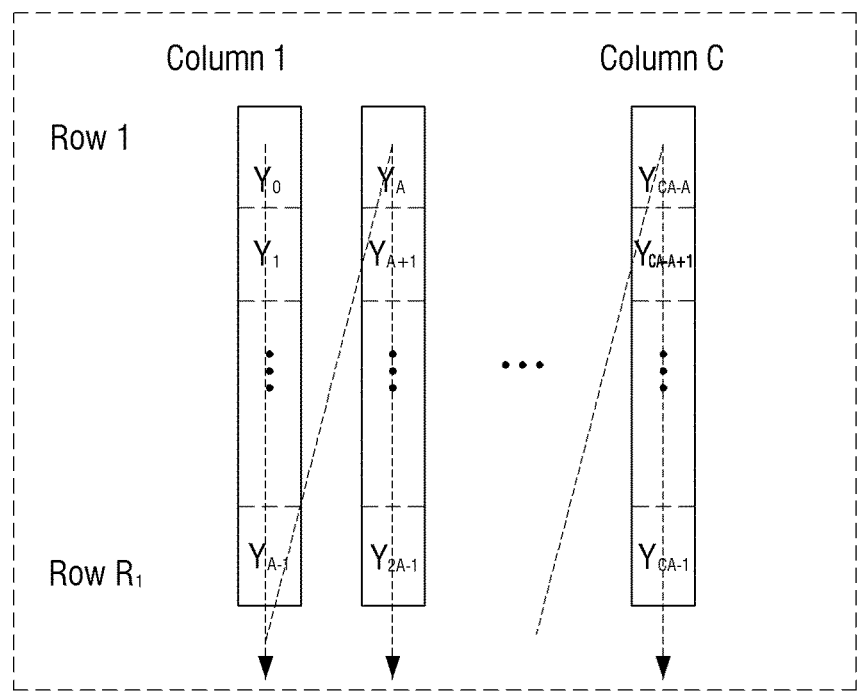
FIGS. 9 to 15 illustrate an interleaving method of a block interleaver according to exemplary embodiments.
Figure 9:
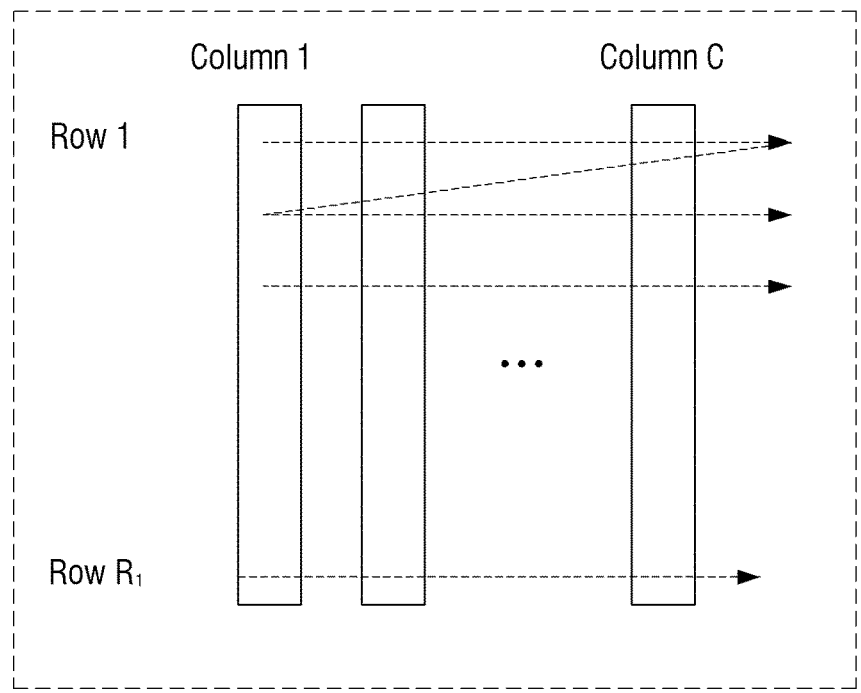

For example, as shown in FIG. 9, the block interleaver 124 writes bits included in bit group $Y_0$, bit group $Y_1$, . . . , bit group $Y_{A-1}$ in the $1^{st}$ column from the $1^{st}$ row to the $R_1^{th}$ row, writes bits included in bit group $Y_A$, bit group $Y_{A+1}$, . . . , bit group $Y_{2A-1}$ in the 2nd column from the $1^{st}$ row to the $R_1^{th}$ row, . . . , and writes bits included in bit group $Y_{CA-A}$ bit group $Y_{CA-A+1}$, . . . , bit group $Y_{CA-1}$ in the column C from the $1^{st}$ row to the $R_1^{th}$ row. The block interleaver 124 may read the bits written in each row of the plurality of columns in a row direction.

Accordingly, the block interleaver 124 interleaves all bit groups constituting the LDPC codeword in bit group wise.

However, when the number of bit groups of the LDPC codeword is not an integer multiple of the number of columns of the block interleaver 124, the block interleaver 124 may divide each column into 2 parts and interleave a part of the plurality of bit groups of the LDPC codeword in bit group wise, and divide bits of the other bit groups into sub bit groups and interleave the sub bit groups. In this case, the bits included in the other bit groups, that is, the bits included in the number of groups which correspond to the remainder when the number of bit groups constituting the LDPC codeword is divided by the number of columns are not interleaved in bit group wise, but interleaved by being divided according to the number of columns.

Specifically, the block interleaver 124 may interleave the LDPC codeword by dividing each of the plurality of columns into two parts.

In this case, the block interleaver 124 may divide the plurality of columns into the first part and the second part based on at least one of the number of columns of the block interleaver 124, the number of bit groups of the LDPC codeword, and the number of bits of bit groups.

Here, each of the plurality of bit groups may be formed of 360 bits. In addition, the number of bit groups of the LDPC codeword is determined based on the length of the LDPC codeword and the number of bits included in the bit group. For example, when an LDPC codeword in the length of 16200 is divided such that each bit group has 360 bits, the LDPC codeword is divided into 45 bit groups. Alternatively, when an LDPC codeword in the length of 64800 is divided such that each bit group has 360 bits, the LDPC codeword may be divided into 180 bit groups. Further, the number of columns constituting the block interleaver 124 may be determined according to a modulation method. This will be explained in detail below.

Accordingly, the number of rows constituting each of the first part and the second part may be determined based on the number of columns constituting the block interleaver 124, the number of bit groups constituting the LDPC codeword, and the number of bits constituting each of the plurality of bit groups.

Specifically, in each of the plurality of columns, the first part may be formed of as many rows as the number of bits included in at least one bit group which can be written in each column in bit group wise from among the plurality of bit groups of the LDPC codeword, according to the number of columns constituting the block interleaver 124, the number of bit groups constituting the LDPC codeword, and the number of bits constituting each bit group.

In each of the plurality of columns, the second part may be formed of rows excluding as many rows as the number of bits included in at least some bit groups which can be written in each of the plurality of columns in bit group wise. Specifically, the number rows of the second part may be the same value as a quotient when the number of bits included in all bit groups excluding bit groups corresponding to the first part is divided by the number of columns constituting the block interleaver 124. In other words, the number of rows of the second part may be the same value as a quotient when the number of bits included in the remaining bit groups which are not written in the first part from among bit groups constituting the LDPC codeword is divided by the number of columns.

That is, the block interleaver 124 may divide each of the plurality of columns into the first part including as many rows as the number of bits included in bit groups which can be written in each column in bit group wise, and the second part including the other rows.

Accordingly, the first part may be formed of as many rows as the number of bits included in bit groups, that is, as many rows as an integer multiple of M. However, since the number of codeword bits constituting each bit group may be an aliquot part of M as described above, the first part may be formed of as many rows as an integer multiple of the number of bits constituting each bit group.

In this case, the block interleaver 124 may interleave by writing and reading the LDPC codeword in the first part and the second part in the same method.

Specifically, the block interleaver 124 may interleave by writing the LDPC codeword in the plurality of columns constituting each of the first part and the second part in a column direction, and reading the plurality of columns constituting the first part and the second part in which the LDPC codeword is written in a row direction.

That is, the block interleaver 124 may interleave by writing the bits included in at least some bit groups which can be written in each of the plurality of columns in bit group wise in each of the plurality of columns of the first part serially, dividing the bits included in the other bit groups except the at least some bit groups and writing in each of the plurality of columns of the second part in a column direction, and reading the bits written in each of the plurality of columns constituting each of the first part and the second part in a row direction.

In this case, the block interleaver 124 may interleave by dividing the other bit groups except the at least some bit groups from among the plurality of bit groups based on the number of columns constituting the block interleaver 124.

Specifically, the block interleaver 124 may interleave by dividing the bits included in the other bit groups by the number of a plurality of columns, writing each of the divided bits in each of a plurality of columns constituting the second part in a column direction, and reading the plurality of columns constituting the second part, where the divided bits are written, in a row direction.

That is, the block interleaver 124 may divide the bits included in the other bit groups except the bit groups written in the first part from among the plurality of bit groups of the LDPC codeword, that is, the bits in the number of bit groups which correspond to the remainder when the number of bit groups constituting the LDPC codeword is divided by the number of columns, by the number of columns, and may write the divided bits in each column of the second part serially in a column direction.

For example, it is assumed that the block interleaver 124 is formed of C number of columns each including $R_1$ number of rows. In addition, it is assumed that the LDPC codeword is formed of $N_{group}$ number of bit groups, the number of bit groups $N_{group}$ is not a multiple of C, and $A \times C + 1 = N_{group}$ (A is an interger greater than 0). In other words, it is assumed that when the number of bit groups constituting the LDPC codeword is divided by the number of columns, the quotient is A and the remainder is 1.

Figure 10:
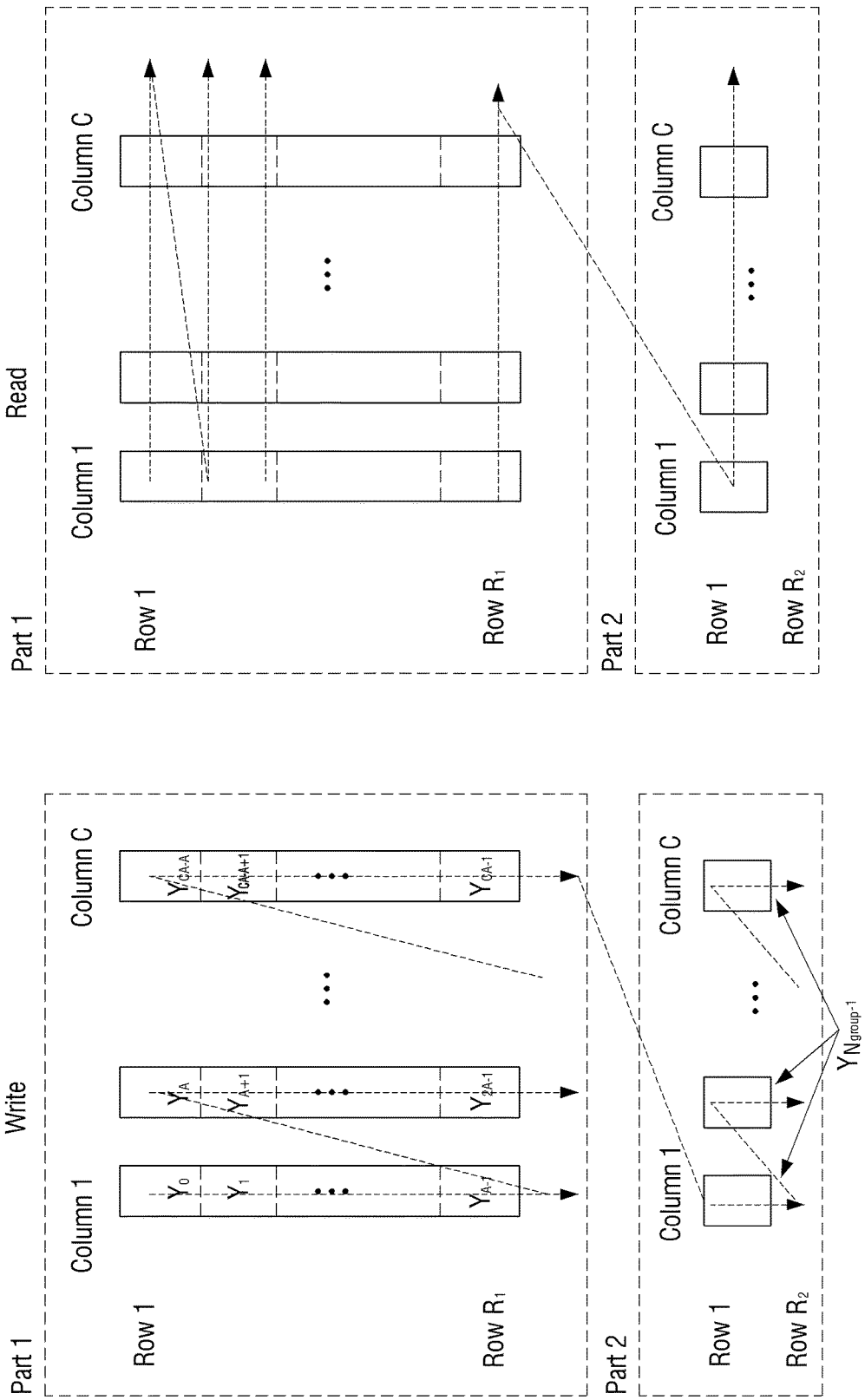
Figure 11:
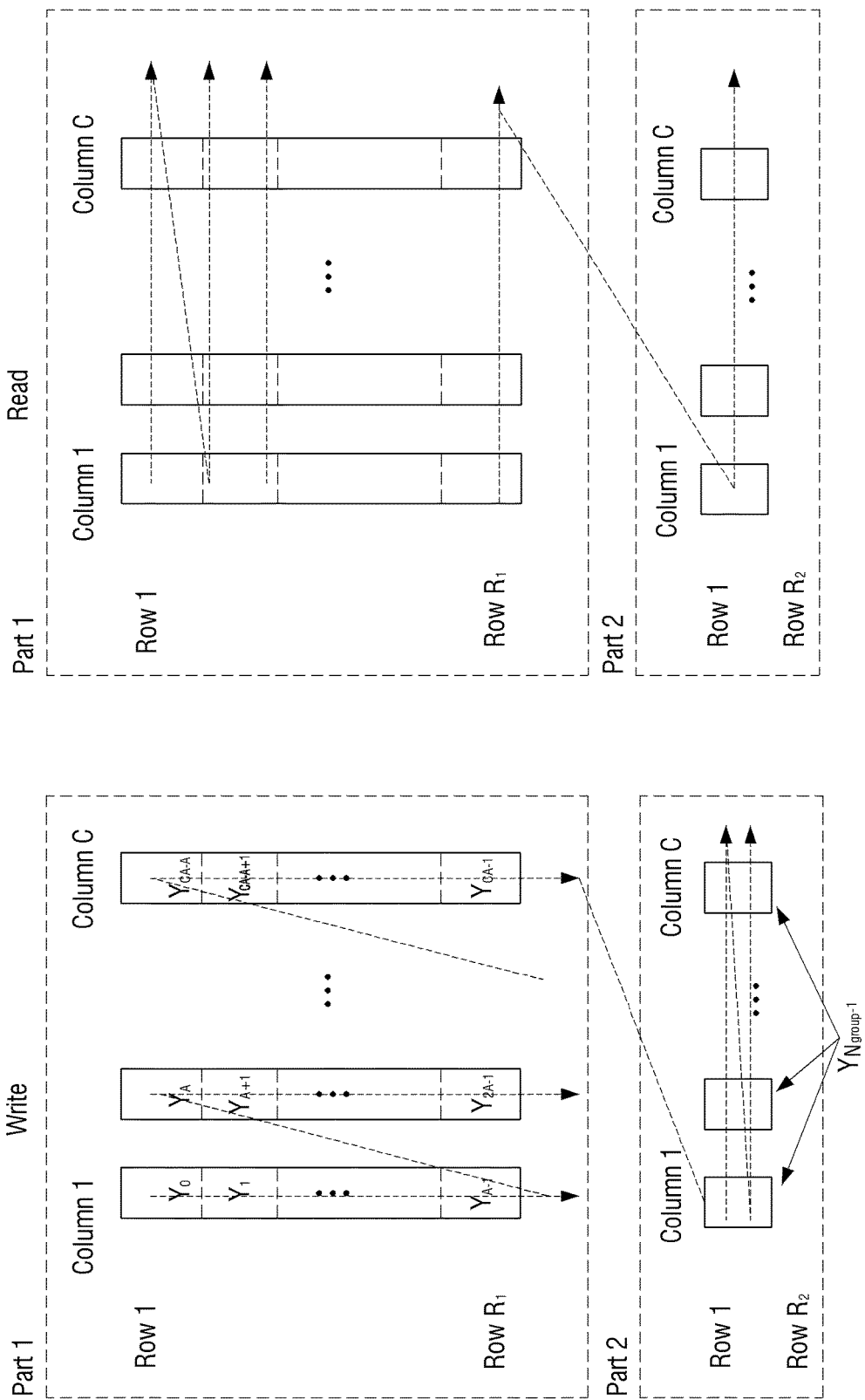

In this case, as shown in FIGS. 10 and 11, the block interleaver 124 may divide each column into a first part including $R_1$ number of rows and a second part including $R_2$ number of rows. In this case, $R_1$ may correspond to the number of bits included in bit groups which can be written in each column in bit group wise, and $R_2$ may be $R_1$ subtracted from the number of rows of each column.

That is, in the above-described example, the number of bit groups which can be written in each column in bit group wise is A, and the first part of each column may be formed of as many rows as the number of bits included in A number of bit groups, that is, may be formed of as many rows as $A \times M$ number.

In this case, the block interleaver 124 writes the bits included in the bit groups which can be written in each column in bit group wise, that is, A number of bit groups, in the first part of each column in the column direction.

That is, as shown in FIGS. 10 and 11, the block interleaver 124 writes the bits included in each of bit group $Y_0$, bit group $Y_1, \ldots$, group $Y_{A-1}$ in the $1^{st}$ to $R_1^{th}$ rows of the first part of the $1^{st}$ column, writes bits included in each of bit group $Y_A$, bit group $Y_{A+1}, \ldots$, bit group $Y_{2A-1}$ in the $1^{st}$ to $R_1^{th}$ rows of the first part of the $2^{nd}$ column, $\ldots$, writes bits included in each of bit group $Y_{CA-A}$, bit group $Y_{CA-A+1}, \ldots$, bit group $Y_{CA-1}$ in the $1^{st}$ to $R_1^{th}$ rows of the first part of the column C.

As described above, the block interleaver 124 writes the bits included in the bit groups which can be written in each column in bit group wise in the first part of each column.

In other words, in the above exemplary embodiment, the bits included in each of bit group ($Y_0$), bit group ($Y_1$), $\ldots$, bit group ($Y_{A-1}$) may not be divided and all of the bits may be written in the first column, the bits included in each of bit group ($Y_A$), bit group ($Y_{A+1}$), $\ldots$, bit group ($Y_{2A-1}$) may not be divided and all of the bits may be written in the second column, $\ldots$, and the bits included in each of bit group ($Y_{CA-A}$), bit group ($Y_{CA-A+1}$), $\ldots$, group ($Y_{CA-1}$) may not be divided and all of the bits may be written in the C column. As such, all bit groups interleaved by the first part are written in the same column of the first part.

Thereafter, the block interleaver 124 divides bits included in the other groups except the bit groups written in the first part of each column from among the plurality of bit groups, and writes the bits in the second part of each column in the column direction. In this case, the block interleaver 124 divides the bits included in the other bit groups except the bit groups written in the first part of each column by the number of columns, so that the same number of bits are written in the second part of each column, and writes the divided bits in the second part of each column in the column direction.

In the above-described example, since $A \times C + 1 = N_{group}$, when the bit groups constituting the LDPC codeword are written in the first part serially, the last bit group $Y_{Ngroup-1}$ of the LDPC codeword is not written in the first part and remains. Accordingly, the block interleaver 124 divides the bits included in the bit group $Y_{Ngroup-1}$ into C number of sub bit groups as shown in FIG. 10, and writes the divided bits (that is, the bits corresponding to the quotient when the bits included in the last group ($Y_{Ngroup-1}$) are divided by C) in the second part of each column serially.

The bits divided based on the number of columns may be referred to as sub bit groups. In this case, each of the sub bit groups may be written in each column of the second part. That is, the bits included in the bit groups may be divided and may form the sub bit groups.

That is, the block interleaver 124 writes the bits in the $1^{st}$ to $R_2$th rows of the second part of the $1^{st}$ column, writes the bits in the $1^{st}$ to $R_2^{th}$ rows of the second part of the $2^{nd}$ column, $\ldots$, and writes the bits in the $1^{st}$ to $R_2^{th}$ rows of the second part of the column C. In this case, the block interleaver 124 may write the bits in the second part of each column in the column direction as shown in FIG. 10.

That is, in the second part, the bits constituting the bit group may not be written in the same column and may be written in the plurality of columns. In other words, in the above example, the last bit ($Y_{Ngroup-1}$) group is formed of M number of bits and thus, the bits included in the last bit group ($Y_{Ngroup-1}$) may be divided by M/C and written in each column. That is, the bits included in the last bit group ($Y_{Ngroup-1}$) are divided by M/C, forming M/C number of sub bit groups, and each of the sub bit groups may be written in each column of the second part.

Accordingly, in at least one bit group which is interleaved by the second part, the bits included in the at least one bit group are divided and written in at least two columns constituting the second part.

In the above-described example, the block interleaver 124 writes the bits in the second part in the column direction. However, this is merely an example. That is, the block interleaver 124 may write the bits in the plurality of columns of the second parts in a row direction. In this case, the block interleaver 124 may write the bits in the first part in the same method as described above.

Specifically, referring to FIG. 11, the block interleaver 124 writes the bits from the $1^{st}$ row of the second part in the $1^{st}$ column to the $1^{st}$ row of the second part in the column C, writes the bits from the $2^{nd}$ row of the second part in the $1^{st}$ column to the $2^{nd}$ row of the second part in the column C, $\ldots$, etc., and writes the bits from the $R_2^{th}$ row of the second part in the $1^{st}$ column to the $R_2^{th}$ row of the second part in the column C.

On the other hand, the block interleaver 124 reads the bits written in each row of each part serially in the row direction. That is, as shown in FIGS. 10 and 11, the block interleaver 124 reads the bits written in each row of the first part of the plurality of columns serially in the row direction, and reads the bits written in each row of the second part of the plurality of columns serially in the row direction.

Accordingly, the block interleaver 124 may interleave a part of the plurality of bit groups constituting the LDPC codeword in bit group wise, and divide and interleave some of the remaining bit groups. That is, the block interleaver 124 may interleave by writing the LDPC codeword constituting a predetermined number of bit groups from among the plurality of bit groups in the plurality of columns of the first part in bit group wise, dividing the bits of the other bit groups and writing the bits in each of the columns of the second part, and reading the plurality of columns of the first and second parts in the row direction.

As described above, the block interleaver 124 may interleave the plurality of bit groups in the methods described above with reference to FIGS. 9 to 11.

In particular, in the case of FIG. 10, the bits included in the bit group which does not belong to the first part are written in the second part in the column direction and read in the row direction. In view of this, the order of the bits included in the bit group which does not belong to the first part is rearranged. Since the bits included in the bit group which does not belong to the first part are interleaved as described above, Bit Error Rate (BER)/Frame Error Rate (FER) performance can be improved in comparison with a case in which such bits are not interleaved.

However, the bit group which does not belong to the first part may not be interleaved as shown in FIG. 11. That is, since the block interleaver 124 writes and read the bits included in the group which does not belong to the first part in and from the second part in the row direction, the order of the bits included in the group which does not belong to the first part is not changed and the bits are output to the modulator 130 serially. In this case, the bits included in the group which does not belong to the first part may be output serially and mapped onto a modulation symbol.

In FIGS. 10 and 11, the last single bit group of the plurality of bit groups is written in the second part. However, this is merely an example. The number of bit groups written in the second part may vary according to the total number of bit groups of the LDPC codeword, the number of columns and rows, the number of transmission antennas, etc.

The block interleaver 124 may have a configuration as shown in Tables 57 and 58 presented below:

TABLE 57

| $N_{ldpc}$ = 64800 | | | | | |
|---|---|---|---|---|---|
| QPSK | 16 QAM | 64 QAM | 256 QAM | 1024 QAM | 4096 QAM |
| C      2 | 4 | 6 | 8 | 10 | 12 |
| $R_1$ 32400 | 16200 | 10800 | 7920 | 6480 | 5400 |
| $R_2$      0 | 0 | 0 | 180 | 0 | 0 |

TABLE 58

| $N_{ldpc}$ = 16200 | | | | | |
|---|---|---|---|---|---|
| QPSK | 16 QAM | 64 QAM | 256 QAM | 1024 QAM | 4096 QAM |
| C     2 | 4 | 6 | 8 | 10 | 12 |
| $R_1$ 7920 | 3960 | 2520 | 1800 | 1440 | 1080 |
| $R_2$  180 | 90 | 180 | 225 | 180 | 270 |

Herein, C (or $N_C$) is the number of columns of the block interleaver 124, $R_1$ is the number of rows constituting the first part in each column, and $R_2$ is the number of rows constituting the second part in each column.

Referring to Tables 57 and 58, the number of columns has the same value as a modulation order according to a modulation method, and each of a plurality of columns is formed of rows corresponding to the number of bits constituting the LDPC codeword divided by the number of a plurality of columns.

For example, when the length $N_{ldpc}$ of the LDPC codeword is 64800 and the modulation method is QPSK, the block interleaver 124 is formed of 2 columns as the modulation order is 2 in the case of QPSK, and each column is formed of rows as many as $R_1+R_2=32400(=64800/2)$.

Meanwhile, referring to Tables 57 and 58, when the number of bit groups constituting an LDPC codeword is an integer multiple of the number of columns, the block interleaver 124 interleaves without dividing each column. Therefore, $R_1$ corresponds to the number of rows constituting each column, and $R_2$ is 0. In addition, when the number of bit groups constituting an LDPC codeword is not an integer multiple of the number of columns, the block interleaver 124 interleaves the groups by dividing each column into the first part formed of $R_1$ number of rows, and the second part formed of $R_2$ number of rows.

When the number of columns of the block interleaver 124 is equal to the number of bits constituting a modulation symbol, bits included in a same bit group are mapped onto a single bit of each modulation symbol as shown in Tables 57 and 58.

For example, when $N_{ldpc}$=64800 and the modulation method is QPSK, the block interleaver 124 may be formed of two (2) columns each including 32400 rows. In this case, a plurality of bit groups are written in the two (2) columns in bit group wise and bits written in the same row in each column are output serially. In this case, since two (2) bits constitute a single modulation symbol in the modulation method of QPSK, bits included in the same bit group, that is, bits output from a single column, may be mapped onto a single bit of each modulation symbol. For example, bits included in a bit group written in the $1^{St}$ column may be mapped onto the first bit of each modulation symbol.

Referring to Tables 57 and 58, the total number of rows of the block interleaver 124, that is, $R_1+R_2$, is $N_{ldpc}/C$.

In addition, the number of rows of the first part, $R_1$, is an integer multiple of the number of bits included in each group, M (e.g., M=360), and may be expressed as $\lfloor N_{group}/C \rfloor \times M$, and the number of rows of the second part, $R_2$, may be $N_{ldpc}/C-R_1$. Herein, $\lfloor N_{group}/C \rfloor$ is the largest integer below $N_{group}/C$. Since $R_1$ is an integer multiple of the number of bits included in each group, M, bits may be written in $R_1$ in bit groups wise.

In addition, when the number of bit groups of the LDPC codeword is not a multiple of the number of columns, it can be seen from Tables 57 and 58 that the block interleaver 124 interleaves by dividing each column into two parts.

Specifically, the length of the LDPC codeword divided by the number of columns is the total number of rows included in the each column. In this case, when the number of bit groups of the LDPC codeword is a multiple of the number of columns, each column is not divided into two parts. However, when the number of bit groups of the LDPC codeword is not a multiple of the number of columns, each column is divided into two parts.

For example, it is assumed that the number of columns of the block interleaver 124 is identical to the number of bits constituting a modulation symbol, and an LDPC codeword is formed of 64800 bits as shown in Table 57. In this case, each bit group of the LDPC codeword is formed of 360 bits, and the LDPC codeword is formed of 64800/360 (=180) bit groups.

When the modulation method is QPSK, the block interleaver 124 may be formed of two (2) columns and each column may have 64800/2 (=32400) rows.

In this case, since the number of bit groups of the LDPC codeword divided by the number of columns is 180/2 (=90), bits can be written in each column in bit group wise without dividing each column into two parts. That is, bits included in 90 bit groups which is the quotient when the number of bit groups constituting the LDPC codeword is divided by the number of columns, that is, 90×360 (=32400) bits can be written in each column.

However, when the modulation method is 256-QAM, the block interleaver 124 may be formed of eight (8) columns and each column may have 64800/8(=8100) rows.

In this case, since the number of bit groups of the LDPC codeword divided by the number of columns is 180/8=22.5, the number of bit groups constituting the LDPC codeword is not an integer multiple of the number of columns. Accordingly, the block interleaver 124 divides each of the eight (8) columns into two parts to perform interleaving in bit group wise.

In this case, since the bits should be written in the first part of each column in bit group wise, the number of bit groups which can be written in the first part of each column in bit group wise is 22 which is the quotient when the number of bit groups constituting the LDPC codeword is divided by the number of columns, and accordingly, the first part of each column has 22×360 (=7920) rows. Accordingly, 7920 bits included in 22 bit groups may be written in the first part of each column.

The second part of each column has rows which are the rows of the first part subtracted from the total rows of each column. Accordingly, the second part of each column includes 8100−7920 (=180) rows.

In this case, the bits included in the other bit groups which have not been written in the first part are divided and written in the second part of each column.

Specifically, since 22×8 (=176) bit groups are written in the first part, the number of bit groups to be written in the second part is 180−176 (=4) (for example, bit group $Y_{176}$, bit group $Y_{177}$, bit group $Y_{178}$, and bit group $Y_{179}$ from among bit group $Y_0$, bit group $Y_1$, bit group $Y_2$, ..., bit group $Y_{178}$, and bit group $Y_{179}$ constituting the LDPC codeword).

Accordingly, the block interleaver 124 may write the four (4) bit groups which have not been written in the first part and remains from among the groups constituting the LDPC codeword in the second part of each column serially.

That is, the block interleaver 124 may write 180 bits of the 360 bits included in the bit group $Y_{176}$ in the $1^{st}$ row to the $180^{th}$ row of the second part of the $1^{st}$ column in the column direction, and may write the other 180 bits in the $1^{st}$ row to the $180^{th}$ row of the second part of the $2^{nd}$ column in the column direction. In addition, the block interleaver 124 may write 180 bits of the 360 bits included in the bit group $Y_{in}$ in the $1^{st}$ row to the $180^{th}$ row of the second part of the $3^{rd}$ column in the column direction, and may write the other 180 bits in the $1^{st}$ row to the $180^{th}$ row of the second part of the $4^{th}$ column in the column direction. In addition, the block interleaver 124 may write 180 bits of the 360 bits included in the bit group $Y_{178}$ in the $1^{st}$ row to the $180^{th}$ row of the second part of the $5^{th}$ column in the column direction, and may write the other 180 bits in the $1^{st}$ row to the $180^{th}$ row of the second part of the $6^{th}$ column in the column direction. In addition, the block interleaver 124 may write 180 bits of the 360 bits included in the bit group $Y_{179}$ in the $1^{st}$ row to the $180^{th}$ row of the second part of the $7^{th}$ column in the column direction, and may write the other 180 bits in the $1^{st}$ row to the $180^{th}$ row of the second part of the $8^{th}$ column in the column direction.

Accordingly, the bits included in the bit group which has not been written in the first part and remains are not written in the same column in the second part and may be divided and written in the plurality of columns.

Hereinafter, the block interleaver of FIG. 5 according to an exemplary embodiment will be explained in detail with reference to FIG. 12.

In a group-interleaved LDPC codeword ($v_0, v_1, \ldots, v_{N_{ldpc}-1}$), $Y_j$ is continuously arranged like $V=\{Y_0, Y_1, \ldots Y_{N_{group}-1}\}$.

Figure 12:
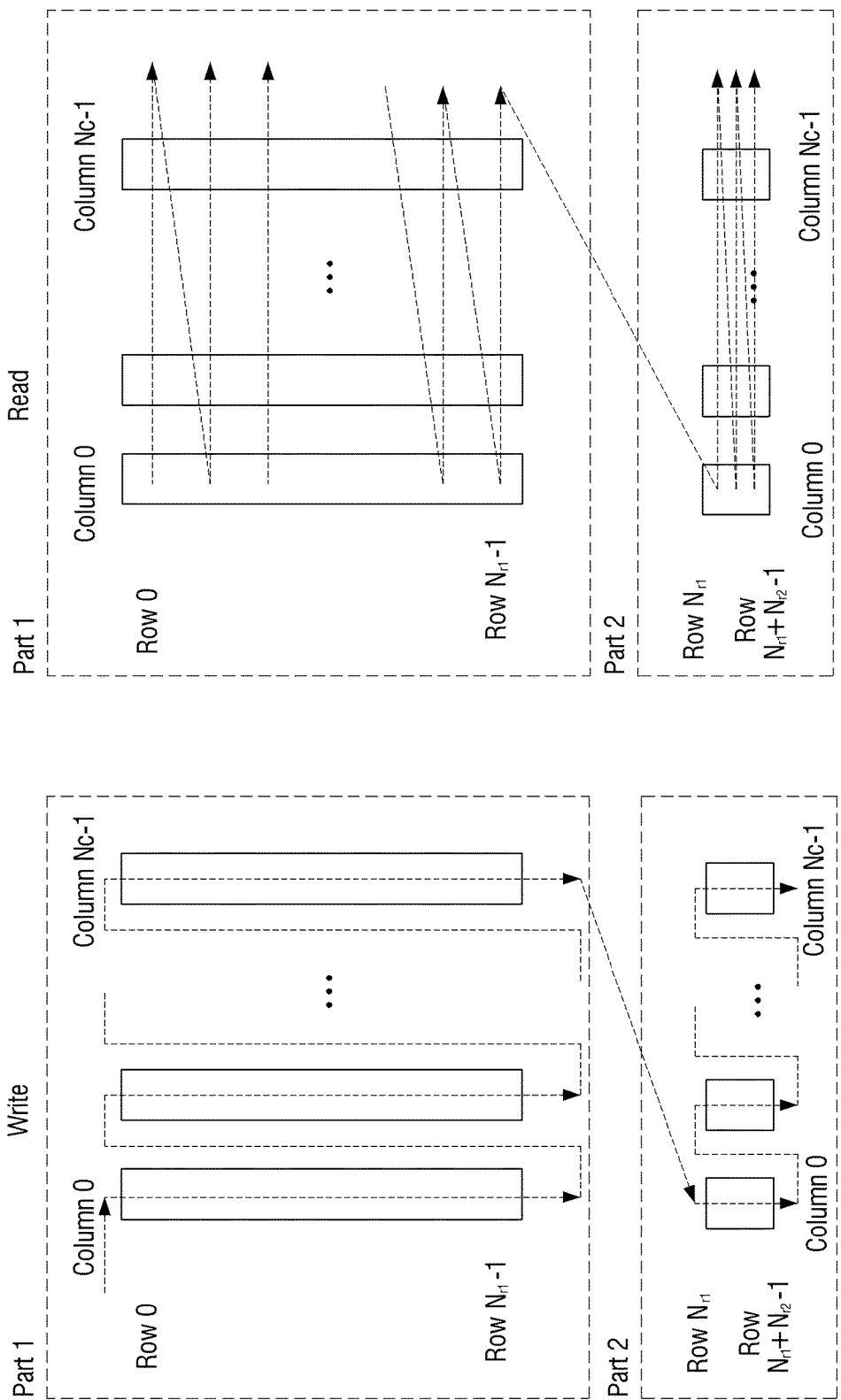

The LDPC codeword after group interleaving may be interleaved by the block interleaver 124 as shown in FIG. 12. In this case, the block interleaver 124 divide a plurality of columns into the first part (Part 1) and the second part (Part 2) based on the number of columns of the block interleaver 124 and the number of bits of bit groups. In this case, in the first part, the bits constituting the bit groups may be written in the same column, and in the second part, the bits constituting the bit groups may be written in a plurality of columns (i.e. the bits constituting the bit groups may be written in at least two columns).

Specifically, input bits $v_i$ are written serially from the first part to the second part column wise, and then read out serially from the first part to the second part row wise. That is, the data bits $v_i$ are written serially into the block interleaver column-wise starting in the first part and continuing column-wise finishing in the second part, and then read out serially row-wise from the first part and then row-wise from the second part. Accordingly, the bit included in the same bit group in the first part may be mapped onto a single bit of each modulation symbol.

In this case, the number of columns and the number of rows of the first part and the second part of the block interleaver 124 vary according to a modulation format and a length of the LDPC codeword as in Table 30 presented below. That is, the first part and the second part block interleaving configurations for each modulation format and code length are specified in Table 59 presented below. Herein, the number of columns of the block interleaver 124 may be equal to the number of bits constituting a modulation symbol. In addition, a sum of the number of rows of the first part, $N_{r1}$ and the number of rows of the second part, $N_{r2}$, is equal to $N_{ldpc}/N_C$ (herein, $N_C$ is the number of columns). In addition, since $N_{r1}(=\lfloor N_{group}/N_C \rfloor \times 360)$ is a multiple of 360, a multiple of bit groups may be written in the first part.

TABLE 59

| Modulation | Rows in Part 1 $N_{r1}$ | | Rows in Part 2 $N_{r2}$ | | Columns $N_c$ |
|---|---|---|---|---|---|
| | $N_{ldpc}=$ 64800 | $N_{ldpc}=$ 16200 | $N_{ldpc}=$ 64800 | $N_{ldpc}=$ 16200 | |
| QPSK | 32400 | 7920 | 0 | 180 | 2 |
| 16-QAM | 16200 | 3960 | 0 | 90 | 4 |
| 64-QAM | 10800 | 2520 | 0 | 180 | 6 |
| 256-QAM | 7920 | 1800 | 180 | 225 | 8 |
| 1024-QAM | 6480 | 1440 | 0 | 180 | 10 |
| 4096-QAM | 5400 | 1080 | 0 | 270 | 12 |

Hereinafter, an operation of the block interleaver 124 will be explained in detail.

Specifically, as shown in FIG. 12, the input bit $v_i$ ($0 \le i < N_C \times N_{r1}$) is written in $r_i$ row of $c_i$ column of the first part of the block interleaver 124. Herein, $c_i$ and $r_i$ are $$c_i = \left\lfloor \frac{i}{N_{r1}} \right\rfloor$$

and $r_i = (i \bmod N_{r1})$, respectively.

In addition, the input bit $v_i$ ($N_C \times N_{r1} \le i < N_{ldpc}$) is written in an $r_i$ row of $c_i$ column of the second part of the block interleaver 124. Herein, $c_i$ and $r_i$ satisfy $$c_i = \left\lfloor \frac{(i - N_C \times N_{r1})}{N_{r2}} \right\rfloor$$

and $r_i = N_{r1} + \{(i - N_C \times N_{r1}) \bmod N_{r2}\}$, respectively.

An output bit $q_j$ ($0 \le j < N_{ldpc}$) is read from $c_j$ column of $r_j$ row. Herein, $r_j$ and $c_j$ satisfy $$r_j = \left\lfloor \frac{j}{N_c} \right\rfloor$$

and $c_j = (j \bmod N_C)$, respectively.

For example, when the length $N_{ldpc}$ of an LDPC codeword is 64800 and the modulation method is 256-QAM, the order of bits output from the block interleaver 124 may be ($q_0$, $q_1$, $q_2$, ..., $q_{63357}$, $q_{63358}$, $q_{63359}$, $q_{63360}$, $q_{63361}$, ..., $q_{64799}$) = ($v_0$, $v_{7920}$, $v_{15840}$, ..., $v_{47519}$, $v_{55439}$, $v_{63359}$, $v_{63360}$, $v_{63540}$, ..., $v_{64799}$) Herein, the indexes of the right side of the foregoing equation may be specifically expressed for the eight (8) columns as 0, 7920, 15840, 23760, 31680, 39600, 47520, 55440, 1, 7921, 15841, 23761, 31681, 39601, 47521, 55441, ..., 7919, 15839, 23759, 31679, 39599, 47519, 55439, 63359, 63360, 63540, 63720, 63900, 64080, 64260, 64440, 64620, ..., 63539, 63719, 63899, 64079, 64259, 64439, 64619, 64799.

Hereinafter, the interleaving operation of the block interleaver 124 will be explained in detail.

The block interleaver 124 may interleave by writing a plurality of bit groups in each column in bit group wise in a column direction, and reading each row of the plurality of columns in which the plurality of bit groups are written in bit group wise in a row direction.

In this case, the number of columns constituting the block interleaver 124 may vary according to a modulation method, and the number of rows may be the length of the LDPC codeword/the number of columns. For example, when the modulation method is QPSK, the block interleaver 124 may be formed of 2 columns. In this case, when the length $N_{ldpc}$ of the LDPC codeword is 16200, the number of rows is 8100 (=16200/2), and, when the length $N_{ldpc}$ of the LDPC codeword is 64800, the number of rows is 32400 (=64800/2).

Hereinafter, the method for interleaving the plurality of bit groups in bit group wise by the block interleaver 124 will be explained in detail.

When the number of bit groups constituting the LDPC codeword is an integer multiple of the number of columns, the block interleaver 124 may interleave by writing the bit groups as many as the number of bit groups divided by the number of columns in each column serially in bit group wise.

For example, when the modulation method is QPSK and the length $N_{ldpc}$ of the LDPC codeword is 64800, the block interleaver 124 may be formed of two (2) columns each including 32400 rows. In this case, since the LDPC codeword is divided into (64800/360=180) number of bit groups when the length $N_{ldpc}$ of the LDPC codeword is 64800, the number of bit groups (=180) of the LDPC codeword may be an integer multiple of the number of columns (=2) when the modulation method is QPSK.

Figure 13:
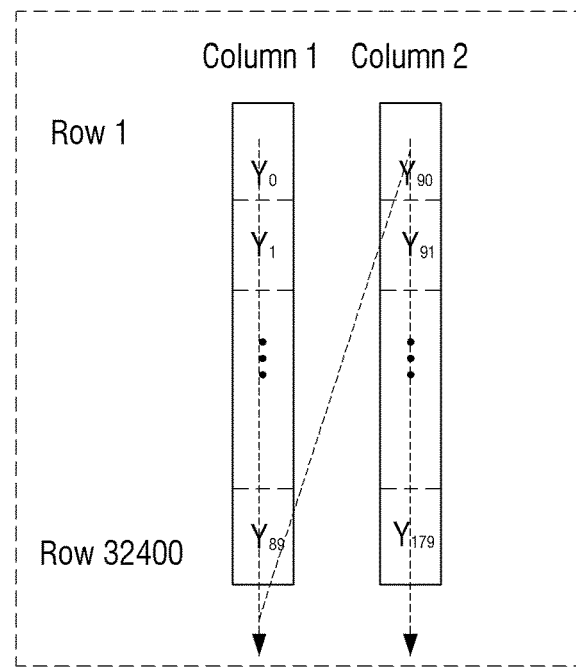
Figure 13:
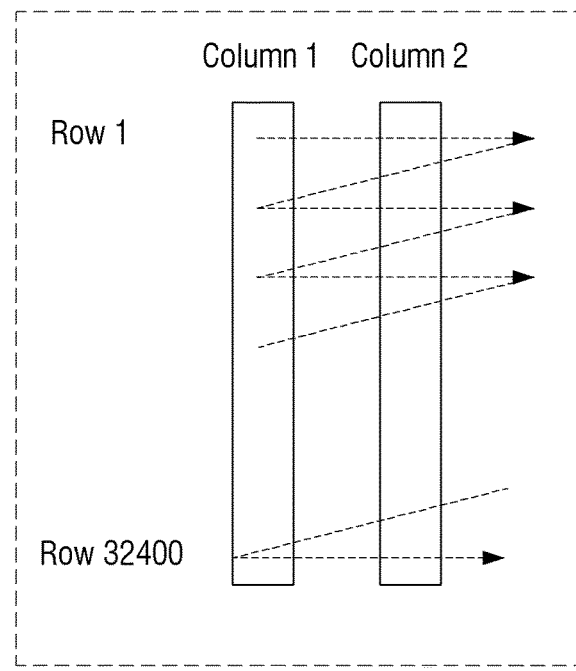

In this case, as shown in FIG. 13, the block interleaver 124 writes the bits included in each of the bit group $Y_0$, bit group $Y_1$, ..., bit group $Y_{89}$ in the $1^{st}$ row to $32400^{th}$ row of the first column, and writes the bits included in each of the bit group $Y_{90}$, the bit group $Y_{91}$, ..., the bit group $Y_{179}$ in the $1^{st}$ row to $32400^{th}$ row of the second column. In addition, the block interleaver 124 may read the bits written in each row of the two columns serially in the row direction.

However, when the number of bit groups constituting the LDPC codeword is not an integer multiple of the number of columns, the block interleaver 124 may interleave by dividing each column into N number of parts (N is an integer greater than or equal to 2).

Specifically, the block interleaver 124 may divide each column into a part including as many rows as the number of bits included in the bit group which can be written in each column in bit group wise, and a part including the other rows, and may interleave by using the divided parts.

In this case, the block interleaver 124 may write at least some bit groups which can be written in each of the plurality of columns in bit group wise from among the plurality of bit groups in each of the plurality of columns serially, and then divides the bits included in the other bit groups into sub bit groups and writes the bits in the other area remaining in each of the plurality of columns after the at least some bit groups are written in bit group wise. That is, the block interleaver 124 may write the bits included in at least some bit groups which are writable in the first part of each column in bit group wise, and may divide the bits included in the other bit groups and writhe the bits in the second part of each column.

For example, when the modulation method is QPSK and the length $N_{ldpc}$ of the LDPC codeword is 16200, the block interleaver 124 may be formed of two (2) columns each including 8100 rows. In this case, since the LDPC codeword is divided into (16200/360=45) number of bit groups when the length $N_{ldpc}$ of the LDPC codeword is 16200, the number of bit groups (=45) of the LDPC codeword is not an integer multiple of the number of columns (=2) when the modulation method is QPSK. That is, a remainder exists.

Figure 14:
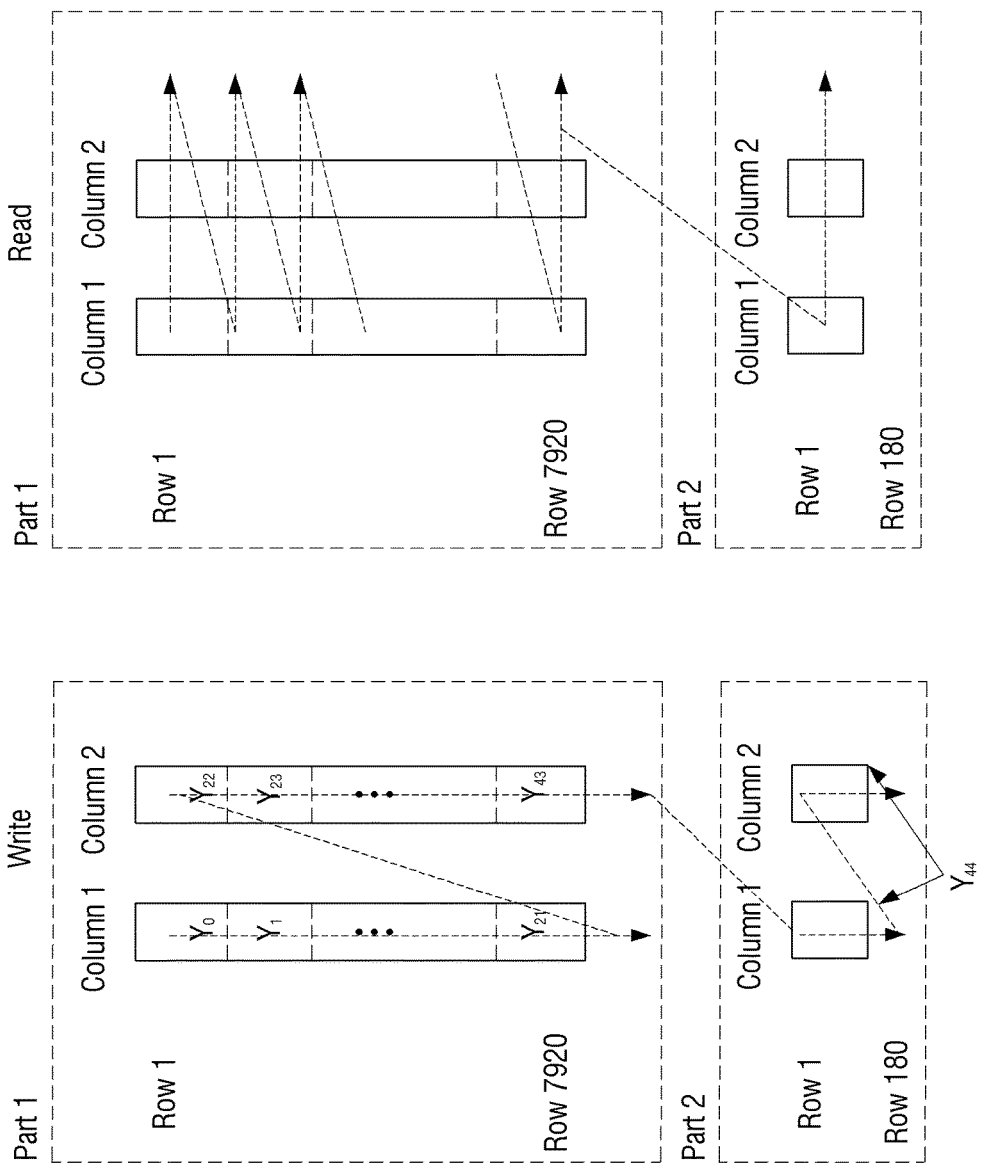
Figure 15:
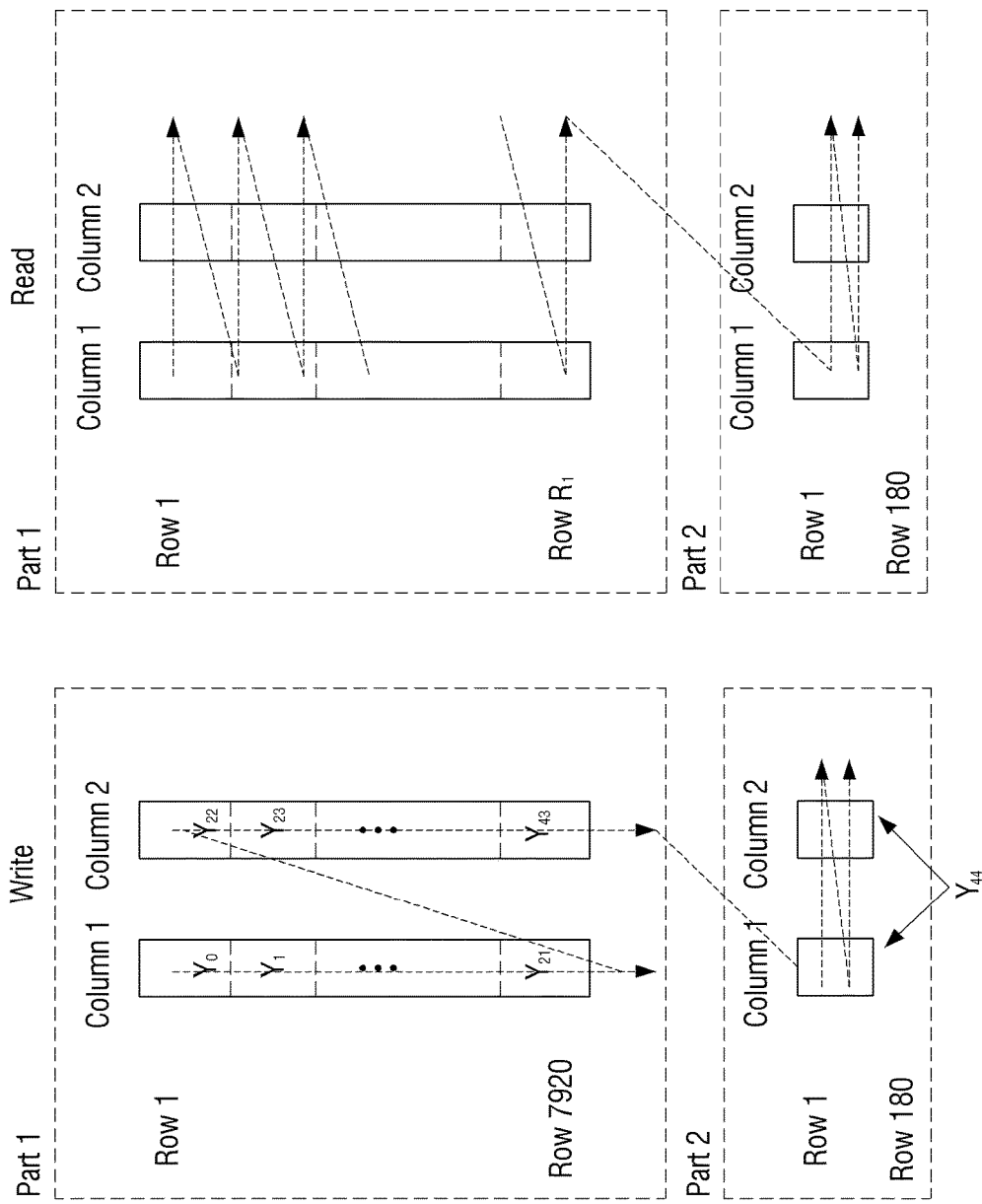

In this case, the block interleaver 124 may divide each column into the first part including 7920 rows and the second part including 180 rows as shown in FIGS. 14 and 15.

The block interleaver 124 writes the bits included in the bit groups which can be written in each column in bit group wise in the first part of each column in the column direction.

That is, as shown in FIGS. 14 and 15, the block interleaver 124 writes the bits included in each of the bit group $Y_0$, bit group $Y_1$, ..., bit group $Y_{21}$ in the $1^{st}$ row to $7920^{th}$ row of the first part of the first column, and writes the bits included in each of the bit group $Y_{22}$, the bit group $Y_{23}$, ..., the bit group $Y_{43}$ in the $1^{st}$ row to $7920^{th}$ row of the first part of the second column.

As described above, the block interleaver 124 writes the bits included in the bit groups which can be written in each column in bit group wise in the first part of each column in bit group wise.

Thereafter, the block interleaver 124 divides the bits included in the other bit groups except for the bit groups written in the first part of each column from among the plurality of bit groups, and writes the bits in the second part of each column in the column direction. In this case, the block interleaver 124 may divide the bits included in the other bit groups except for the bit groups written in the first part of each column by the number of columns, such that the same number of bits are written in the second part of each column, and writes the divided bits in each column of the second part in the column direction.

For example, when the bit group $Y_{44}$, which is the last bit group of the LDPC codeword, remains as shown in FIG. 14, the block interleaver 124 divides the bits included in the bit group $Y_{44}$ by 2, and writes the divided bits in the second part of each column serially.

That is, the block interleaver 124 may write the bits in the $1^{st}$ row to $180^{th}$ row of the second part of the first column, and writes the bits in the $1^{st}$ row to $180^{th}$ row of the second part of the second column. In this case, the block interleaver 124 may write the bits in the second part of each column in the column direction as shown in FIG. 14. That is, the bits constituting the bit group are not written in the same column in the second part and are written in the plurality of columns.

In the above-described example, the block interleaver 124 writes the bits in the second part in the column direction. However, this is merely an example. That is, the block interleaver 124 may write the bits in the plurality of columns of the second part in the row direction. However, the block interleaver 124 may write the bits in the first part in the same method as described above.

Specifically, referring to FIG. 15, the block interleaver 124 may write the bits in the $1^{st}$ row of the second part of the first column to the $1^{st}$ row of the second part of the second column, writes the bits in the $2^{nd}$ row of the second part of the first column to the $2^{nd}$ row of the second part of the second column, . . . , writes the bits in the $180^{th}$ row of the second part of the first column to the $180^{th}$ row of the second part of the second column.

The block interleaver 124 reads the bits written in each row of each part serially in the row direction. That is, as shown in FIGS. 14 and 15, the block interleaver 124 may read the bits written in each row of the first part of the plurality of columns serially in the row direction, and may read the bits written in each row of the second part of the plurality of columns serially in the row direction.

As described above, the block interleaver 124 may interleave the plurality of bit groups in the method described above with reference to FIGS. 13 to 15.

The modulator 130 maps the interleaved LDPC codeword onto a modulation symbol. Specifically, the modulator 130 may demultiplex the interleaved LDPC codeword, modulate the demultiplexed LDPC codeword, and map the LDPC codeword onto a constellation.

In this case, the modulator 130 may generate a modulation symbol using the bits included in each of a plurality of bit groups.

In other words, as described above, the bits included in different bit groups are written in each column of the block interleaver 124, and the block interleaver 124 reads the bits written in each column in the row direction. In this case, the modulator 130 generates a modulation symbol by mapping the bits read in each column onto each bit of the modulation symbol. Accordingly, each bit of the modulation symbol belongs to a different group.

For example, it is assumed that the modulation symbol consists of C number of bits. In this case, the bits which are read from each row of C number of columns of the block interleaver 124 may be mapped onto each bit of the modulation symbol and thus, each bit of the modulation symbol consisting of C number of bits belong to C number of different groups.

Hereinbelow, the above feature will be described in greater detail.

First, the modulator 130 demultiplexes the interleaved LDPC codeword. To achieve this, the modulator 130 may include a demultiplexer (not shown) to demultiplex the interleaved LDPC codeword.

The demultiplexer (not shown) demultiplexes the interleaved LDPC codeword. Specifically, the demultiplexer (not shown) performs serial-to-parallel conversion with respect to the interleaved LDPC codeword, and demultiplexes the interleaved LDPC codeword into a cell having a predetermined number of bits (or a data cell).

Figure 16:
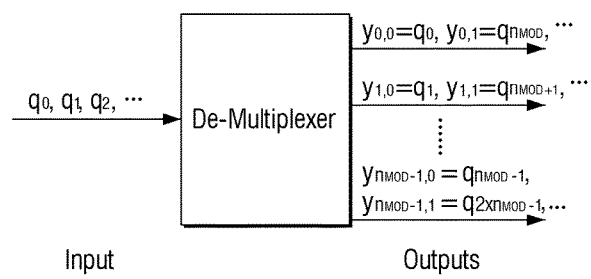
FIG. 16 illustrates an operation of a demultiplexer according to an exemplary embodiment.

For example, as shown in FIG. 16, the demultiplexer (not shown) receives an LDPC codeword $Q=(q_0, q_1, q_2, \ldots)$ output from the interleaver 120, outputs the received LDPC codeword bits to a plurality of substreams serially, converts the input LDPC codeword bits into cells, and outputs the cells.

In this case, bits having a same index in each of the plurality of substreams may constitute a same cell. Accordingly, the cells may be configured like $(y_{0,0}, y_{1,0}, \ldots, y_{\eta_{MOD}-1,0})=(q_0, q_1, q_{\eta_{MOD}-1})$, $(y_{0,1}, y_{1,1}, \ldots, y_{\eta_{MOD}-1,1})=(q_{\eta_{MOD}}, q_{\eta_{MOD}+1}, \ldots, q_{2\times\eta_{MOD}-1})$, . . . .

Herein, the number of substreams, $N_{substreams}$, may be equal to the number of bits constituting a modulation symbol, $\eta_{MOD}$. Accordingly, the number of bits constituting each cell may be equal to the number of bits constituting a modulation symbol (that is, a modulation order).

For example, when the modulation method is QPSK, the number of bits constituting the modulation symbol, $\eta_{MOD}$, is 2, and thus, the number of substreams, $N_{substreams}$, is 2, and the cells may be configured like $(y_{0,0}, y_{1,0})=(q_0, q_1)$, $(y_{0,1}, y_{1,1})=(q_2, q_3)$, $(y_{0,2}, y_{1,2})=(q_4, q_5)$, . . . .

The modulator 130 may map the demultiplexed LDPC codeword onto modulation symbols.

Specifically, the modulator 130 may modulate bits (that is, cells) output from the demultiplexer (not shown) in various modulation methods. For example, when the modulation method is QPSK, 16-QAM, 64-QAM, 256-QAM, 1024-QAM, and 4096-QAM, the number of bits constituting a modulation symbol, $\eta_{MOD}$ (that is, the modulation order), may be 2, 4, 6, 8, 10 and 12, respectively.

In this case, since each cell output from the demultiplexer (not shown) is formed of as many bits as the number of bits constituting a modulation symbol, the modulator 130 may generate a modulation symbol by mapping each cell output from the demultiplexer (not shown) onto a constellation point serially. Herein, a modulation symbol corresponds to a constellation point on a constellation.

However, the above-described demultiplexer (not shown) may be omitted according to circumstances. In this case, the modulator 130 may generate modulation symbols by grouping a predetermined number of bits from interleaved bits serially and mapping the predetermined number of bits onto constellation points. In this case, the modulator 130 may generate modulation symbols by mapping $\eta_{MOD}$ number of bits onto the constellation points serially according to a modulation method.

When an LDPC codeword is generated based on the parity check matrix defined as in Tables 4 to 21 and Tables 23 to 31, a plurality of bit groups of the LDPC codeword are interleaved by using interleaving parameters defined as in Tables 32 to 56 for the following reasons.

In general, when modulation is performed by using QPSK, encoding/decoding performance depends on how LDPC codeword bits are mapped onto two bits of a QPSK symbol.

In particular, when two parity bits are connected to a single check node in a parity check matrix, good performance can be guaranteed by mapping the two parity bits onto a single QPSK symbol. In addition, good performance can be guaranteed by mapping two parity bits connected to a single check node in the parity check matrix onto a single QPSK symbol. In addition, when there are a plurality of parity bits each connected to a single check node in a parity check matrix, good performance can be guaranteed by selecting two check nodes and mapping two parity bits connected to the two check nodes onto a single QPSK symbol.

Accordingly, after the LDPC codeword bits generated based on the parity check matrix defined as in Tables 4 to 21 and Tables 23 to 31 are group-interleaved based on Equation 21 and Tables 32 to 56, when the interleaved LDPC codeword bits are modulated by QPSK, two parity bits connected to a single check node may be mapped onto a same QPSK symbol or two parity bits connected to the selected two check nodes may be mapped onto a same QPSK symbol. Accordingly, encoding/decoding performance can be improved and the transmitting apparatus is robust to a burst error.

Specifically, since the order of bit groups to be written/read in the plurality of columns of the block interleaver 124 is determined according to the interleaving in bit group wise in the group interleaver 122, bits to be mapped onto a modulation symbol may be determined according to the interleaving in bit group wise in the group interleaver 122.

Accordingly, the group interleaver 122 may interleave the LDPC codeword bits in bit group wise such that bits belonging to a predetermined number of continuous bit groups, that is, bits connected to a predetermined number of same check nodes, are mapped onto a same QPSK symbol, by considering reliability of bits mapped onto a modulation symbol and performance of the codeword bits of the LDPC codeword. To achieve this, the group interleaver 122 may interleave the LDPC codeword bits in bit group wise based on Equation 21 and Tables 32 to 56.

Hereinafter, a method for designing the group interleaver 122 according to an exemplary embodiment will be explained. For the convenience of explanation, a method for defining π(j) with reference to Table 33 from among Tables 32 to 56 by way of an example will be explained.

In the case of the QPSK modulation method, the block interleaver 124 is formed of two columns, and two bits read and output from a same row of two columns configure a same QPSK symbol. Accordingly, bits of continuous bit groups from among the plurality of bit groups of the LDPC codeword should be written in a same row in each of the two columns of the block interleaver 124 to be mapped onto a same QPSK symbol.

That is, in order to map two parity bits connected to a single check node in the parity check matrix onto a same QPSK modulation symbol, bits belonging to two continuous bit groups to which the two parity bits belong should be written in a same row in each of the two columns of the block interleaver 124.

Figure 17:
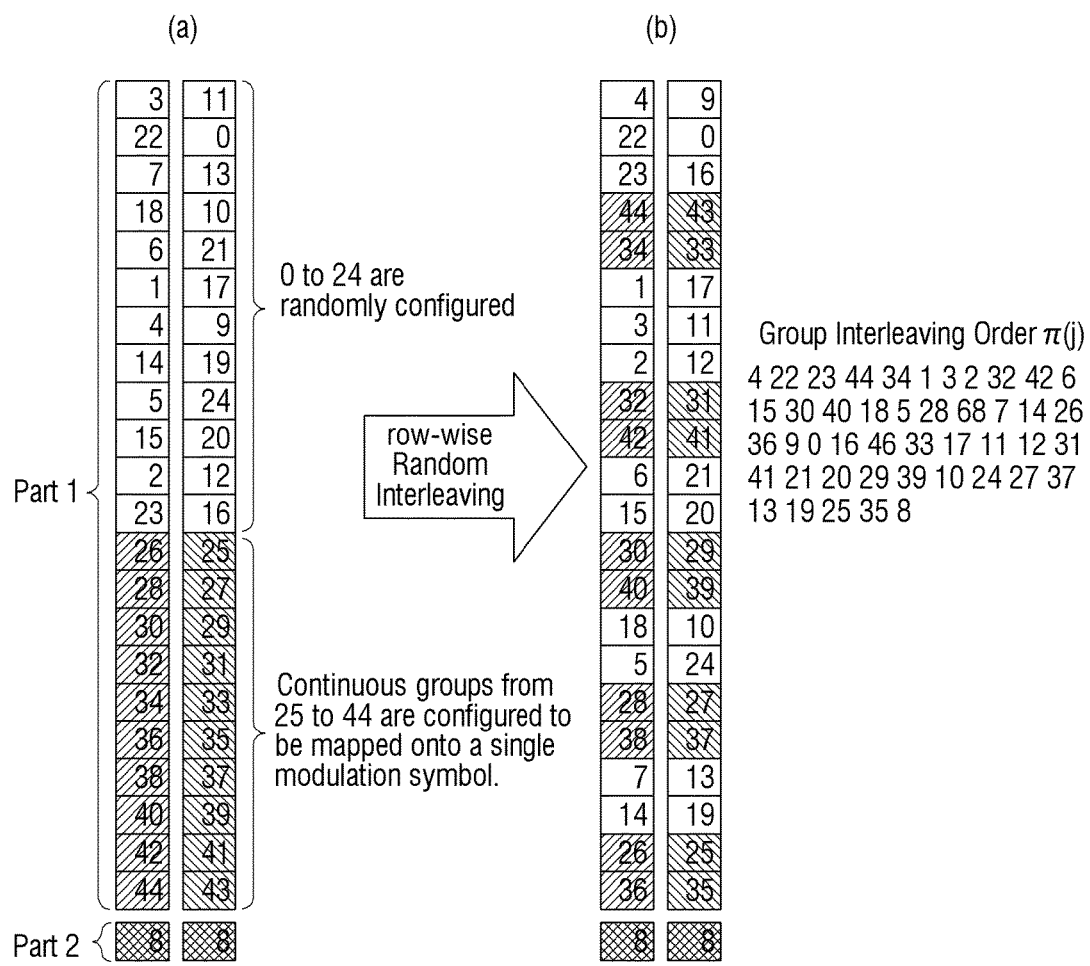
FIGS. 17 to 19 illustrate a method for extracting interleaving parameters according to exemplary embodiments.

When bits included in two continuous bit groups from the $25^{th}$ bit group to the $44^{th}$ bit group from among 45 bit groups constituting an LDPC codeword (that is, the $0^{th}$ to $44^{th}$ bit groups) should be mapped onto a same QPSK symbol for the purpose of improving encoding/decoding performance, and it is assumed that the $26^{th}$ bit group, $28^{th}$ bit group, . . . , $42^{nd}$ bit group, and $44^{th}$ bit groups are written in the $4321^{st}$ row to the $7920^{th}$ row of the first part of the first column of the block interleaver 124 as shown in (a) of FIG. 17, the $25^{th}$ bit group, $27^{th}$ bit group, . . . , $41^{st}$ bit group, and $43^{rd}$ bit group should be written in the $4321^{st}$ row to the $7920^{th}$ row of the first part of the second column.

In this case, encoding/decoding performance depends on which bit groups are mapped onto a same modulation symbol (in the above-described example, two continuous bit groups from the $25^{th}$ bit group to the $44^{th}$ bit group are mapped onto the same modulation symbol). Therefore, the other bit groups may be randomly written in the block interleaver 124.

That is, in the above-described example, the $0^{th}$ bit group to the $24^{th}$ bit group may be randomly written in the other rows of the first part and the second part which remain after the $25^{th}$ bit group to the $44^{th}$ bit group are written in the block interleaver 124. For example, as shown in (a) of FIG. 17, the $3^{rd}$ bit group, $22^{nd}$ bit group, $7^{th}$ bit group, . . . , $2^{nd}$ bit group, $23^{rd}$ bit group, $11^{th}$ bit group, $0^{th}$ bit group, $13^{th}$ bit group, . . . , $12^{th}$ bit group, and $16^{th}$ bit group may be written in the other rows of the first part, and the $8^{th}$ bit group may be written in the second part.

However, when the LDPC codeword bits are written in each column of the block interleaver 124 in bit group wise as shown in (a) of FIG. 17, the bits included in the $25^{th}$ bit group to the $44^{th}$ bit group are mapped onto continuous QPSK symbols, and thus, are vulnerable to a bust error.

Accordingly, in order not to map the bits included in the $25^{th}$ bit group to the $44^{th}$ bit group onto continuous QPSK symbols, the rows of the block interleaver 124 may be randomly interleaved (row-wise random interleaving) as shown in (a) of FIG. 17 and the order of the bit groups to be written in the block interleaver 124 may be changed as shown in (b) of FIG. 17.

As a result, when the group interleaver 122 interleaves a plurality of bit groups of an LDPC codeword in the order shown in Table 33, the plurality of bit groups of the LDPC codeword may be written in the block interleaver 124 in the order shown in (b) of FIG. 17, and accordingly, parity bits included in two continuous bit groups may be mapped onto a same QPSK symbol.

That is, when the encoder 110 performs LDPC-encoding in a code rate of 7/15 based on a parity check matrix including an information word submatrix defined by the Table 6 and a parity submatrix having a dual diagonal configuration, and the plurality of bit groups of the LDPC codeword are interleaved by the group interleaver 122 based on π(j) defined by Table 33, the plurality of bit groups of the LDPC codeword may be written in the block interleaver 124 as shown in (b) of FIG. 17, and thus, bits included in two continuous bit groups of 20 bit groups may be mapped onto a same modulation symbol.

In (a) and (b) of FIG. 17, bits included in two continuous bit groups of the 20 bit groups from the $25^{th}$ bit group to the $44^{th}$ bit group are mapped onto a same modulation symbol. However, this is merely an example. The number of continuous bit groups to be mapped onto a same modulation symbol may vary according to a parity check matrix and a code rate. That is, when LDPC encoding is performed with a parity check matrix having a different configuration and at a different code rate, the number of continuous bit groups to be mapped onto a same modulation symbol may be changed.

Hereinafter, a method for defining π(j) with reference to Table 36 according to another exemplary embodiment will be explained.

In the case of the QPSK modulation method, the block interleaver 124 is formed of two columns, and two bits read and output from a same row of two columns configure a same QPSK symbol. Accordingly, bits of continuous bit groups from among a plurality of bit groups of an LDPC codeword should be written in a same row in each of two columns of the block interleaver 124 to be mapped onto a same QPSK symbol.

That is, in order to map two parity bits connected to a single check node in a parity check matrix onto a same QPSK modulation symbol, bits belonging to two continuous bit groups to which the two parity bits belong should be written in a same row in each of two columns of the block interleaver 124.

Figure 18:
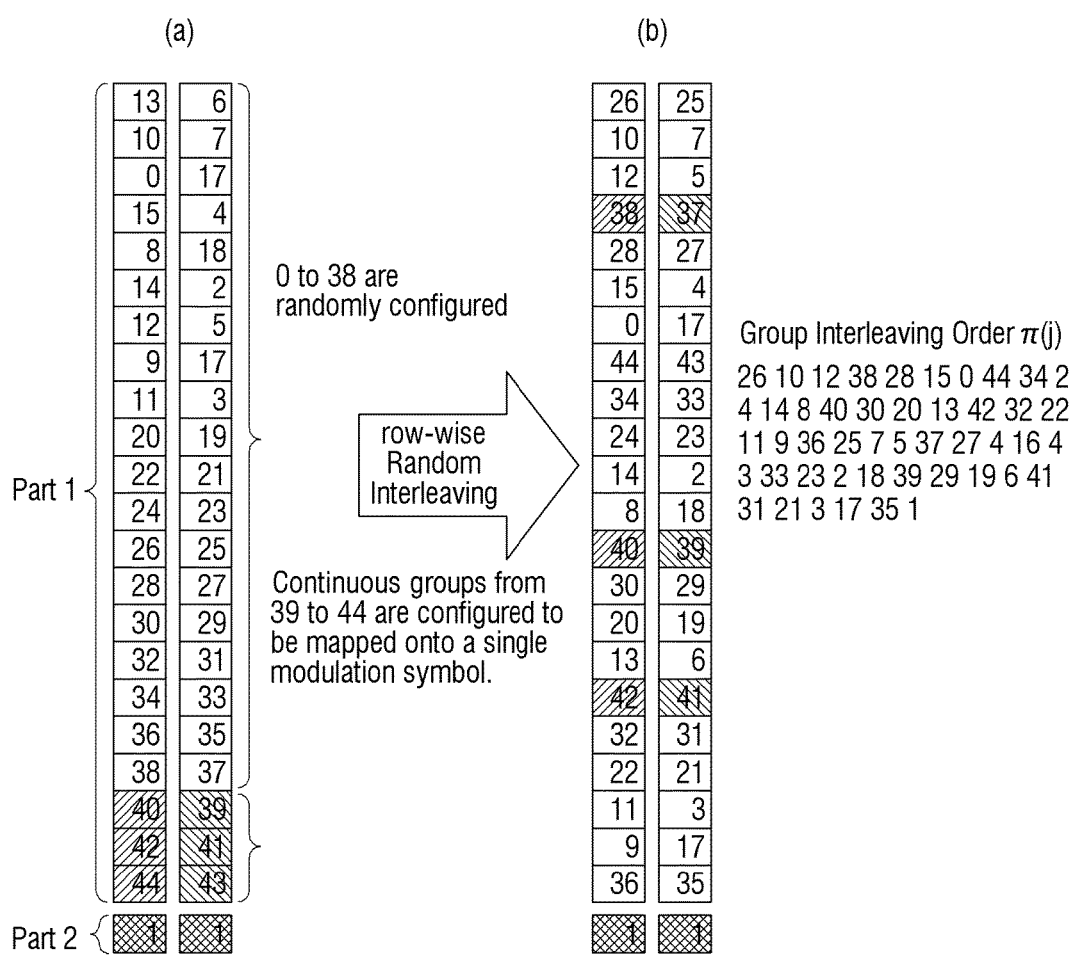

When bits included in two continuous bit groups from the $39^{th}$ bit group to the $44^{th}$ bit group from among 45 bit groups constituting an LDPC codeword (that is, the $0^{th}$ to $44^{th}$ bit groups) should be mapped onto a same QPSK symbol for the purpose of improving encoding/decoding performance, and it is assumed that the $40^{th}$ bit group, $42^{nd}$ bit group, and $44^{th}$ bit groups are written in the $6841^{st}$ row to the $7920^{th}$ row of the first part of the first column of the block interleaver 124 as shown in (a) of FIG. 18, the $39^{th}$ bit group, $41^{st}$ bit group, and $43^{rd}$ bit group should be written in the $6841^{st}$ row to the $7920^{th}$ row of the first part of the second column.

In this case, encoding/decoding performance depends on which bit groups are mapped onto a same modulation symbol (in the above-described example, two continuous bit groups from the $39^{th}$ bit group to the $44^{th}$ bit group are mapped onto a same modulation symbol). Therefore, the other bit groups may be randomly written in the block interleaver 124.

That is, in the above-described example, the $0^{th}$ bit group to the $38^{th}$ bit group may be randomly written in the other rows of the first part and the second part which remain after the $39^{th}$ bit group to the $44^{th}$ bit group are written in the block interleaver 124. For example, as shown in (a) of FIG. 18, the $13^{th}$ bit group, $10^{th}$ bit group, $0^{th}$ bit group, . . . , $36^{th}$ bit group, $38^{th}$ bit group, $6^{th}$ bit group, $7^{th}$ bit group, $17^{th}$ bit group, . . . , $35^{th}$ bit group, and $37^{th}$ bit group may be written in the other rows of the first part, and the $1^{st}$ bit group may be written in the second part.

However, when LDPC codeword bits are written in each column of the block interleaver 124 in bit group wise as shown in (a) of FIG. 18, bits included in the $39^{th}$ bit group to the $44^{th}$ bit group are mapped onto continuous QPSK symbols, and thus, are vulnerable to a bust error.

Accordingly, in order not to map bits included in the $39^{th}$ bit group to the $44^{th}$ bit group onto continuous QPSK symbols, the rows of the block interleaver 124 may be randomly interleaved (row-wise random interleaving) as shown in (a) of FIG. 18 and the order of the bit groups to be written in the block interleaver 124 may be changed as shown in (b) of FIG. 18.

As a result, when the group interleaver 122 interleaves a plurality of bit groups of an LDPC codeword in the order shown in Table 36, the plurality of bit groups of the LDPC codeword may be written in the block interleaver 124 in the order shown in (b) of FIG. 18, and accordingly, parity bits included in two continuous bit groups may be mapped onto a same QPSK symbol.

That is, when the encoder 110 performs LDPC-encoding in a code rate of 13/15 based on a parity check matrix including an information word submatrix defined by Table 12 and a parity submatrix having a dual diagonal configuration, and the plurality of bit groups of the LDPC codeword are interleaved by the group interleaver 122 based on π(j) defined by Table 36, the plurality of bit groups of the LDPC codeword may be written in the block interleaver 124 as shown in (b) of FIG. 18, and thus, bits included in two continuous bit groups of 6 bit groups may be mapped onto a same modulation symbol.

In (a) and (b) of FIG. 18, bits included in two continuous bit groups of the 6 bit groups from the $39^{th}$ bit group to the $44^{th}$ bit group are mapped onto a same modulation symbol. However, this is merely an example. The number of continuous bit groups to be mapped onto a same modulation symbol may vary according to a parity check matrix and a code rate. That is, when LDPC encoding is performed with a parity check matrix having a different configuration and at a different code rate, the number of continuous bit groups to be mapped onto a same modulation symbol may be changed.

In addition, since performance is greatly affected by which continuous bit groups are mapped onto a same modulation symbol, the other bit groups except for the continuous bit groups mapped onto the same modulation symbol may be randomly written in the plurality of columns as shown in (a) and (b) of FIG. 17 or (a) and (b) of FIG. 18.

Accordingly, as long as a same bit group is mapped onto a same modulation symbol, interleaving may be regarded as being performed in the same method as the group interleaver presented in the present disclosure.

TABLE 60

| j-th block of Groupwise Interleaver output | A (j)-th block of Groupwise Interleaver input | A_perm (j)-th block of Groupwise Interleaver input | B_perm (j)-th block of Groupwise Interleaver input | C_perm (j)-th block of Groupwise Interleaver input | D_perm (j)-th block of Groupwise Interleaver input | E_perm (j)-th block of Groupwise Interleaver input |
|---|---|---|---|---|---|---|
| 0 | 3 | 4 | 0 | 2 | 17 | 23 |
| 1 | 22 | 22 | 2 | 1 | 16 | 22 |
| 2 | 7 | 23 | 19 | 3 | 18 | 24 |
| 3 | 18 | 44 | 44 | 44 | 44 | 44 |
| 4 | 6 | 34 | 34 | 34 | 34 | 34 |
| 5 | 1 | 1 | 10 | 17 | 0 | 9 |
| 6 | 4 | 3 | 11 | 15 | 3 | 7 |
| 7 | 14 | 2 | 9 | 16 | 2 | 5 |
| 8 | 5 | 32 | 32 | 32 | 32 | 32 |
| 9 | 15 | 42 | 42 | 42 | 42 | 42 |
| 10 | 2 | 6 | 20 | 6 | 12 | 18 |
| 11 | 23 | 15 | 23 | 7 | 11 | 19 |
| 12 | 26 | 30 | 30 | 30 | 30 | 30 |

TABLE 60-continued

| j-th block of Groupwise Interleaver output | A (j)-th block of Groupwise Interleaver input | A_perm (j)-th block of Groupwise Interleaver input | B_perm (j)-th block of Groupwise Interleaver input | C_perm (j)-th block of Groupwise Interleaver input | D_perm (j)-th block of Groupwise Interleaver input | E_perm (j)-th block of Groupwise Interleaver input |
|---|---|---|---|---|---|---|
| 13 | 28 | 40 | 40 | 40 | 40 | 40 |
| 14 | 30 | 18 | 16 | 10 | 21 | 3 |
| 15 | 32 | 5 | 15 | 11 | 22 | 1 |
| 16 | 34 | 28 | 28 | 28 | 28 | 28 |
| 17 | 36 | 38 | 38 | 38 | 38 | 38 |
| 18 | 38 | 7 | 6 | 21 | 8 | 14 |
| 19 | 40 | 14 | 5 | 22 | 7 | 13 |
| 20 | 42 | 26 | 26 | 26 | 26 | 26 |
| 21 | 44 | 36 | 36 | 36 | 36 | 36 |
| 22 | 11 | 9 | 13 | 18 | 5 | 8 |
| 23 | 0 | 0 | 14 | 24 | 23 | 10 |
| 24 | 13 | 16 | 12 | 19 | 4 | 6 |
| 25 | 10 | 43 | 43 | 43 | 43 | 43 |
| 26 | 21 | 33 | 33 | 33 | 33 | 33 |
| 27 | 17 | 17 | 1 | 0 | 1 | 16 |
| 28 | 9 | 11 | 4 | 20 | 6 | 15 |
| 29 | 19 | 12 | 3 | 5 | 24 | 17 |
| 30 | 24 | 31 | 31 | 31 | 31 | 31 |
| 31 | 20 | 41 | 41 | 41 | 41 | 41 |
| 32 | 12 | 21 | 18 | 4 | 19 | 4 |
| 33 | 16 | 20 | 17 | 9 | 20 | 2 |
| 34 | 25 | 29 | 29 | 29 | 29 | 29 |
| 35 | 27 | 39 | 39 | 39 | 39 | 39 |
| 36 | 29 | 10 | 8 | 8 | 10 | 0 |
| 37 | 31 | 24 | 7 | 23 | 9 | 21 |
| 38 | 33 | 27 | 27 | 27 | 27 | 27 |
| 39 | 35 | 37 | 37 | 37 | 37 | 37 |
| 40 | 37 | 13 | 24 | 12 | 14 | 20 |
| 41 | 39 | 19 | 22 | 13 | 15 | 12 |
| 42 | 41 | 25 | 25 | 25 | 25 | 25 |
| 43 | 43 | 35 | 35 | 35 | 35 | 35 |
| 44 | 8 | 8 | 21 | 14 | 13 | 11 |

For example, in Table 60, A and A_perm indicate π(j) after/before row-wise random interleaving is performed, and B_perm, C_perm, D_perm, and E_perm indicate π(j) when row-wise random interleaving is performed after the other bit groups except for continuous bit groups are randomly written in the plurality of columns in different methods. Referring to Table 60, in B_perm, C_perm, D_perm, and E_perm, the same group as in A_perm is mapped onto a same modulation symbol. Accordingly, it can be seen that a same interleaving method as in A_perm is used for B_perm, C_perm, D_perm, and E_perm.

In the above-described example, an interleaving pattern in the case of a parity check matrix having the configuration of FIG. 2 has been described. Hereinafter, a method for designing an interleaving pattern when a parity check matrix has the configuration of FIG. 4 will be explained with reference to Table 32.

When there are bit groups formed of parity bits connected to a single check node from among a plurality of bit groups of the LDPC codeword, bits included in two bit groups selected from the corresponding bit groups should be written in a same row of two columns of the block interleaver 124.

It is assumed that the $18^{th}$ bit group to the $44^{th}$ bit group from among the 45 bit groups (that is, $0^{th}$ to $44^{th}$ bit groups) of an LDPC codeword are bit groups formed of parity bits connected to a single check node connected to a single parity bit, and two bits are selected from the corresponding bit groups and 2880 (=8×360) QPSK symbols in total should be generated.

Figure 19:
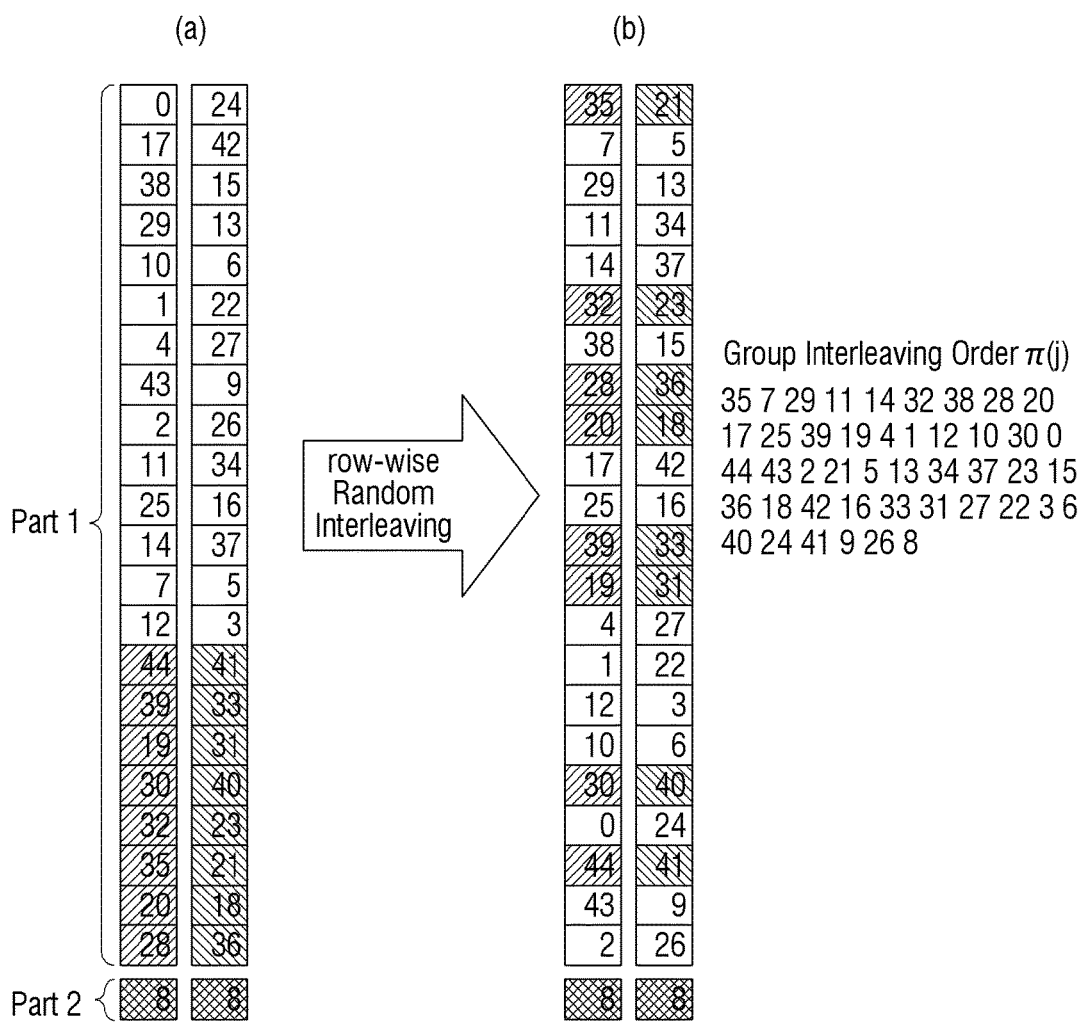

In this case, as shown in (a) of FIG. 19, 8 bit groups randomly selected from among the $18^{th}$ bit group to the $44^{th}$ bit group should be written in the $5041^{st}$ row to the $7920^{th}$ row of the first part of the first column, and the other 8 bit groups randomly selected should be written in the $5041^{st}$ row to the $7920^{th}$ row of the first part of the second column.

Since encoding/decoding performance depends on how many QPSK symbols are formed of parity bits connected to a single check node connected to a single parity bit, the other bit groups may be randomly written in the block interleaver 124.

Accordingly, the 29 bit groups which are not selected in the above-described example may be randomly written in the other rows of the first part, and the second part which remain after the selected groups are written in the block interleaver 124. For example, as shown in (a) of FIG. 19, the $0^{th}$ bit group, $17^{th}$ bit group, $38^{th}$ bit group, . . . , $37^{th}$ bit group, $5^{th}$ bit group, and $3^{rd}$ bit group may be written in the other rows of the first part, and the $8^{th}$ bit group may be written in the second part.

However, when LDPC codeword bits are written in each column of the block interleaver 124 in bit group wise as shown in (a) of FIG. 19, a bust error may be intensively generated only in the parity bit, and thus, may undermine encoding/decoding performance of the LDPC code. Accordingly, the rows of the block interleaver 124 may be randomly interleaved as shown in (a) of FIG. 19, and the order of the bit groups to be written in the block interleaver 124 may be changed as shown in (b) of FIG. 19, so that a bust error does not affect only the parity bit if any.

As a result, when the group interleaver 122 interleaves a plurality of bit groups of an LDPC codeword in the order of Table 32, the plurality of bit groups of the LDPC codeword may be written in the block interleaver 124 in the order shown in (b) of FIG. 19, and accordingly, a QPSK symbol formed of only parity bits connected to a check node connected to a single parity bit may be generated.

That is, when the encoder 110 performs LDPC encoding based on the parity check matrix defined in Table 26 at a code rate of 5/15, and the group interleaver 122 interleaves a plurality of bit groups of an LDPC codeword based on π(j) defined by Table 32, the plurality of bit groups of the LDPC codeword may be written in the block interleaver 124 as shown in (b) of FIG. 19, and thus, bits included in two continuous bit groups of 16 bit groups may be mapped onto a same modulation symbol.

In (a) and (b) of FIG. 19, only the 16 bit groups are randomly selected from the $18^{th}$ bit group to the $44^{th}$ bit group and a modulation symbol formed of only bits included in selected bit groups is generated. However, this is merely an example. The number of bit groups, corresponding to parity bits connected to a check node connected to a single parity bit, which are mapped onto a same modulation symbol, may be changed according to a parity check matrix and a code rate.

The transmitting apparatus 100 may transmit a modulation symbol to a receiving apparatus 1300. For example, the modulator 130 may map the modulation symbol onto an Orthogonal Frequency Division Multiplexing (OFDM) frame using OFDM, and may transmit the modulation symbol mapped onto the OFDM frame to the receiving apparatus 1300 through an allocated channel.

Figure 20:
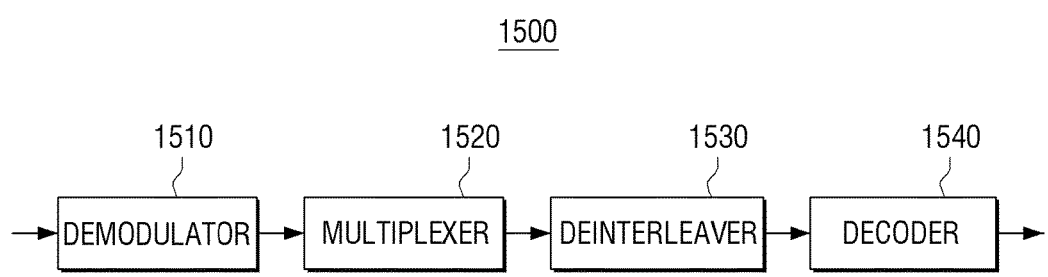
FIG. 20 is a block diagram to illustrate a configuration of a receiving apparatus according to an exemplary embodiment.

FIG. 20 is a block diagram to illustrate a configuration of a receiving apparatus according to an exemplary embodiment. Referring to FIG. 20, the receiving apparatus 1500 includes a demodulator 1510, a multiplexer 1520, a deinterleaver 1530 and a decoder 1540.

The demodulator 1510 receives and demodulates a signal transmitted from the transmitting apparatus 100. Specifically, the demodulator 1510 generates a value corresponding to an LDPC codeword by demodulating the received signal, and outputs the value to the multiplexer 1520. In this case, the demodulator 1510 may use a demodulation method corresponding to a modulation method used in the transmitting apparatus 100. To do so, the transmitting apparatus 100 may transmit information regarding the modulation method to the receiving apparatus 1500, or the transmitting apparatus 100 may perform modulation using a pre-defined modulation method between the transmitting apparatus 100 and the receiving apparatus 1500.

The value corresponding to the LDPC codeword may be expressed as a channel value for the received signal. There are various methods for determining the channel value, and for example, a method for determining a Log Likelihood Ratio (LLR) value may be the method for determining the channel value.

The LLR value is a log value for a ratio of the probability that a bit transmitted from the transmitting apparatus 100 is 0 and the probability that the bit is 1. In addition, the LLR value may be a bit value which is determined by a hard decision, or may be a representative value which is determined according to a section to which the probability that the bit transmitted from the transmitting apparatus 100 is 0 or 1 belongs.

The multiplexer 1520 multiplexes the output value of the demodulator 1510 and outputs the value to the deinterleaver 1530.

Specifically, the multiplexer 1520 is an element corresponding to a demultiplexer (not shown) provided in the transmitting apparatus 100, and performs an operation corresponding to the demultiplexer (not shown). That is, the multiplexer 1520 performs an inverse operation of the operation of the demultiplexer (not shown), and performs cell-to-bit conversion with respect to the output value of the demodulator 1510 and outputs the LLR value in the unit of bit. However, when the demultiplexer (not shown) is omitted from the transmitting apparatus 100, the multiplexer 1520 may be omitted from the receiving apparatus 1500.

The information regarding whether the demultiplexing operation is performed or not may be provided by the transmitting apparatus 100, or may be pre-defined between the transmitting apparatus 100 and the receiving apparatus 1500.

The deinterleaver 1530 deinterleaves the output value of the multiplexer 1520 and outputs the values to the decoder 1540.

Specifically, the deinterleaver 1530 is an element corresponding to the interleaver 120 of the transmitting apparatus 100 and performs an operation corresponding to the interleaver 120. That is, the deinterleaver 1530 deinterleaves the LLR value by performing the interleaving operation of the interleaver 120 inversely.

Figure 21:
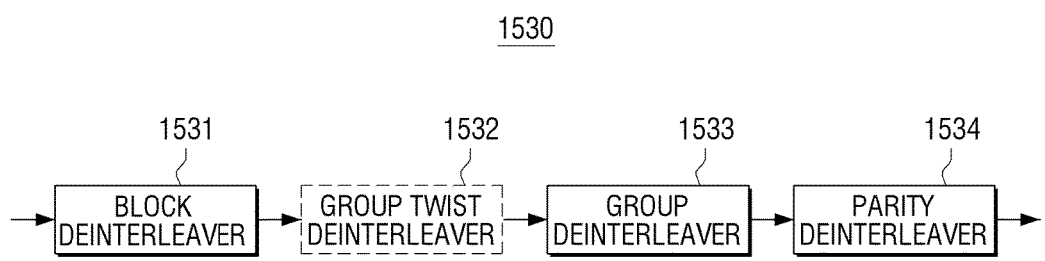
FIG. 21 is a block diagram to illustrate a configuration of a deinterleaver according to an exemplary embodiment.

To do so, the deinterleaver 1530 may include a block deinterleaver 1531, a group twist deinterleaver 1532, a group deinterleaver 1533, and a parity deinterleaver 1534 as shown in FIG. 21.

The block deinterleaver 1531 deinterleaves the output of the multiplexer 1520 and outputs a value to the group twist deinterleaver 1532.

Specifically, the block deinterleaver 1531 is an element corresponding to the block interleaver 124 provided in the transmitting apparatus 100 and performs the interleaving operation of the block interleaver 124 inversely.

That is, the block deinterleaver 1531 deinterleaves by writing the LLR value output from the multiplexer 1520 in each row in the row direction and reading each column of the plurality of rows in which the LLR value is written in the column direction by using at least one row formed of the plurality of columns.

In this case, when the block interleaver 124 interleaves by dividing the column into two parts, the block deinterleaver 1531 may deinterleave by dividing the row into two parts.

In addition, when the block interleaver 124 writes and reads in and from the group that does not belong to the first part in the row direction, the block deinterleaver 1531 may deinterleave by writing and reading values corresponding to the group that does not belong to the first part in the row direction.

Figure 22:
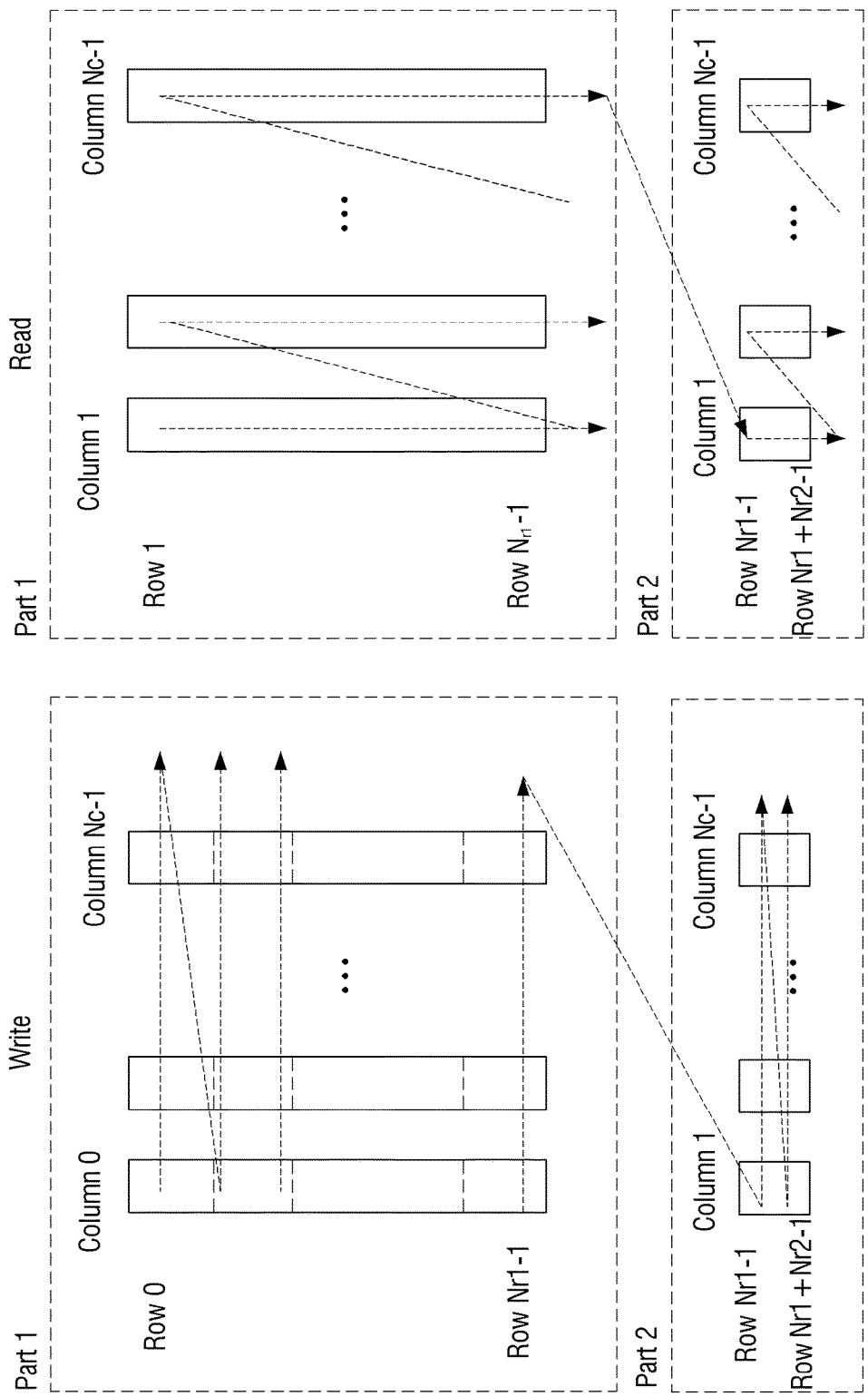
FIG. 22 illustrates a deinterleaving method of a block deinterleaver according to an exemplary embodiment.

Hereinafter, the block deinterleaver 1531 will be explained with reference to FIG. 22. However, this is merely an example and the block deinterleaver 1531 may be implemented in other methods.

An input LLR $v_i$ ($0 \le i < N_{ldpc}$) is written in a $r_i$ row and a $c_i$ column of the block deinterleaver 1531. Herein, $c_i = (i \bmod N_c)$ and $$r_i = \left\lfloor \frac{j}{N_c} \right\rfloor,$$

On the other hand, an output LLR $q_i(0 \le i < N_c \times N_{r1})$ is read from a $c_i$ column and a $r_i$ row of the first part of the block deinterleaver 1531. Herein, $$c_i = \left\lfloor \frac{j}{N_{r1}} \right\rfloor,$$

$r_i = (i \bmod N_{r1})$.

In addition, an output LLR $q_i(N_c \times N_{r1} \le i < N_{ldpc})$ is read from a $c_i$ column and a $r_i$ row of the second part. Herein, $$c_i = \left\lfloor \frac{(i - N_c \times N_{r1})}{N_{r2}} \right\rfloor,$$

$r_i = N_{r1} + \{(i-N_c \times N_{r1}) \bmod N_{r2}\}$.

The group twist deinterleaver 1532 deinterleaves the output value of the block deinterleaver 1531 and outputs the value to the group deinterleaver 1533.

Specifically, the group twist deinterleaver 1532 is an element corresponding to the group twist interleaver 123 provided in the transmitting apparatus 100, and may perform the interleaving operation of the group twist interleaver 123 inversely.

That is, the group twist deinterleaver 1532 may rearrange the LLR values of the same bit group by changing the order of the LLR values existing in the same bit group. When the group twist operation is not performed in the transmitting apparatus 100, the group twist deinterleaver 1532 may be omitted.

The group deinterleaver 1533 (or the group-wise deinterleaver) deinterleaves an output value of the group twist deinterleaver 1532 and outputs a value to the parity deinterleaver 1534.

Specifically, the group deinterleaver 1533 is an element corresponding to the group interleaver 122 provided in the transmitting apparatus 100 and may perform the interleaving operation of the group interleaver 122 inversely.

That is, the group deinterleaver 1533 may rearrange the order of the plurality of bit groups in bit group wise. In this case, the group deinterleaver 1533 may rearrange the order of the plurality of bit groups in bit group wise by applying the interleaving method of Tables 32 to 56 inversely according to a length of the LDPC codeword, a modulation method and a code rate.

The parity deinterleaver 1534 performs parity deinterleaving with respect to an output value of the group deinterleaver 1533 and outputs a value to the decoder 1540.

Specifically, the parity deinterleaver 1534 is an element corresponding to the parity interleaver 121 provided in the transmitting apparatus 100 and may perform the interleaving operation of the parity interleaver 121 inversely. That is, the parity deinterleaver 1534 may deinterleave the LLR values corresponding to the parity bits from among the LLR values output from the group deinterleaver 1533. In this case, the parity deinterleaver 1534 may deinterleave the LLR value corresponding to the parity bits inversely to the parity interleaving method of Equation 8.

However, the parity deinterleaver 1534 may be omitted depending on the decoding method and embodiment of the decoder 1540.

Although the deinterleaver 1530 of FIG. 20 includes three (3) or four (4) elements as shown in FIG. 21, operations of the elements may be performed by a single element. For example, when bits each of which belongs to each of bit groups $X_a$ and $X_b$ constitute a single modulation symbol, the deinterleaver 1530 may deinterleave these bits to locations corresponding to their bit groups based on the received single modulation symbol.

For example, when the code rate is 13/15 and the modulation method is QPSK, the group deinterleaver 1533 may perform deinterleaving based on Table 36.

In this case, bits each of which belongs to each of bit groups $Y_3(=X_{38})$ and $Y_{25}(=X_{37})$ may constitute a single modulation symbol. Since one bit in each of the bit groups $Y_3(=X_{38})$ and $Y_{25}(=X_{37})$ constitutes a single modulation symbol, the deinterleaver 1530 may map bits onto decoding initial values corresponding to the bit groups $Y_3(=X_{38})$ and $Y_{25}(=X_{37})$ based on the received single modulation symbol.

The decoder 1540 may perform LDPC decoding by using the output value of the deinterleaver 1530. To achieve this, the decoder 1540 may include an LDPC decoder (not shown) to perform the LDPC decoding.

Specifically, the decoder 1540 is an element corresponding to the encoder 110 of the transmitting apparatus 100 and may correct an error by performing the LDPC decoding by using the LLR value output from the deinterleaver 1530.

For example, the decoder 1540 may perform the LDPC decoding in an iterative decoding method based on a sum-product algorithm. The sum-product algorithm is one example of a message passing algorithm, and the message passing algorithm refers to an algorithm which exchanges messages (e.g., LLR value) through an edge on a bipartite graph, calculates an output message from messages input to variable nodes or check nodes, and updates.

The decoder 1540 may use a parity check matrix when performing the LDPC decoding. In this case, the parity check matrix used in the decoding may have the same configuration as that of the parity check matrix used in the encoding of the encoder 110, and this has been described above with reference to FIGS. 2 to 4.

In addition, information on the parity check matrix and information on the code rate, etc. which are used in the LDPC decoding may be pre-stored in the receiving apparatus 1500 or may be provided by the transmitting apparatus 100.

Figure 23:
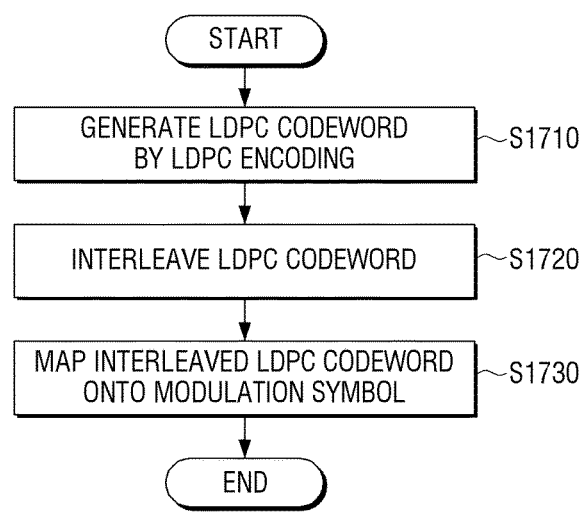
FIG. 23 is a flowchart to illustrate an interleaving method according to an exemplary embodiment.

FIG. 23 is a flowchart to illustrate an interleaving method of a transmitting apparatus according to an exemplary embodiment.

First, an LDPC codeword is generated by LDPC encoding based on a parity check matrix (S1710).

Thereafter, the LDPC codeword is interleaved (S1720). In this case, the LDPC codeword may be interleaved such that bits included in continuous bit groups from among a plurality of bit groups of the LDPC codeword are mapped onto a same modulation symbol. In addition, when there are a plurality of check nodes connected only to a single parity bit in the parity check matrix of the LDPC codeword, the LDPC codeword may be interleaved such that bits included in bit groups corresponding to the parity bit connected to the corresponding check nodes are selectively mapped onto a same modulation symbol.

Then, the interleaved LDPC codeword is mapped onto a modulation symbol (S1730). That is, the bits included in the continuous bit groups from among the plurality of bit groups of the LDPC codeword may be mapped onto a same modulation symbol. In addition, when there are a plurality of check nodes connected only to a single parity bit in the parity check matrix of the LDPC codeword, the bits included in bit groups corresponding to the parity bit connected to the corresponding check nodes may be selectively mapped onto a same modulation symbol.

Each of the plurality of bit groups may be formed of M number of bits, and M may be a common divisor of $N_{ldpc}$ and $K_{ldpc}$ and may be determined to satisfy $Q_{ldpc}=(N_{ldpc}-K_{ldpc})/M$. Herein, $Q_{ldpc}$ is a cyclic shift parameter value regarding columns in a column group of an information word submatrix of the parity check matrix, $N_{ldpc}$ is a length of the LDPC codeword, and $K_{ldpc}$ is a length of information word bits of the LDPC codeword.

Operation S1720 may include parity-interleaving parity bits of the LDPC codeword, dividing the parity-interleaved LDPC codeword by the plurality of bit groups and rearranging an order of the plurality of bit groups in bit group wise, and interleaving the plurality of bit groups the order of which is rearranged.

The order of the plurality of bit groups may be rearranged in bit group wise based on the above-described Equation 21 presented above.

In Equation 21, π(j) is determined based on at least one of a length of the LDPC codeword and a code rate.

For example, when the LDPC codeword has a length of 16200, the modulation method is QPSK, and the code rate is 13/15, π(j) in Equation 21 may be defined as in Table 36 presented above.

Operation S1720 may include dividing the LDPC codeword by the plurality of bit groups and rearranging an order of the plurality of bit groups in bit group wise, and interleaving the plurality of bit groups the order of which is rearranged.

The order of the plurality of bit groups may be rearranged in bit group wise based on Equation 21 presented above.

π(j) in Equation 21 may be determined based on at least one of a length of the LDPC codeword and a code rate.

For example, when the LDPC codeword has a length of 16200, the modulation method is QPSK, and the code rate is 5/15, π(j) in Equation 21 may be defined as in Table 32 presented above.

However, this is merely an example. The order of the plurality of bit groups may be rearranged in bit group wise by using one of Tables 32 to 56 and Equation 21.

The interleaving the plurality of bit groups may include: writing the plurality of bit groups in each of a plurality of columns in bit group wise in a column direction, and reading each row of the plurality of columns in which the plurality of bit groups are written in bit group wise in a row direction.

In addition, the interleaving the plurality of bit groups may include: serially write, in the plurality of columns, at least some bit group which is writable in the plurality of columns in bit group wise from among the plurality of bit groups, and then dividing and writing the other bit groups in an area which remains after the at least some bit group is written in the plurality of columns in bit group wise.

A non-transitory computer readable medium, which stores a program for performing the interleaving methods according to various exemplary embodiments in sequence, may be provided.

The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB), a memory card, and a read only memory (ROM), and may be provided.

At least one of the components, elements or units represented by a block as illustrated in FIGS. 1, 5, 16, 20 and 21 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions. Also, at least one of these components, elements or units may further include a processor such as a central processing unit (CPU) that performs the respective functions, a microprocessor, or the like. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

The foregoing exemplary embodiments and advantages are merely exemplary and are not to be construed as limiting the present inventive concept. The exemplary embodiments can be readily applied to other types of apparatuses. Also, the description of the exemplary embodiments is intended to be illustrative, and not to limit the scope of the inventive concept, and many alternatives, modifications, and variations will be apparent to those skilled in the art.

What is claimed is:

1. A transmitting apparatus, comprising:
an interleaver configured to split a codeword comprising information bits and parity bits into a plurality of bit groups, wherein the parity bits are generated based on a low density parity check (LDPC) code having a code rate being 5/15 and a code length being 16200 bits;
interleave the plurality of bit groups based on a permutation order, to provide an interleaved codeword, wherein the permutation order is obtained based on the code rate being 5/15 and the code length being 16200 bits;
a demultiplexer configured to demultiplex bits of the interleaved codeword to generate data cells;
a mapper configured to map the data cells onto constellation points for quadrature phase shift keying (QPSK) modulation; and
a transmitter configured to transmit a signal which is generated based on the constellation points,
wherein the plurality of bit groups are interleaved based on a following equation:

$$Y_j = X_{\pi(j)} \text{ for } (0 \leq j < N_{group}),$$

where $X_j$ is a $j^{th}$ bit group among the plurality of bit groups, $Y_j$ is a $j^{th}$ bit group among an interleaved plurality of bit groups, $N_{group}$ is a total number of the plurality of bit groups, and π(j) denotes the permutation order for the interleaving, and
wherein the π(j) is defined as follows:

| | | \multicolumn{12}{c}{Order of interleaving π(j) (0 ≤ j < 45)} | | | | | | | | | | | |
|---|---|---|---|---|---|---|---|---|---|---|---|---|
| Code Rate 5/15 | j | 0 | 1 | 2 | 3 | 4 | 5 | 6 | 7 | 8 | 9 | 10 | 11 |
| | | 23 | 24 | 25 | 26 | 27 | 28 | 29 | 30 | 31 | 32 | 33 | 34 |
| | π(j) | 35 | 7 | 29 | 11 | 14 | 32 | 38 | 28 | 20 | 17 | 25 | 39 |
| | | 5 | 13 | 34 | 37 | 23 | 15 | 36 | 18 | 42 | 16 | 33 | 31 |
| Code Rate 5/15 | j | 12 | 13 | 14 | 15 | 16 | 17 | 18 | 19 | 20 | 21 | 22 | |
| | | 35 | 36 | 37 | 38 | 39 | 40 | 41 | 42 | 43 | 44 | | |
| | π(j) | 19 | 4 | 1 | 12 | 10 | 30 | 0 | 44 | 43 | 2 | 21 | |
| | | 27 | 22 | 3 | 6 | 40 | 24 | 41 | 9 | 26 | 8. | | |

2. The transmitting apparatus of claim 1, wherein each of the plurality of bit groups comprises 360 bits.

3. The transmitting apparatus of claim 1, wherein the interleaver is configured to interleave the interleaved plurality of bit groups using a plurality of columns, each of the plurality of columns comprising a first part and a second part, wherein a number of rows in the first part and the second part is determined based on a number of the plurality of columns and a number of bits of each of the plurality of bit groups.

4. The transmitting apparatus of claim 1, wherein $\pi(j)$ is determined based on at least one of the code length, a modulation method for the mapping and the code rate.

\* \* \* \* \*

UNITED STATES PATENT AND TRADEMARK OFFICE
CERTIFICATE OF CORRECTION

PATENT NO. : 10,033,409 B2  
APPLICATION NO. : 15/435042  
DATED : July 24, 2018  
INVENTOR(S) : Kyung-joong Kim et al.

Page 1 of 1

It is certified that error appears in the above-identified patent and that said Letters Patent is hereby corrected as shown below:

In the Claims

In Claim 1, Column 96, Line 28, delete "bits;" and insert --bits, and--

Signed and Sealed this
Seventh Day of February, 2023

Katherine Kelly Vidal
*Director of the United States Patent and Trademark Office*